(12) United States Patent
Dixon et al.

(10) Patent No.: US 7,320,100 B2
(45) Date of Patent: Jan. 15, 2008

(54) APPARATUS AND METHOD FOR MEMORY WITH BIT SWAPPING ON THE FLY AND TESTING

(75) Inventors: R. Paul Dixon, Carrollton, TX (US); David R. Resnick, Eau Claire, WI (US); Gerald A. Schwoerer, Chippewa Falls, WI (US); Kelly J. Marquardt, Eau Claire, WI (US); Alan M. Grossmeier, Chippewa Falls, WI (US); Michael L. Steinberger, Chippewa Falls, WI (US); Van L. Snyder, Eau Claire, WI (US); Roger A. Bethard, Chippewa Falls, WI (US); Michael F. Higgins, Eau Claire, WI (US)

(73) Assignee: Cray Inc., Seattle, WA (US)

( * ) Notice: Subject to any disclaimer, the term of this patent is extended or adjusted under 35 U.S.C. 154(b) by 494 days.

(21) Appl. No.: 10/850,057

(22) Filed: May 19, 2004

(65) Prior Publication Data
US 2005/0022065 A1 Jan. 27, 2005

Related U.S. Application Data

(60) Provisional application No. 60/472,174, filed on May 20, 2003.

(51) Int. Cl.
*H03M 13/00* (2006.01)

(52) U.S. Cl. .................. 714/758; 714/718; 714/733
(58) Field of Classification Search ........ 714/718–723, 714/754, 7, 752, 823, 742, 819, 799
See application file for complete search history.

(56) References Cited

U.S. PATENT DOCUMENTS

| | | | |
|---|---|---|---|
| 4,319,357 A | | 3/1982 | Bossen |
| 4,384,348 A | * | 5/1983 | Nozaki ..................... 365/201 |
| 4,394,763 A | | 7/1983 | Nagano et al. |
| 4,667,330 A | | 5/1987 | Kumagai |
| 4,757,503 A | | 7/1988 | Hayes et al. |
| 4,782,486 A | | 11/1988 | Lipcon et al. |

(Continued)

FOREIGN PATENT DOCUMENTS

EP 0441088 8/1991

(Continued)

*Primary Examiner*—Guy Lamarre
*Assistant Examiner*—Sam Rizk
(74) *Attorney, Agent, or Firm*—Charles A. Lemaire; Lemaire Patent Law Firm, P.L.L.C.

(57) ABSTRACT

A memory controller and method that provide a read-refresh (also called "distributed-refresh") mode of operation, in which every row of memory is read within the refresh-rate requirements of the memory parts, with data from different columns within the rows being read on subsequent read-refresh cycles until all rows for each and every column address have been read, scrubbing errors if found, thus providing a scrubbing function that is integrated into the read-refresh operation, rather than being an independent operation. For scrubbing, an atomic read-correct-write operation is scheduled. A variable-priority, variable-timing refresh interval is described. An integrated card self-tester and/or card reciprocal-tester is described. A memory bit-swapping-within-address-range circuit, and a method and apparatus for bit swapping on the fly and testing are described.

45 Claims, 15 Drawing Sheets

U.S. PATENT DOCUMENTS

| | | | |
|---|---|---|---|
| 4,888,773 A | 12/1989 | Arlington et al. | |
| 5,200,963 A | 4/1993 | Chau et al. | |
| 5,267,242 A | 11/1993 | Lavallee et al. | |
| 5,274,648 A * | 12/1993 | Eikill et al. | 714/719 |
| 5,278,839 A * | 1/1994 | Matsumoto et al. | 714/710 |
| 5,357,621 A | 10/1994 | Cox | |
| 5,400,342 A | 3/1995 | Matsumura et al. | |
| 5,406,565 A | 4/1995 | MacDonald | |
| 5,430,859 A | 7/1995 | Norman et al. | |
| 5,495,491 A * | 2/1996 | Snowden et al. | 714/764 |
| 5,502,814 A | 3/1996 | Yuuki et al. | |
| 5,533,194 A | 7/1996 | Albin et al. | |
| 5,745,508 A | 4/1998 | Prohofsky | |
| 5,751,728 A | 5/1998 | Katanosaka | |
| 5,774,646 A * | 6/1998 | Pezzini et al. | 714/42 |
| 5,787,101 A | 7/1998 | Kelly | |
| 6,226,766 B1 * | 5/2001 | Harward | 714/719 |
| 6,229,727 B1 * | 5/2001 | Doyle | 365/63 |
| 6,285,962 B1 | 9/2001 | Hunter | |
| 6,434,648 B1 | 8/2002 | Assour et al. | |
| 6,463,001 B1 * | 10/2002 | Williams | 365/222 |
| 6,658,610 B1 * | 12/2003 | Chai et al. | 714/718 |
| 6,779,128 B1 * | 8/2004 | Gale et al. | 714/6 |
| 6,796,501 B2 | 9/2004 | Omet | |
| 6,879,530 B2 * | 4/2005 | Callaway et al. | 365/201 |
| 6,898,101 B1 | 5/2005 | Mann | |
| 6,901,541 B2 | 5/2005 | Antosh et al. | |
| 6,944,694 B2 * | 9/2005 | Pax | 710/107 |
| 7,073,112 B2 * | 7/2006 | Chai et al. | 714/733 |
| 7,088,713 B2 * | 8/2006 | Battle et al. | 370/389 |
| 2002/0116668 A1 | 8/2002 | Chhor et al. | |
| 2005/0053057 A1 * | 3/2005 | Deneroff et al. | 370/360 |
| 2007/0067556 A1 * | 3/2007 | Dixon et al. | 711/106 |

FOREIGN PATENT DOCUMENTS

| | | |
|---|---|---|
| EP | 0 849 743 A3 | 8/1999 |
| JP | 2003015966 | 1/2003 |

* cited by examiner

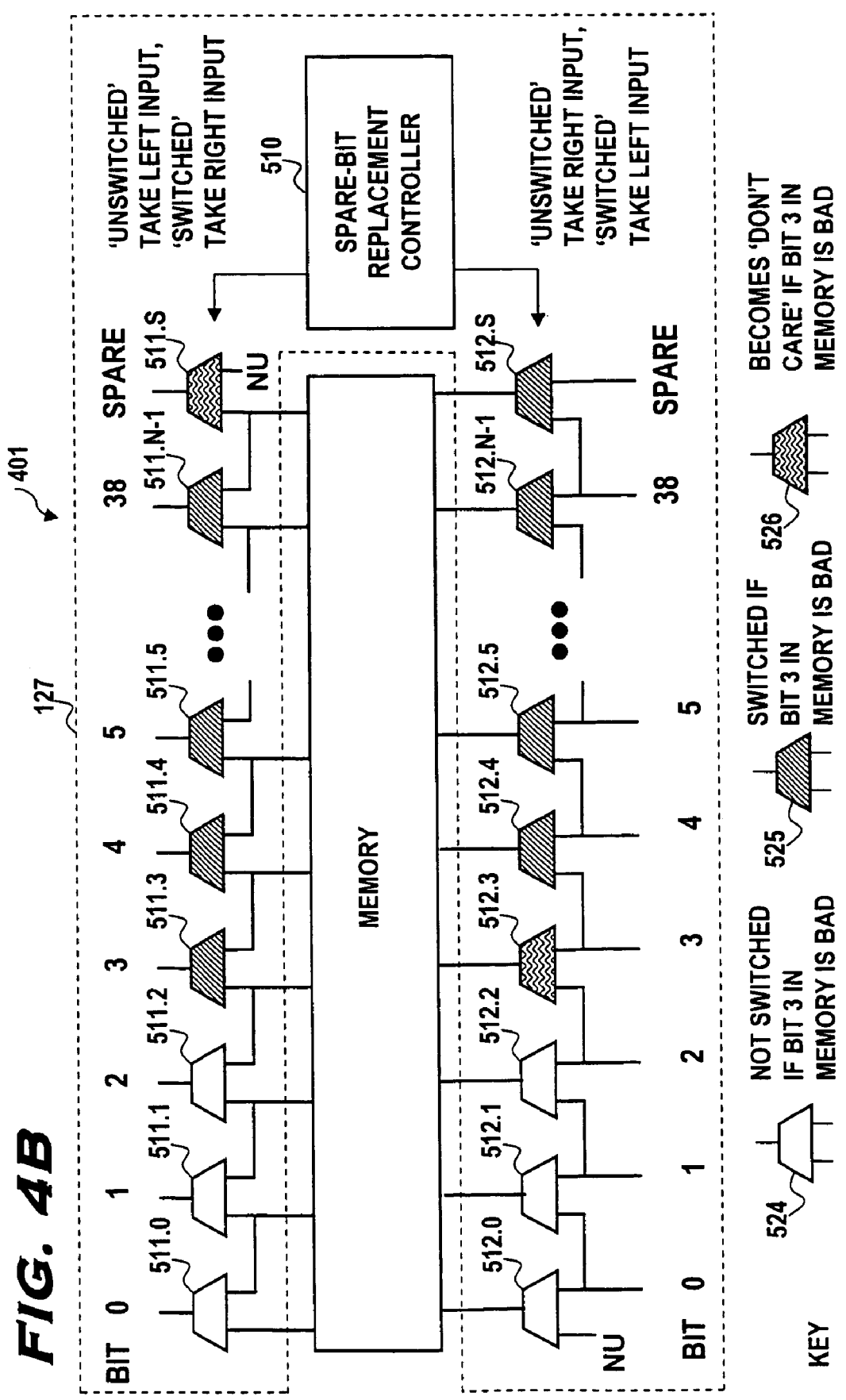

APPARATUS AND METHOD FOR MEMORY WITH BIT SWAPPING ON THE FLY AND TESTING

RELATED APPLICATIONS

Benefit is claimed under 35 U.S.C. 119(e) to U.S. Provisional Application Ser. No. 60/472,174, entitled "APPARATUS AND METHOD FOR TESTING MEMORY CARDS" by David R. Resnick et al., filed May 20, 2003, which is herein incorporated in its entirety by reference.

This application is also related to U.S. application Ser. No. 10/850,044, titled "APPARATUS AND METHOD FOR TESTING MEMORY CARDS" filed on even date herewith, which is incorporated herein by reference.

FIELD OF THE INVENTION

This invention relates to the field of computer memories, and more specifically to a method and apparatus for enhancing performance, reliability and availability in a computer memory by providing, in each word in memory, one or more spare bits and a circuit that can switch the spare bits in specified sections of memory dynamically (in real time) while the system is running and using data from the section being switched, and to circuitry that allows functions of the card to be tested from the same card or from another memory card that is connected through a test apparatus. The apparatus and method allow selecting from among a plurality of ways to perform memory refresh in DRAM memories according to which way is more efficient, providing variable timing for each cycle of refresh, and performing memory scrubbing which removes transient errors from the memory being controlled. An atomic read-correct-write can be scheduled to go back and fix a memory location after an error is detected in data, where the data was earlier corrected and sent to a processor.

BACKGROUND OF THE INVENTION

Controllers for DRAMs (dynamic random-access memories) have been getting more complex over time as the data rates to memory have been increasing, but also as the features built into the memory parts have become more elaborate. For example, having multiple memory banks in the memory parts (chips) adds significantly to the design complexity of a controller that attempts to use the capability of such memory parts to better advantage.

Over time and as a result of multiple causes, computer memories will have data errors. Only purchasers of inexpensive PCs tolerate the inconvenience of memories that do not have ECC (error-correction code) circuitry. One common ECC type is an SECDED (single-error correct, double-error detect) ECC. There are numerous different well-known codes that can be used to achieve such a function.

As the density of memory chips keeps increasing, the individual memory bits become more sensitive to upset and therefore to data loss. Data failures that do not result in (or result from) permanent IC failures, such that the memory part still functions correctly, are called soft errors. These soft errors can be caused by familiar mechanisms like alpha particles but also, increasingly, by other mechanisms like other heavy ions and power-supply noise. The sensitivity to data loss increases geometrically as process rules shrink and power-supply voltages are reduced, while the total number of bits per processor also increases geometrically because of user memory-size requirements. This means that soft-error rates for systems coming on line will increase by orders of magnitude over historic error-rate norms.

In the past, soft memory errors have generally been handled by error-correction codes: SECDED and the like. Other correction technologies exist, and are sometimes used, but become increasingly expensive as a fraction of total memory cost as the correction and recovery capability is improved. For example, U.S. Pat. No. 5,745,508 "ERROR-DETECTION CODE" by Thomas Prohofsky, which is incorporated herein by reference, discusses SECDED codes that also detect certain three-bit and four-bit errors; and U.S. Pat. No. 4,319,357 "DOUBLE ERROR CORRECTION USING SINGLE ERROR CORRECTING CODE" by Bossen, which is incorporated herein by reference, discusses correcting certain hard-soft double-error combinations.

U.S. patent application Ser. No. 09/407,428 filed Sep. 29, 1999 and entitled "MULTIPROCESSOR NODE CONTROLLER CIRCUIT AND METHOD" by Deneroff et al. describes a system that can use ECC memory.

All DRAM parts need to be refreshed; that is what the D (dynamic) in the DRAM name indicates: one must cycle the memory repeatedly in order that the dynamic contents (the stored charges) of the capacitive store of each memory bit are regenerated. This "refresh" function is typically managed by having the memory parts themselves perform the refresh operation. This function generally takes place after a specific command is sent from the local memory controller using a specific request rate so that all memory bits are referenced within the required refresh interval.

Some features that have been in some controllers in the past and whose recognized benefits indicate that they are likely to be used in new designs are memory refresh, memory scrubbing, and support for spare bits in memory. Conventional uses for a spare bit include the ability to logically rewire a card that has a stuck bit (a bit that is always zero or one) or a frequently failing signal on a pin of a memory part such that the card can be returned to correct operation without physical access to the failing pin, chip, or card. In the past, such rewiring typically required removing the card from the system. Logic circuits that provide rudimentary versions of these features with the card in place in a system have shortcomings, such as having to stop accesses from the processor, at least as regards a section of memory having a failed bit and perhaps entirely, in order to reconfigure the memory card to have the spare bit to replace the failed bit.

Electrical issues and pin limitations push memory system design in directions that put the memory controller(s) on the memory cards and also push the card interface to have higher data rates per pin in order to reduce the number of pins while keeping the card bandwidth in line with the higher performance needs of the attached processors and of the bandwidth of the memory components on the memory cards. A memory card design that adopts this direction has test issues, in that the memory components (the chips) are not directly accessible for testing as is normal in past industry practice, and the data rates of the high-speed interfaces are too fast for connection to testers that are available in normal production testing. While special purpose test equipment can be built and used, the design of special-purpose memory testers is very expensive and time consuming.

Thus, there is a need for improved methods and circuits in memory subsystems and for logic functions in which memory performance, reliability (the time between system failures, or the inverse of failure frequency) and availability (the percentage of time the system is up and working) are improved.

SUMMARY OF THE INVENTION

Some embodiments of the invention provide a memory daughter card (MDC) for a computer system that uses one or more MDCs, wherein each MDC includes, in some embodiments, a W-circuit and a plurality of memory parts or chips. The W-circuit provides a large variety of complex functions that support and enhance the function of the MDC, such as test, refresh, bit-swap, high-speed serial interface, command and access buffering, error-correction-code generation, checking and corrections, address-range checking, and/or command interleaving functions etc.

In some embodiments, each memory controller can swap a spare bit into operation in a section of memory, dynamically in the background (i.e., in some embodiments, the swap is performed as part of the regular read-refresh operations, performed in the background during and while normal processor operations proceed in the foreground), while keeping the data in its normally addressed locations and even allowing functional processing to continue to the affected memory locations during the swap operation. One at a time, each word in the affected portion of memory is read using the normal bit mapping, corrected if necessary, and then written to the same address but using the bit-swapped mapping. Some embodiments use pointers that define the start address and end address of the bit-swapped portion of memory, such that regular processor read operations and write operations use the bit-swapped mapping for the portion that has been swapped, and use the normal bit mapping for the portion that has not been swapped. This allows the bit swapping operations and regular processor read operations and write operations to be performed at the same time (though individual operations are interleaved).

Some embodiments also allow spare-bit positions to be moved; for example a memory configured with bit-3, say, as the position of the spare could be reconfigured so that bit-11 (or any other bit in the data path) becomes the spare-bit, all while system operation is ongoing. Thus, the spare bit or bits can be configured to start out in any bit position or bit positions in the memory data path, and can be moved to any other position(s) during system operation.

Another aspect of the invention, in some embodiments, includes a bit-shifting circuit that allows bit replacement, i.e., allows any data bit, SECDED ECC bit, or other data-bit position to be disconnected or ignored, and effectively replaced using a spare bit. In some embodiments, an address-range detection circuit is coupled to the bit-shifting circuit, wherein one or both of the address endpoints of the range are changed as the data is read out of the old bit positions, corrected if necessary, and then written back into the new bit positions. Normal read and write operations also use the address-range detection circuit such that operations within the bit-replaced address range use the bit-shifted configuration, and operations not within the bit-replaced address range use the normal bit configuration. The present invention provides a memory daughter card (MDC) having one or more (likely multiple) very high-speed serial interface(s), optionally an on-card L3 cache, and an on-card MDC test engine (or equivalently, a W-circuit test engine) that allows one MDC to be directly connected to another MDC, or to itself, for testing purposes. In some embodiments, a control interface, such as a JTAG interface and/or an IEEE-1394-type channel, allows the test engine to be programmed and controlled by a test controller on a test fixture that allows a single card to be tested, or simultaneous testing of one or more pairs of MDCs, one MDC in a pair (the "golden" MDC) testing the other MDC of that pair.

Some embodiments of the invention provide a memory daughter card having a memory controller that provides a read-refresh (also called "distributed-refresh") mode of operation, in which every row of memory is read within the refresh-rate requirements of the memory parts, with data from different columns within the rows being read on subsequent read-refresh cycles until all rows for each and every column address have been read, at which point the process begins anew, thus reading every location in memory at a regular interval. While some previous controller implementations provided a refresh function using read commands (i.e., sending both row addresses and column addresses to access and cycle through all the memory rows,), the column address was a "don't care" value, thus ignoring which memory column is was selected in order to simplify their refresh function. In contrast, some embodiments of the present invention cycle through all the row addresses at a rate sufficient to refresh the memory parts at a given column (and actually reading the data and checking it), but these embodiments of the present invention also cycle through all the column addresses for the refresh commands, check the ECC for each word of data read, and correct any errors that are found, thus providing a scrubbing function that is integrated into the read-refresh operation, rather than being an independent operation. This satisfies the refresh-rate requirement to read every row within the specified row-refresh interval, and also changes columns on each successive row-refresh interval, which is not required to provide the refresh function, but is provided in order to read and check the ECC on every location during this type of refresh.

In some embodiments, a scrubbing function is also provided (based on the checked ECC data) and is integrated into the read-refresh operation rather than being an independent operation. For scrubbing, in some embodiments, a subsequent atomic read-correct-write operation is scheduled based on each correctable single-bit error detected during the read-refresh operations (the separate read is done just in case the processor had modified the contents after the error was detected but before corrected data could have been written back, thus the read data from the request from which the error was detected, is not used for the write back of corrected data, but instead a new read is done as part of an atomic instruction) to correct the affected location. If no error was detected, then no scrubbing is needed. Other embodiments can selectively halt subsequent references to the memory bank whose data word is being scrubbed until the corrected data is returned to the memory part or it is determined that there was no error so that no write operation need take place.

In some embodiments, if a single-bit error is detected in a normal read operation from the processor, the error is fixed in the memory card and the corrected data are sent to the processor, and a supplemental atomic read-correct-write sequence is scheduled (as above, just in case the original processor or another processor had quickly modified the contents after the error was detected).

In some embodiments, a scrubbing function is provided in addition to an explicit-refresh (also called AutoRefresh) (i.e., scrubbing is interleaved with), such that all row addresses and all column addresses within each row are periodically read (e.g., about once per hour, in some embodiments, but in addition to and interspersed with the AutoRefresh, rather than instead of the AutoRefresh), and a correction sent if an error is detected. That is, is these embodiments, AutoRefresh is left on all the time, with the scrubbing function also running but in the background, for those cases where AutoRefresh uses less memory bandwidth than distributed refresh. In other embodiments, AutoRefresh mode of operation is alternatively selected instead of the read-refresh mode of operation to improve performance. That is, in some of these embodiments, AutoRefresh is run for about an hour, the read-refresh is run instead to scrub memory once and perform refresh while scrubbing, and then AutoRefresh is again turned on.

In some embodiments, if using the read-refresh (distributed-refresh) mode of operation so that scrubbing and/or the spare-bit capability are all used as needed within the refresh function, the refresh rate (and therefore the rate of the scrubbing and spare-bit functions) is set by the refresh requirements of the memory being controlled. In some embodiments, when the AutoRefresh function is instead being used for refresh, then the refresh frequency becomes fixed (e.g., a refresh request every 7.8 microseconds for certain parts including certain DDR2 (Double Data Rate 2, a JEDEC memory standard for DRAM memory parts)), and the rates at which scrubbing and spare-bit insertion are done are set separately and independently from the refresh rate, generally at a much slower rate. In some embodiments, when doing AutoRefresh and scrubbing only, the scrub rate is set slow (e.g., at a rate to scrub memory once every few hours); and if doing AutoRefresh, scrubbing and spare-bit insertion, the read-refresh (distributed-refresh) rate would be set to be fairly fast (in some embodiments, e.g., up to a rate that would take about 10% or less of the memory bandwidth).

Some embodiments further provide one or more very-high-speed serial interfaces to the processor, and optionally an on-card L3 cache.

A method is also described, wherein one MDC executes a series of reads and writes (and optionally other commands) to another MDC to test at least some of the (and ideally, most or all of) other card's functions. A method is also described, wherein one port of an MDC executes a series of reads and writes (and optionally other commands) to another port of the same MDC to test at least some of the (and ideally, most or all of) the card's functions.

It is to be understood that a memory "card" or "daughtercard" includes any suitable packaging, including printed circuit card, ceramic module, or any other packaging that holds a plurality of memory chips along with some or all of the circuitry described herein. In some embodiments, a "card" would include a single integrated-circuit chip having both the memory and some or all of the circuitry described herein.

BRIEF DESCRIPTION OF THE DRAWINGS

FIG. 4B is a block diagram of an activated bit-swapping circuit 401 of some embodiments of the invention.

DESCRIPTION OF PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally correspond to the Figure number in which that component is first introduced, such that the same reference number is used throughout to refer to an identical component which appears in multiple Figures. Signals and connections may be referred to by the same reference number or label, and the actual meaning will be clear from its use in the context of the description.

System Environment

Figure 1A:
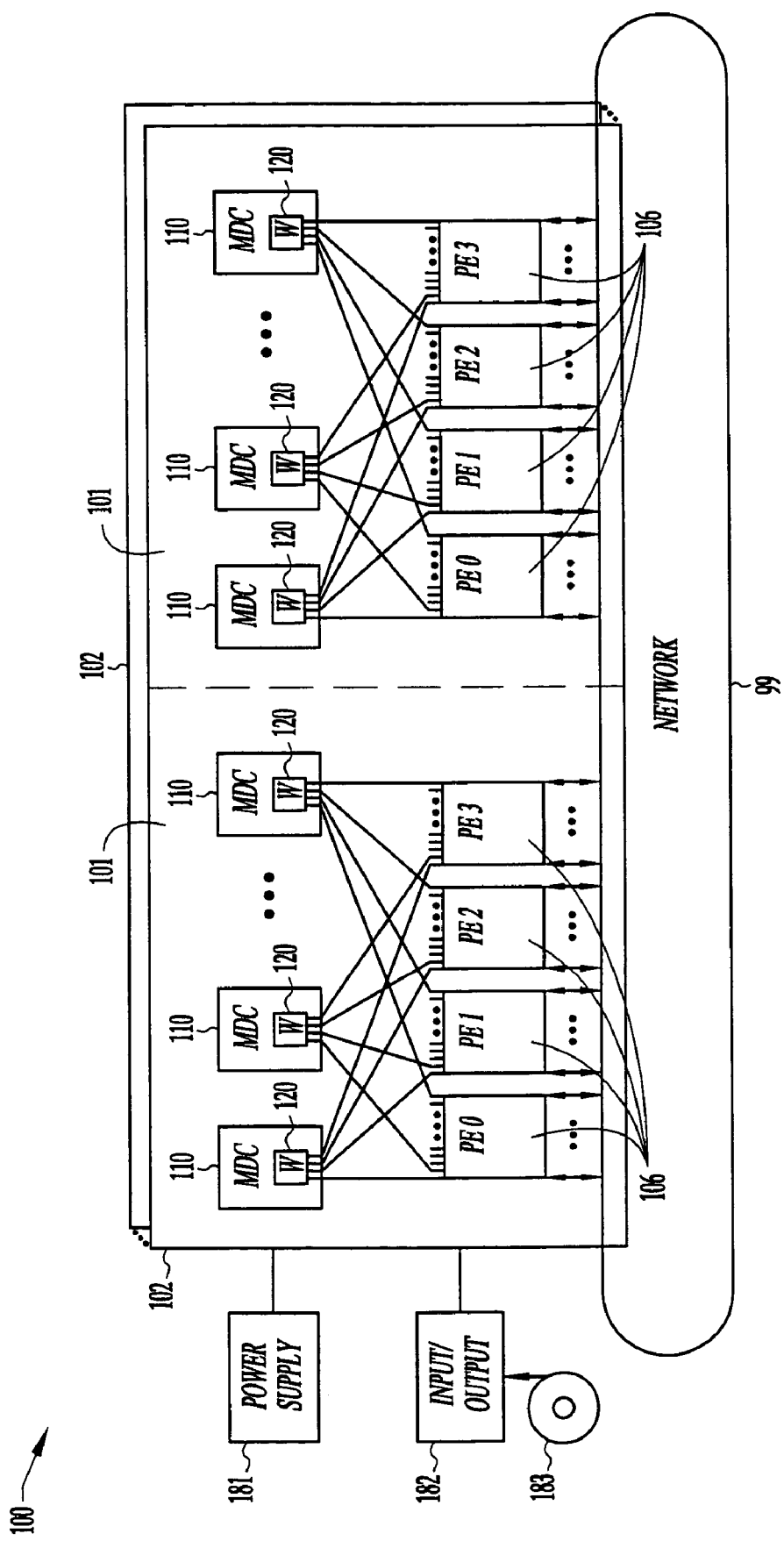
FIG. 1A is a block diagram of a computer system 100 of some embodiments of the invention.

FIG. 1A is a block diagram of a computer system 100 of some embodiments of the invention. Computer system 100 includes an interconnection network 99 that is connected to one or more boards 102, each board having one or more nodes 101 (for example one or two nodes 101 per board 102), each node 101 having one or more PEs (processing elements, also called processor units, or processors) 106 (for example, four processing elements 106 are used in some embodiments), each node 101 having one or more memory daughter cards (MDCs) 110 (for example, up to thirty-two MDCs 110 per node 101, in some embodiments). In some embodiments, a node controller, router, and interconnection scheme such as described in U.S. patent application Ser. No. 09/407,428 filed Sep. 29, 1999 and entitled "MULTIPROCESSOR NODE CONTROLLER CIRCUIT AND METHOD" is used with node 101. In some embodiments, each PE 106 has six connections to network 99 (e.g., a multi-dimensional network, two each in each of three directions, and which, for example, can be used to form a torus (optionally multidimensional) interconnection), while in other embodiments, other numbers of connections are made to construct different network topologies. In typical systems, a power supply system 181 supplies power, and an input/output system 182 provides data input and output, such as to and from disk and/or tape storage devices, and/or user consoles.

Figure 1B:
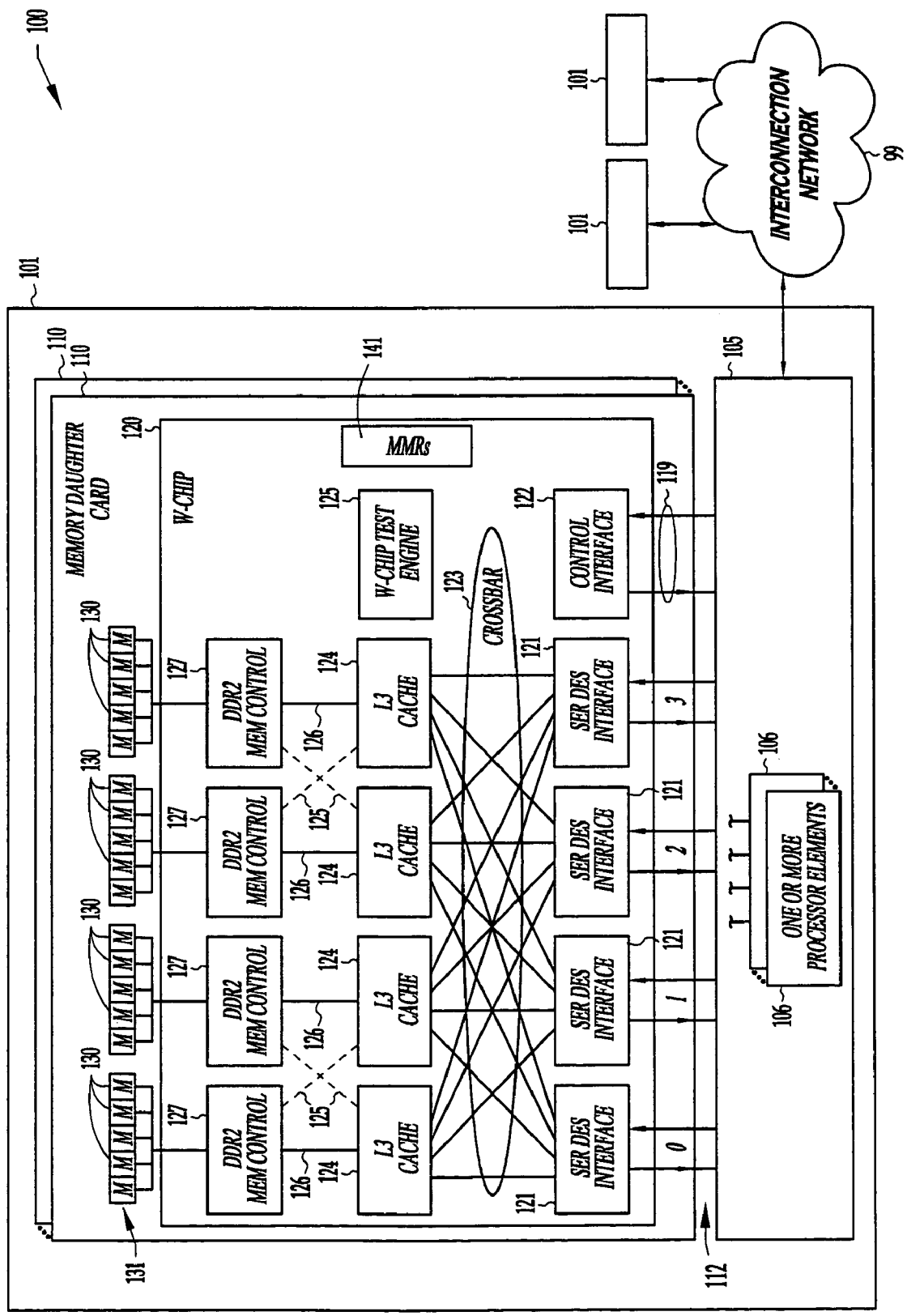
FIG. 1B is a block diagram of a different view of computer system 100 of some embodiments of the invention.

FIG. 1B is in further explanation of the embodiment of computer system 100. Computer system 100 includes an interconnection network 99 that is connected to a plurality of nodes 101, each node 101 having a processor group 105 having one or more processing elements 106 (for example, four processing elements are used in some embodiments), each node 101 having one or more memory daughter cards (MDCs) 110 (for example, up to thirty-two MDCs 110 per node 101, in some embodiments). In some embodiments, all of the MDCs 110 of a node are each connected to all of the processors 106 of that node (e.g., in some embodiments, each of the four ports (e.g., SERDES interfaces) 121 of each MDC 110 is connected to a different one of the plurality of processors 106).

In some embodiments, each MDC 110 includes a single W-chip or W-circuit 120 (i.e., a circuit 120, which, in some embodiments, is implemented on a single chip (and, in some embodiments, includes other circuitry and/or functions than described herein), but in other embodiments, can be implemented on multiple chips, or a processor, or on a memory chip or using other configurations), but in other embodiments, circuit 120 is implemented using more than one chip, but is designated herein as W-chip or circuit 120) having a high-speed external card interface 112, which in turn includes a plurality of SerDes (serializer-deserializer) ports 121 (for example, four SerDes ports 121 per MDC 110 are used in some embodiments). A crossbar switch 123 connects each SerDes port 121 to each one of a plurality of L3 caches 124 (for example, four L3 caches 124 per MDC 110 are provided in some embodiments). In some embodiments, each L3 cache 124 is tied by connection 126 to a corresponding DDR2 memory controller 127. In some embodiments, an additional "degrade capability" connection 128 is provided between each L3 cache 124 and a neighboring DDR2 memory controller 127. In some embodiments, each DDR2 memory controller 127 controls five eight-bit-wide DDR2 memory-chip groups 130 (for example, each chip group 130 having one memory chip, or having two or more stacked chips). This provides each DDR2 memory controller 127 with a forty-bit-wide data path, providing 32 data bits, seven ECC (error-correction code) bits, and a spare bit.

In some embodiments, the individual memory components of the memory-chip group(s) 130 conform to the emerging JEDEC Standards Committee DDR2 SDRAM Data Sheet Revision 1.0 Specification JC 42.3 (JESD79-2 Revision 1.0) dated Feb. 3, 2003 or subsequent versions thereof. In other embodiments, conventional, readily available DDR chips are used. In yet other embodiments, any suitable memory-chip technology (such as Rambus (tm), SDRAM, SRAM, EEPROM, Flash memory, etc.) is used for memory-chip groups 130.

In some embodiments, each DDR2 memory controller 127 controls five eight-bit-wide DDR2 memory-chip groups 130 (for example, each chip group 130 having one memory rank, or having two or more ranks with possibly stacked memory chips). This provides each DDR2 memory controller 127 with a forty-bit-wide data path, providing 32 data bits, seven ECC (error-correction code) bits, and a spare bit.

The W-circuit 120 also includes a control interface 122 (some embodiments use a JTAG-type boundary-scan circuit for control interface 122; some other embodiments use a Firewire (IEEE Standard 1394) channel (or other standard or custom interface channel) for the off-card interface 119 to control interface circuit 122). In some embodiments, the Firewire interface is built into W-circuit 120, while in other embodiments, the Firewire interface is built on a separate chip on MDC 110, and connects to a JTAG interface provided by control interface 122. Control interface 122 provides the mechanism to set bit patterns in configuration registers (for example, some embodiments use memory-mapped registers (MMRs) 141) that hold variables that control the operation of W-circuit 120.

The present invention also provides circuitry that allows one MDC 110 to test another MDC 110, in some embodiments, or to test itself, in other embodiments. In some embodiments, this circuitry is implemented as a W-circuit test engine (WTE) 125 having a microcode sequence, described further below.

Figure 2A:
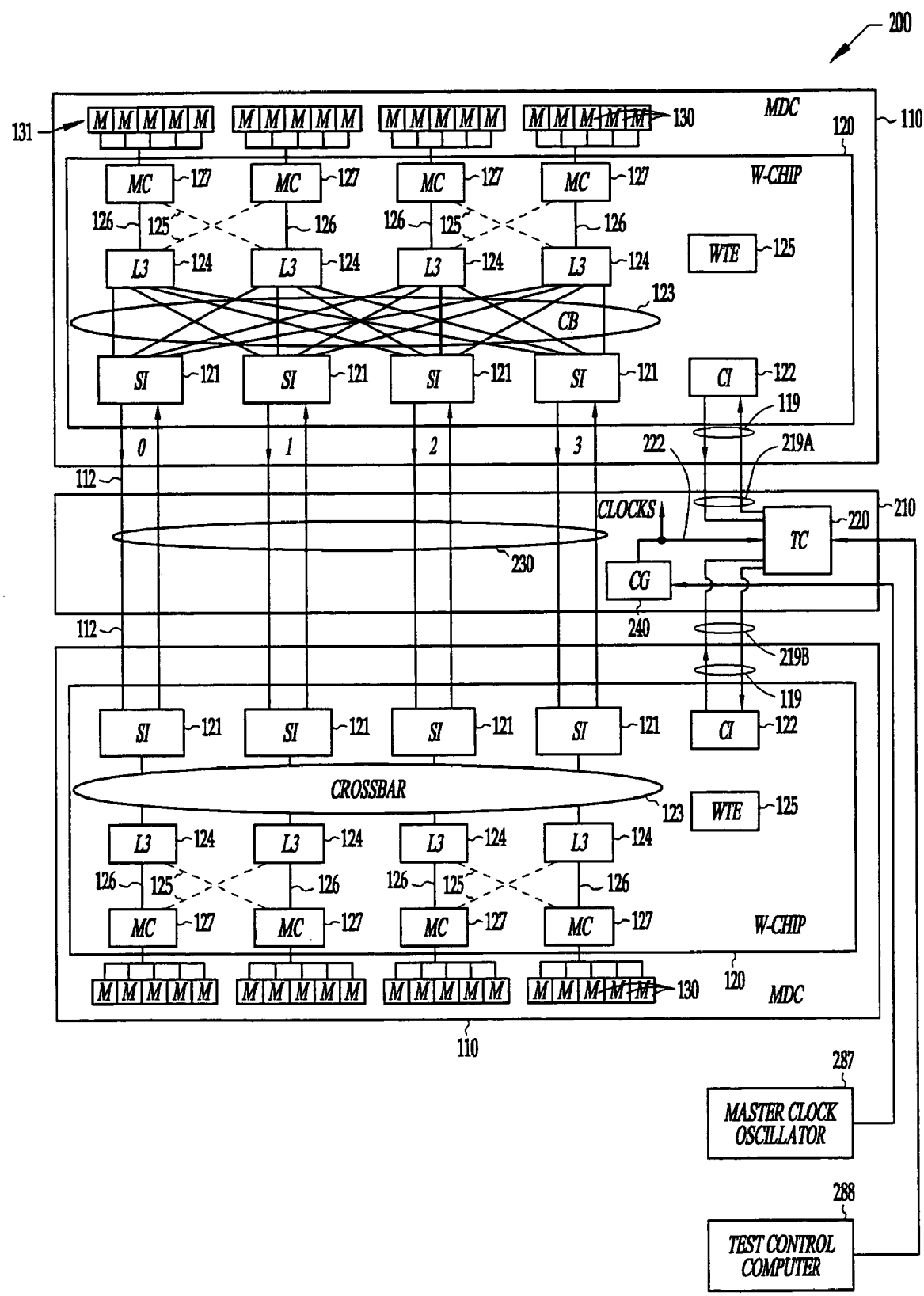
FIG. 2A is a block diagram of a memory-card testing system 200 of some embodiments of the invention.

FIG. 2A is a block diagram of a memory-daughter-card testing system 200 of some embodiments of the invention. In some embodiments, MDC testing system 200 includes a test fixture 210 having two or more MDCs 110 plugged into it. Connections 230 couple each output of each SerDes port 121 to a corresponding input of a SerDes port 121 on another MDC 110, thus allowing the test to run each MDC 110 at full speed through its normal read/write interface. The test fixture 210 provides clocks 222 from clock generator 240 (e.g., high-speed differential clocks) used by the MDCs 110, and also includes a test controller 220 that programs one or the other or both WTEs 125 (e.g., through its ports 219A and 219B coupled to the respective ports 119 to control interfaces 122). In some embodiments, test controller 220 sets up one MDC 110 (for example, the lower one) as the tester card wherein its WTE 125 runs the memory tests, and sets up the other MDC 110 (for example, the upper one) as the unit-under-test (UUT) wherein it is configured in the normal read/write memory card mode (as if it were in system 100 of FIG. 1A). Thus, the lower WTE 125 sets up data patterns in its memory-chip groups 130 (at the bottom of FIG. 2A), and then controls the writing of these patterns out the SerDes port 121 of the lower MDC 110, and thus into the SerDes of the upper MDC 110, and into that MDC's caches 124 and memory-chip groups 130. These data patterns are then read back the opposite way (or, in some embodiments, the UUT itself checks read operands from the memory being tested), and compared by WTE 125 in the lower MDC 110. When each test is complete, the results are transferred back to test controller 220 for analysis and use in accepting, rejecting, or reconfiguring the WUT MDC 110.

In some embodiments, such a configuration allows a large variety of debug activities to be performed that are not available on simpler setups that run a large number of tests, but generate only a pass-fail result, such as checking a checksum value after a large number of tests were run. The ability to load microcode having newly devised tests allows intricate debug to be performed, even when the high-speed interfaces (SerDes ports 121, for example) are run at full speed.

Figure 2B:
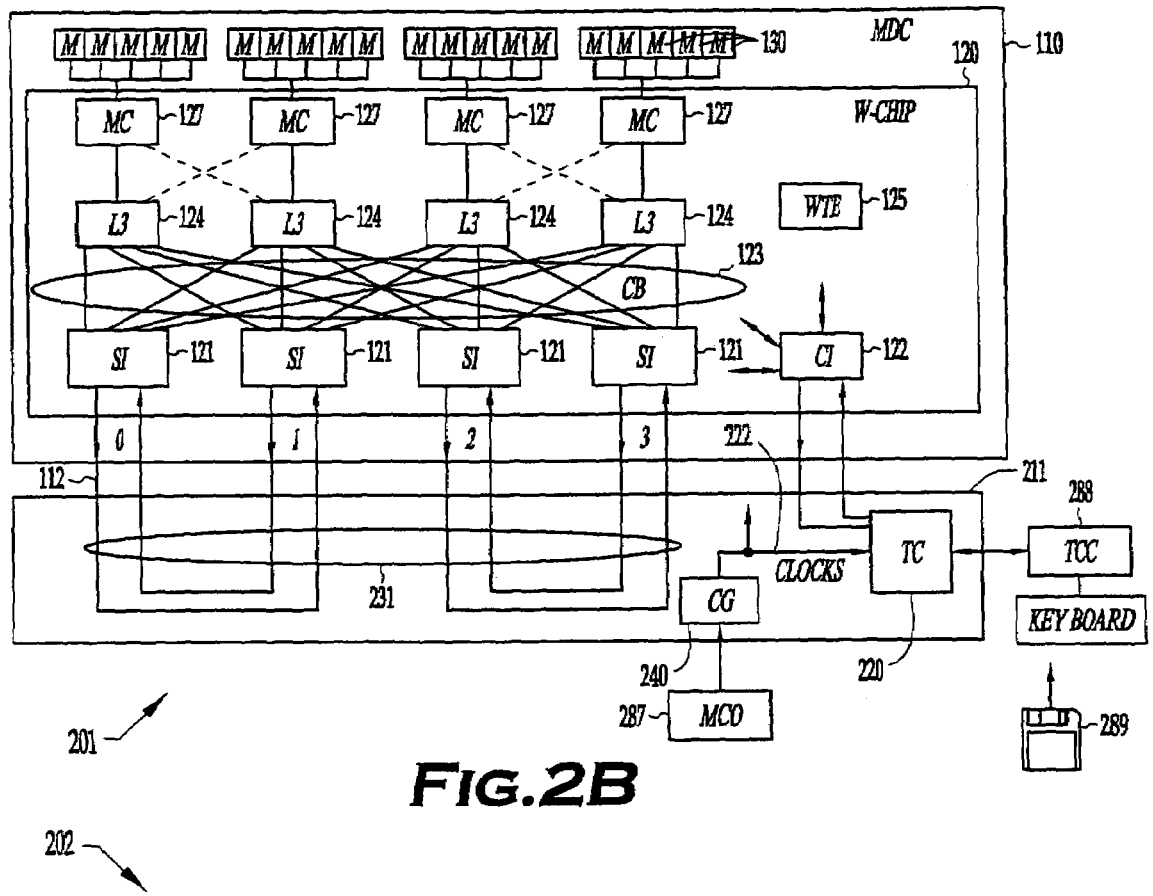
FIG. 2B is a block diagram of a memory-card testing system 201 of some embodiments of the invention.

FIG. 2B is a block diagram of a memory-daughter-card testing system 201 of some embodiments of the invention. In some embodiments, MDC testing system 201 includes a test fixture 211 having a single MDC 10 plugged into it. Connections 231 couple each output of a subset of SerDes ports 121 to a corresponding input of another SerDes port 121 on the same MDC 110, and the test controller's control port 219 is connected to the MDC's port 119 of control interface 122, thus allowing the test to run the MDC 110 at full speed through its normal read/write interface.

In some embodiments, the test fixture 211 (which is similar to fixture 210 of FIG. 2A, except that loop-back connections are made in the test fixture 211 between ports 0 and 1, and ports 2 and 3 of MDC 110) provides clocks 222 (e.g., high-speed differential clocks) used by the MDCs 110, and also includes a test controller 220 that programs the single WTE 125. In other embodiments, one or both MDCs 110 generates its own clocks for its transmitter, which clocks are then received and used by the other MDC 110.

In some embodiments, test controller 220 sets up one or more SerDes ports 121 (for example, port 0 and port 2) as the tester port(s) wherein WTE 125 runs the memory tests out those ports and receives results back into those ports), and sets up the other ports 121 (for example, ports 1 and 3) as the unit-under-test (UUT) ports wherein they are configured in the normal read/write memory card mode (as if it were in system 100 of FIG. 1A). Thus, in some embodiments, the even-numbered ports set up data patterns in their respective memory-chip groups 130, and then controls the writing of these patterns out the even-numbered SerDes port 121, and thus into the odd-numbered SerDes port 121 next to them, and into those port's caches 124 and memory-chip groups 130. These data patterns are then read back the opposite way and compared by WTE 125. When each test is complete, the results are transferred back to test controller 220 for analysis and use in accepting, rejecting, or reconfiguring the UUT MDC 110. This way of testing allows the tests to cover the complete data path from the memories to the edge of the card. Further, only the single MDC 110 is required for the test.

In some embodiments, a test-control computer 288 is provided to drive test controller 220, and to receive results for display, transmission, or storage. In some embodiments, a computer-readable storage medium 289 (such as diskette or CDROM) is used to provide the control program data that is loaded into microcode memory 310 of FIG. 2F, described below. This control program data provides the data and control flow to allow, e.g., one MDC 110 to test another MDC 110. In some embodiments, an external master clock oscillator 287 provides a source signal for clock generator 240.

In other embodiments, a computer-readable storage medium 289 is provided that includes instructions stored thereon for causing a suitably programmed information-processing system to execute one or more of the methods described herein.

Figure 2C:
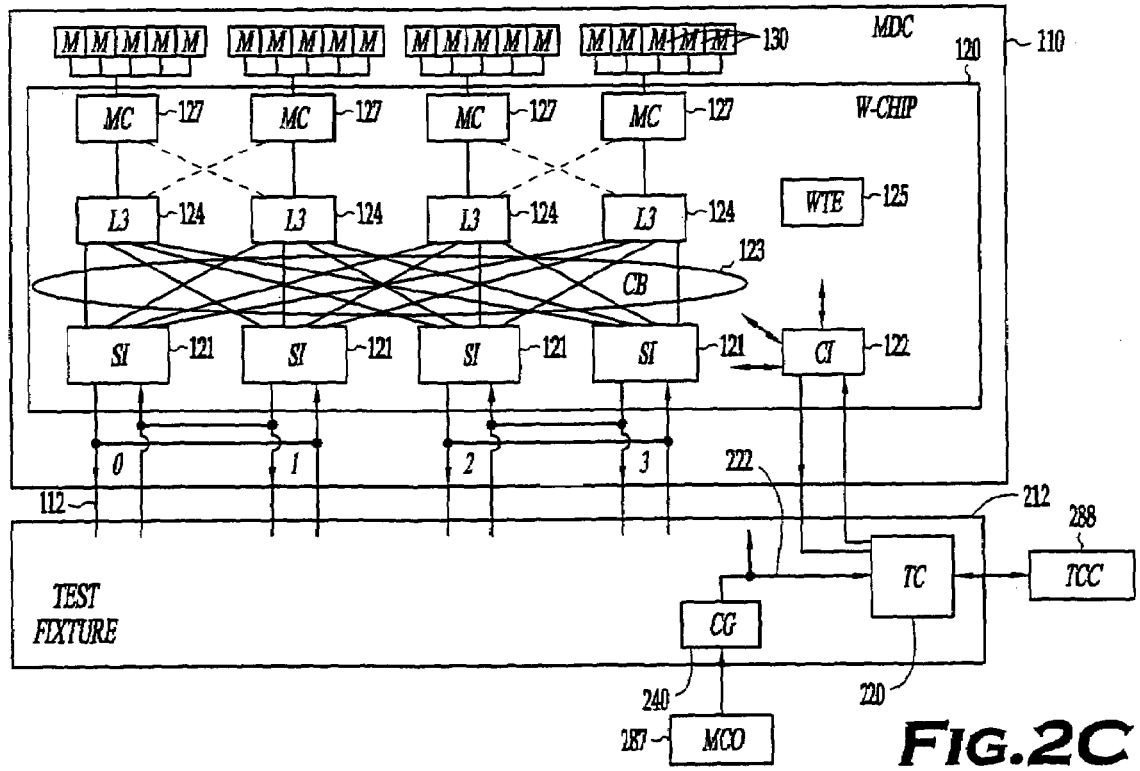
FIG. 2C is a block diagram of a memory-card testing system 202 of some embodiments of the invention.

FIG. 2C is a block diagram of a memory-daughter-card testing system 202 of some embodiments of the invention. In some embodiments, MDC testing system 202 includes a test fixture 212 (which is similar to fixture 211 of FIG. 2B, except no electrical connections are made in the test fixture 211 to ports 0, 1, 2 and 3 of MDC 110) having a single MDC 110 plugged into it. Connections (in some embodiments, these are programmably connectable by microcoding WTE 125) are configured on board the MDC 110, rather than in the test fixture as was the case for FIGS. 2B and 2A. In other embodiments, the connections are physically wired (e.g., by card traces, jumpers or soldered "blue wires" that are later removed or cut (for example, by a laser or other suitable method) for normal operation of the card (thus making the test card temporarily not quite exactly identical to the normally operating card). These on-card connections couple each output of a subset of SerDes ports 121 to a corresponding input of another SerDes port 121 on the same MDC 110, thus allowing the test to run the MDC 110 at full speed through its normal read/write interface. Although, this does not allow the testing to the card edge as was the case for FIG. 2B, in other ways the operation of FIG. 2C is the same as for FIG. 2B.

Figure 2D:
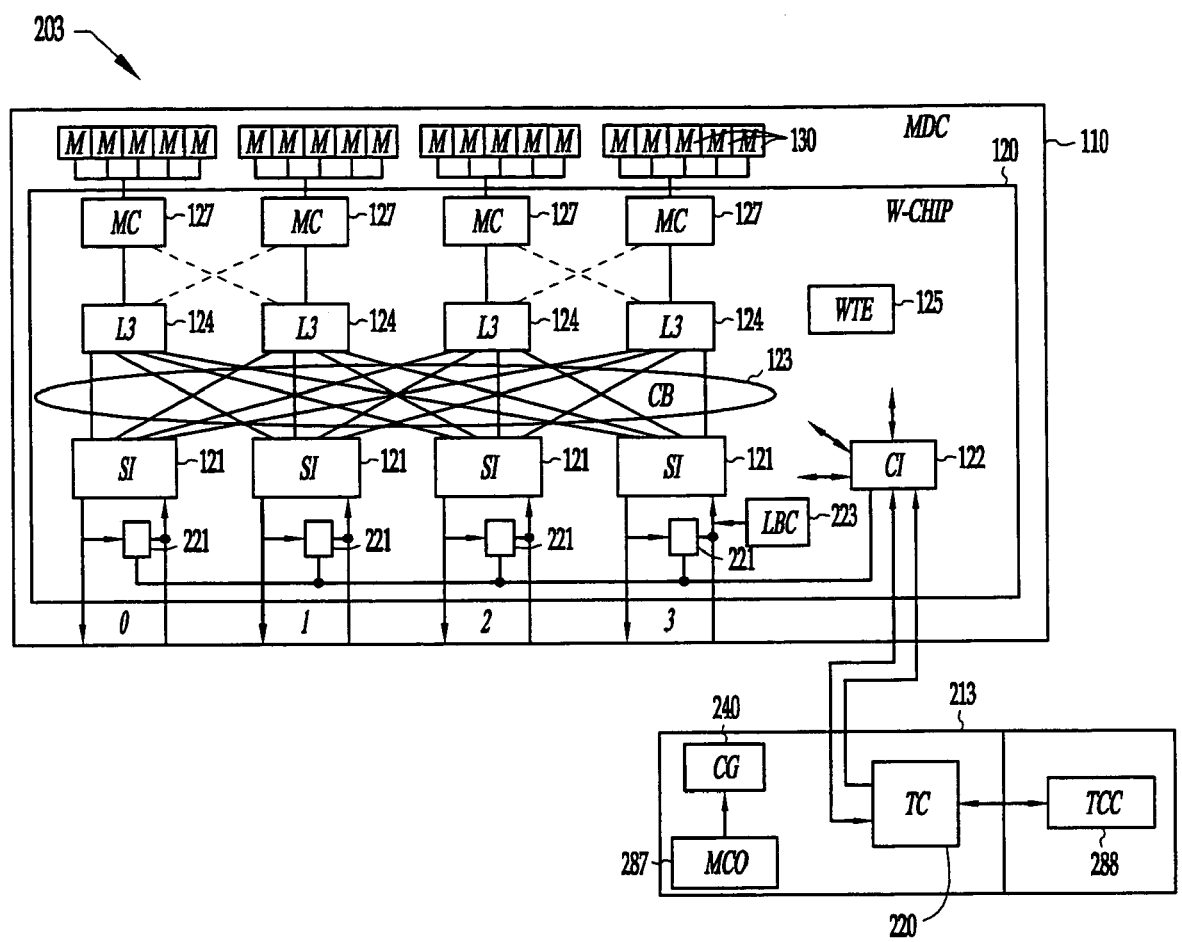
FIG. 2D is a block diagram of a memory-card testing system 203 of some embodiments of the invention.

FIG. 2D shows a similar system 203 having local SerDes Connections, connected by gates 221 under the control of loop-back controller 223 as directed by WTE 125, in some embodiments, within the IC that allow local testing of the SerDes functions before the IC is mounted on the MDC 110 and afterward. The output of each port 121 is returned to the input of the same port within W-circuit 120. In some embodiments, no actual connections to the high-speed serial ports need to be made to the test fixture 213. In some embodiments, MDC testing system 203's test fixture 213 (which is similar to fixture 211 of FIG. 2B, except no electrical connections are made in the test fixture 211 to ports 0, 1, 2 and 3 of MDC 110) has one or more MDCs 110 plugged into it.

Figure 2E:
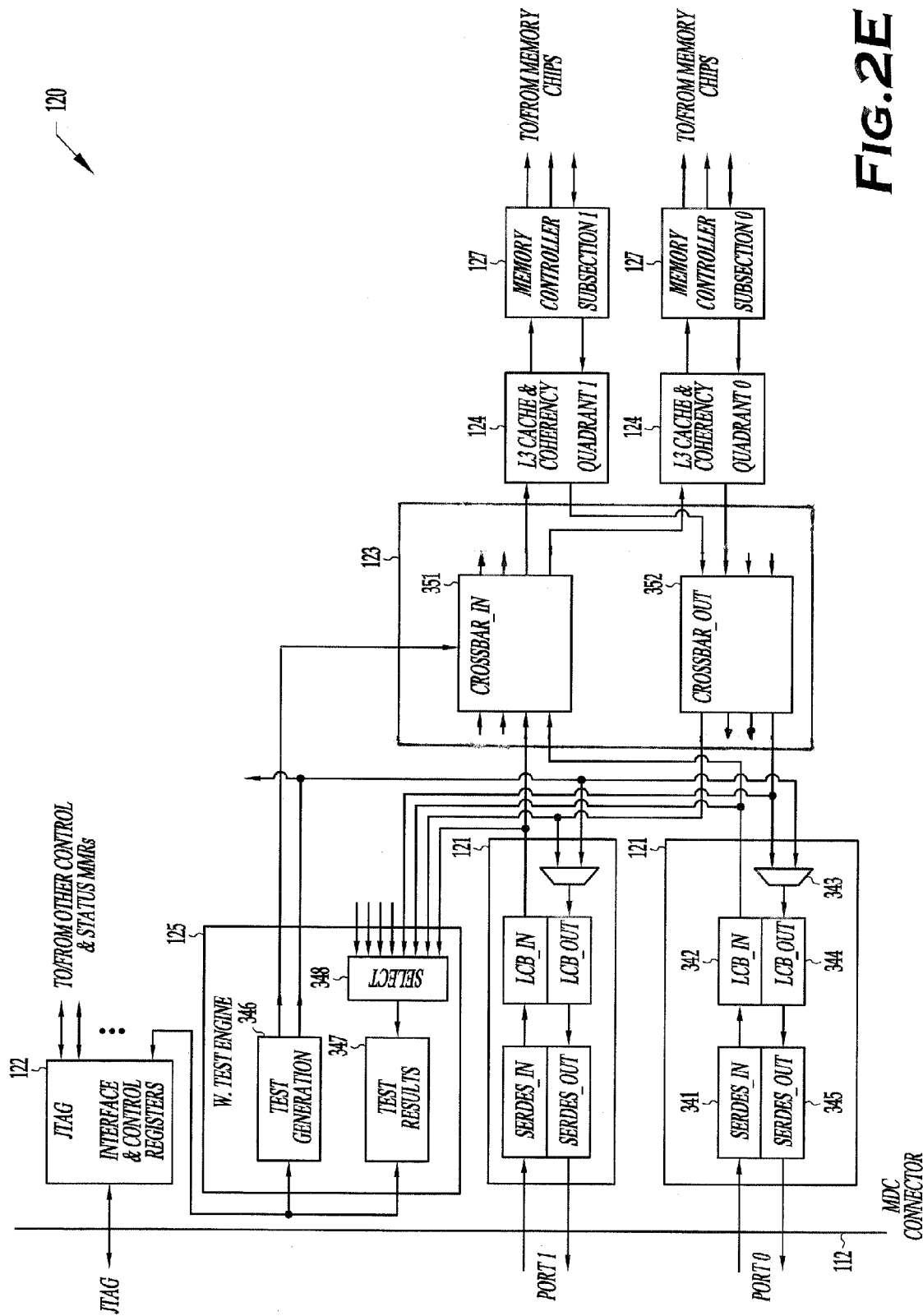
FIG. 2E is a block diagram of a portion of W-circuit 120 of some embodiments of the invention.

FIG. 2E is a block diagram of a portion of W-circuit 120 of some embodiments of the invention, showing more detail than is shown in FIG. 1A. In some embodiments, W-circuit 120 includes a control interface 122 (for example, a JTAG-type scan-register interface and associated control registers), a WTE 125, a crossbar 123 that connects each of four SerDes ports 121 (two are shown here) to each of four L3 caches 124 (two are shown here), which are in turn coupled to a corresponding memory controller 127 (two of four are shown here). WTE 125 includes a test generation component 346 and a test results component 347 that compares results obtained by selection circuitry 348 that obtains results from the SerDes-in sections 341 or the crossbar-out sections 352. Each port 121 includes a SerDes-in 341 portion that feeds a corresponding Link Control Block-in (LCB-in) circuit 342, and a multiplexer (selector) 343 that obtains data from test generator 346, and crossbar-out circuit 352 and selects one of those to feed to LCB-out circuit 344 and then to SerDes-out portion 345. The crossbar-in portion 351 obtains data from each input port (i.e., from the output of its LCB-in 342) and directs that data to one of the four L3 caches 124. The crossbar-out portion 352 obtains data from one of the four L3 caches 124, and directs that data to one of the four output ports 121 (i.e., to the input of its LCB-out 344 through its selector 343).

In some embodiments, the cache quadrants 124 each drive separate memory controllers 127. In turn, each memory controller drives a set of memory chips 130.

Figure 2F:
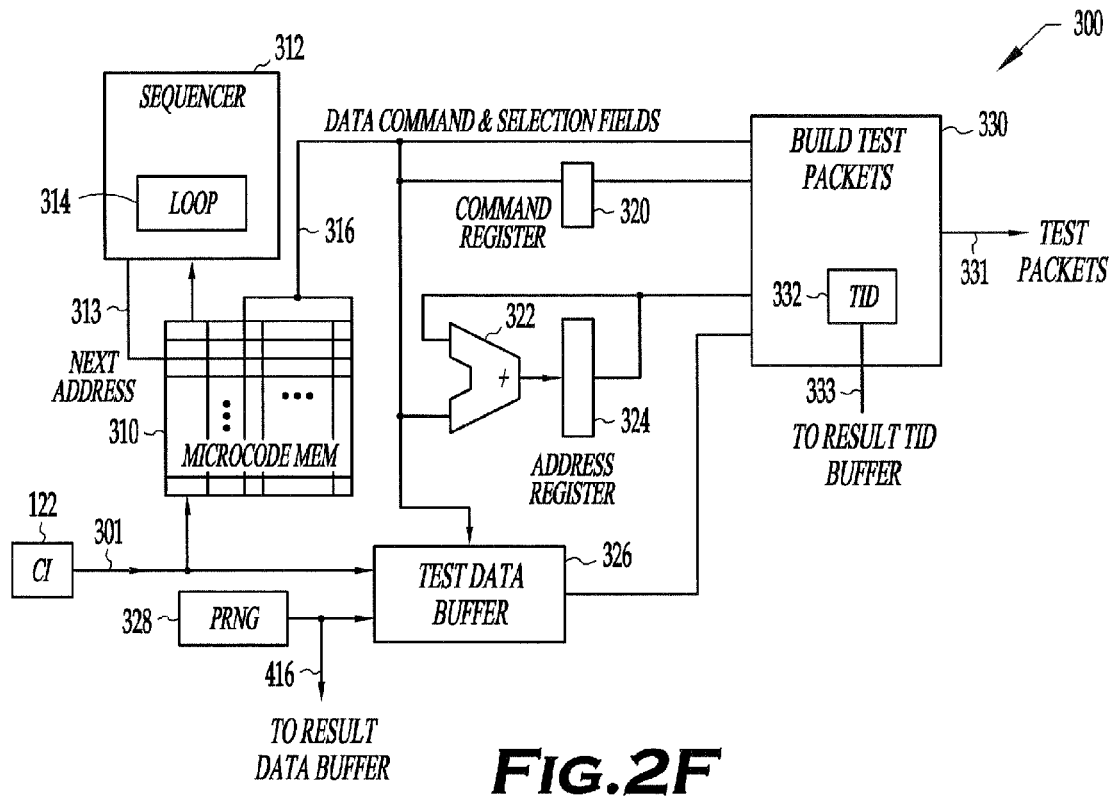
FIG. 2F is a block diagram of a test-engine processor 346 of some embodiments of the invention.

FIG. 2F is a block diagram of a test-engine processor 346 of some embodiments of the invention. Test-engine processor 346 provides test generation functions for WTE 125. Programming and data patterns 301 are sent from test controller 220 (see FIG. 1B) through control interface 122, and delivered to microcode memory 310 and test data buffer 326. Some embodiments include a pseudo-random number generator 328 that provides pseudo-random numbers as source test operands to test data buffer 326 and to the expected-result-data buffer 428 (see FIG. 4) instead of loading tests from the control interface 122. Microcode memory 310 provides instructions 316 in a manner programmed into the control words stored there and sequenced by sequencer 312 that includes a loop counter/controller 314, and that generates each next address 313 (e.g., sequential execution, looping, branching, etc.). Instructions 316 also include data, command, and selection fields to test data buffer 326, address register 324 and its address adder 322, command register 320, and build-test-packet controller 330. Build-test-packet controller 330 in turn receives commands from command register 320, addresses from address register 324, and data (i.e., patterns to be written, read, and compared) from test data buffer 326. Build-test-packet controller 330 sends test packets 331 to the crossbar-in 351, which forwards them the L3 cache 124 or the memory controllers 127 and then the memory 130 on the tester MDC 110, and sends TIDs (Transaction IDentifiers) to the result-data indexes buffer 422 (see FIG. 4). The test controller 125 can also send test data to the 343 multiplexers and thence to the SerDes ports 121.

Figure 2G:
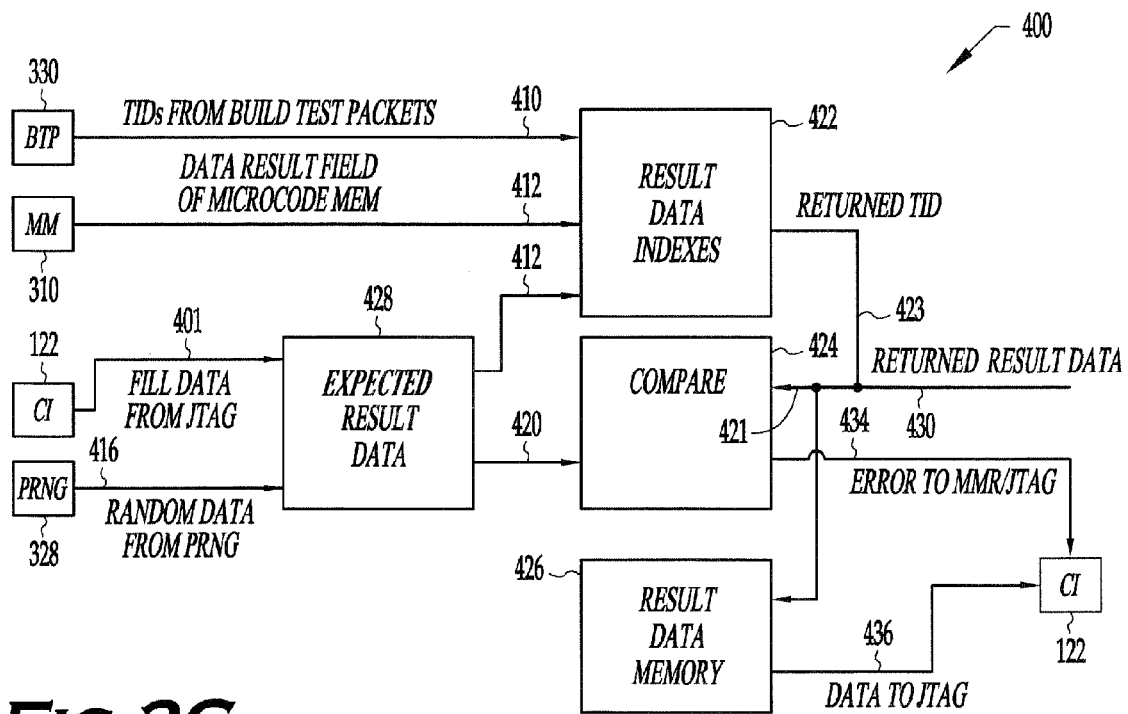
FIG. 2G is a block diagram of a test-engine test-result checker 347 of some embodiments of the invention.

FIG. 2G is a block diagram of a test-engine test-result checker (TETRC) 347 of some embodiments of the invention. TETRC 347 includes an expected-result-data buffer 428 that receives fill data 401 from JTAG control interface 122 (see FIG. 1B), pseudo-random data 416 from pseudo-random number generator 328, and result data indexes 418 an address that is used to read expected result data items from result-data indexes buffer 422, and sends operands for comparison operations performed by compare circuit 424. In other words, the TID (transaction ID) is used as an address into the result data indexes buffer 422, and obtains a pointer 418 that points to an entry having the comparison data in expected result data buffer 428. Result-data indexes buffer 422 receives TIDs from build-test-packet controller 330, data results field data 412 from microcode memory 310, and returned TID data 430 test results selected through multiplexer 348 (see FIG. 2E) from the UUT MDC 110; result-data indexes buffer 422 provides the pointer 418 corresponding to the input TID as an operand (index to retrieve data pattern) to expected-result-data buffer 428. Thus, each TID 410 corresponds to a particular data pattern, and the returned results data includes a TID 423 and data pattern 421, which are correlated by the circuitry such that compare circuit receives the expected data 420 and the returned result data 421 in a time sequence that allows the proper data to be compared, and if the data does not compare properly, and error indication 434 is provided to control interface 122. In some embodiments, a result-data memory 426 provides storage for a series of results that are delivered as data 436 to JTAG control interface 122.

Thus, the memory daughter card (MDC) 110 for computer system 100 is very different from conventional memory cards designed and used previously in the computer industry. MDC 110 does not provide direct access to the memory parts on the card from the card's connector, but instead it receives commands and functional requests through four high-speed ports 121 that can not easily be connected to, or functionally tested by, general-purpose testers or conventional memory testers. This means that test capability of the card must be designed into the card as part of the design process and, in some embodiments, needs to interact with and accept test requirements of the vendor or vendors that will manufacture the card. This invention describes the basic test requirements and capabilities in support of all aspects of making and using a MDC 110: in card manufacturing and test, in initial system debug and checkout, in field test and support, in card repair, etc.

The test capability described here is typically not intended to replace a multimillion-dollar test system, but to enable verification of correct operation of all components on the card and to support maintenance and debugging functions when needed.

Error Correction and Reliability Enhancement

Figure 3:
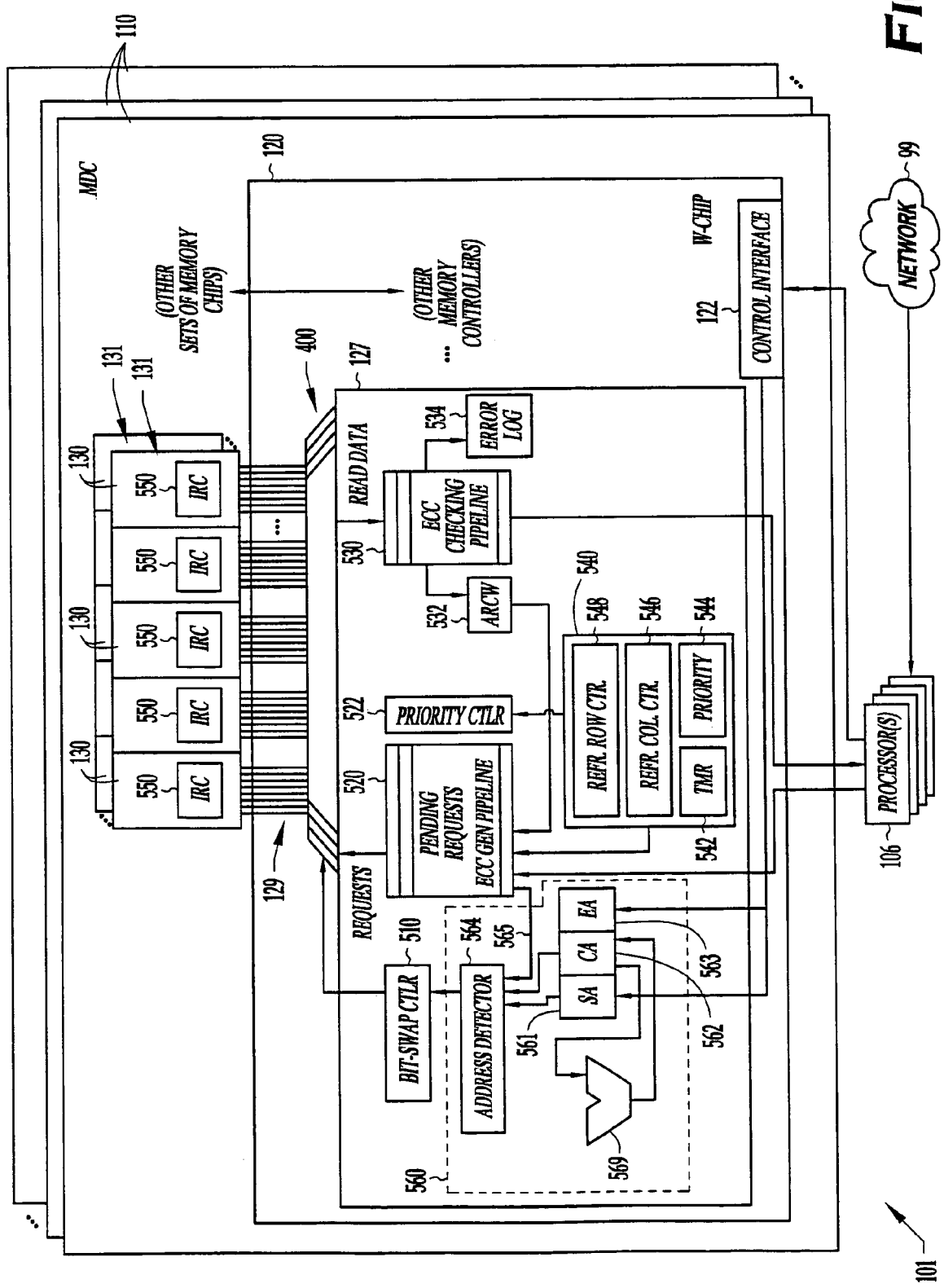
FIG. 3 is a block diagram of a computer system (node) 101 of some embodiments of the invention.

FIG. 3 is a block diagram of a computer system (having a single node 101) of some embodiments of the invention, showing some details of a memory controller 127. In some embodiments, each of one or more each memory daughter cards 110 includes a W-chip or circuit 120 that includes one or more memory controllers 127, each of which drives a plurality of memory parts (or chips) 130.

For example, in some embodiments, each memory controller 127 drives one or more sets 131 of chips 130, each set 131 having five DDR2 DRAM chips 130, each chip 130 having an eight-bit-wide data interface, for a total of forty (40) data bits going to and from each memory controller 127. Depending on the context, "set 131" is also referred to as "memory portion 131" that is connected to one memory controller 127 (for embodiments having a plurality of memory controllers 127 each having a memory portion 131), or as "memory 131" that is connected memory controller 127 (for embodiments having one memory controller 127 having a memory 131, wherein the memory portion is all of memory). In these embodiments, this provides 32 program data bits, 7 ECC data bits and one spare data bit. Other embodiments use other widths of data interfaces to the individual memory chips (e.g., 1-bit, 4-bit, 16-bit, 32-bit, or other width interfaces), and other numbers of program data bits (e.g., 64 or 128), ECC data bits (e.g., 8 or more), and/or spare data bits (e.g., 2 or more). In some embodiments, an ECC coding scheme is chosen to correct all single-bit errors and not only detect all two-bit errors, but also to detect many or all package-wide errors. (See, for example, U.S. Pat. No. 5,745,508 "ERROR-DETECTION CODE" by Thomas Prohofsky, which is incorporated herein by reference).

In some embodiments, a queue, buffer, or pipeline of pending requests 520 is provided that accepts read and write requests at high burst rates from the processor(s) and send requests to the memory parts 130 at a rate that can be handled by those parts, and in some embodiments, this pipeline 520 also generates the ECC check bits for the data being written. In some embodiments, an external refresh controller 540 is provided in the W-circuit 120, which inserts read-refresh requests into request pipeline 520, which also primarily holds the read and write requests from the processors 106. In some embodiments, external refresh controller 540 includes a refresh row counter 548 and a refresh column counter 546. The row counter 548 cycles through all the rows of the memory parts frequently enough to meet the refresh-frequency requirements of the memory parts, which frequency is sufficient to refresh the memory parts across all rows regardless of the value that is provided for the column address during the refresh-read request.

As used herein, a read-refresh mode of operation is one in which normal read-operation requests (called "read-refresh requests") are inserted into a stream of memory requests (for example, in some embodiments, these come from processors 106 and are held in pipeline 520), the read-refresh requests eventually specifying each and every row address in memory within the required refresh interval of the memory parts. In some embodiments, scrub operations are executed on each successive cycle of rows, by specifying and reading data from a different column address, and performing ECC checking. If a correctable data error is detected when reading, then the corrected data is written back to the affected location (a scrub operation). The read-refresh mode of operation is controlled by refresh controller 540.

In contrast, an explicit-refresh mode of operation is one in which the internal refresh function within the memory parts is invoked, typically by sending a refresh command rather than a normal read command. In some embodiments, the memory parts then go into a somewhat extended refresh mode that refreshes one or more internal banks and/or rows based on internal counters not visible to the external memory controller. In some embodiments, the explicit-refresh mode of operation is also controlled by refresh controller 540.

In some embodiments, a priority controller 522 is provided, wherein requests from processors 106 are typically given higher priority (and, in some embodiments, the processors 106 can specify a priority for each of their requests), and requests from the refresh controller 540 are typically given lower priority. However, if a lower-priority refresh request has been held off for too long a time, timer 542 and refresh-priority adjuster 544 specify to priority controller 522 to increase the priority of the old refresh requests, in order that the refresh-frequency requirements of the parts are met, and data are not lost.

In some embodiments, for read requests and read-refresh requests, the DRAM chips 130 are first sent (from memory controller 127) a row address using a subset of the address bits, which causes one entire row of data bits (e.g., 8,192 bits, in some embodiments) to be read into internal row latches. The DRAM chips 130 are then sent a column address (e.g., eight bits) that selects one set of, e.g., 32 bits selected from the 8,192 row bits. The selected 32 bits are then multiplexed to four successive sets of eight bits that are sent in a burst (i.e., four successive 8-bit bytes are sent from each of five chips 130, thus providing the memory controller four successive data words from each set of chips 130, each word having thirty-two program-data bits, seven ECC-data bits and one spare data bit, for example).

In some embodiments, ECC, refresh and scrubbing, and/or bit swapping, as described for the present invention, are implemented inside each memory chip 130. For example, in some embodiments, each row inside a memory chip further includes the ECC bits (e.g., 2048 ECC bits for 8192 data bits using a 32+7-bit data word, or 1024 ECC bits for 8192 data bits using a 64+8-bit data word) and/or spare bits. When a column address is sent, both data and ECC bits, and optionally spare bits (e.g., for a total of 40 bits, in some embodiments), are selected from the desired row, and are multiplexed to, e.g., five successive sets of eight bits, that are sent in a burst (e.g., five successive 8-bit bytes are sent from one chip 130, thus providing the memory controller four successive program-data bytes and one extra byte having seven ECC-data bits and one spare data bit, for example, or four successive 10-bit pieces could be output in other embodiments). Other embodiments could implement, e.g., 64 data bits, 8 ECC bits, and N spare bits (the external interface could burst, for example, nine 8-bit portions, eight 9-bit portions, or four 18-bit portions). Such embodiments (having any arbitrary number of data bits and a sufficient number of ECC bits for each address) allow some or all of the ECC checking and correction of block 530, the ARCW unit 532, the bit swapping of units 560 and 510, and/or the scrubbing and refresh functions of block 540 to be implemented inside each one of memory chips 130.

In modern memory technology, other data widths are available (4-bit wide data path, 8 (-bit wide data path (as described herein), 16-bit wide data path, and 32-bit wide data path). Before another reference is made to the same bank, the content of the associated row buffer is written to the same row location from which it was read. This accomplishes the refresh function and also saves any write data that was changed (written) in the row buffer.

This, and different page sizes (number of bits in a single row of a single bank), make the mapping of which memory bits are row and column selects more complex. In addition this affects the column multiplexer and also affects the distributed-refresh function (and therefore the other functions) in a computer's design.

The ECC circuitry in ECC-checking pipeline 530 is used to detect single- and double-bit (and certain multi-bit) errors and correct single-bit errors in each of the successive four words. In some embodiments, the four words are corrected (as needed) on the fly through pipeline 530, and four correct words are sent to the processors 106, if the read request was from the processors (read data 380 from read-refresh requests are discarded). In other embodiments, the four words are sent raw towards the processors in a pipeline, and if an error is detected, then a subsequent command tells the processor to hold or abort processing on the raw words and wait for corrected data to be sent.

In some embodiments, if an error is detected by ECC checking circuit 530 in any of the four words read, information identifying the location having the error, and other information regarding the error (such as the type of error, which bit had the error, etc.) is logged in a error-log buffer 534 on the W-circuit 120. In some embodiments, by the time the error is detected, one of a plurality of processors could have sent write data to the affected location, thus changing the data at the location. Thus, in such embodiments, it is undesirable for the memory controller to write the corrected version of the originally read data directly back to the memory-chip location, since it could overwrite newer data that was written by other sources in the meantime.

In some embodiments, at least a portion of the refresh function is also performed by refresh controller 540 scheduling normal read-refresh operations into queue 520, and also providing a scrubbing function (performing a correction and write back if an error was found in the read-refresh data). This also could cause problems if the memory controller 127 were to write the corrected version of the read-refresh data directly back to the memory-chip location, since it could overwrite newer data that was written by the processor(s) in the mean time.

Thus, one aspect of the invention is, if a correctable error is detected, for the atomic read-correct-write (ARCW) controller 532 of W-circuit 120 to insert, into the queue 520 of pending memory operations, a command that performs an atomic read-correct-write operation, wherein the affected section of memory is idled (the processors and other users of the memory are temporally locked out of performing operations there, and pending operations from the queue 520 for the requested memory bank are not allowed to issue until the ARCW completes), then the data from the affected location is again read, ECC circuit 530 is used to detect and possibly correct error(s) (since one or more further errors may have occurred since the first correctable error was detected, resulting in an uncorrectable double-bit error, or a processor could have written new data to the location, thus possibly eliminating the error, especially for bits having "soft" errors that go away when good data is written, in contrast to "hard" errors that remain stuck), and if corrected data is obtainable, it is written back to the affected location, and a log entry is made into error-log buffer 534.

In some embodiments, in each memory controller 127, the queue 520 is implemented as a buffer of pending memory requests connected to one or more inputs of an arbitration circuit that selects and issues which memory request is sent next to the section of memory 131 connected to that controller 127. The output of the arbitration circuit is connected to the section of memory 131, and includes the memory request that is issued to that portion of memory 131 for that memory controller 127. In some embodiments, the requests for read-refresh, explicit refresh (IN SOME EMBODI- MENTS, SIMPLY IMPLEMENTED BY A TIMER), and/or atomic read-correct-(optionally swapping bits)-and-write (ARCW) operations are placed in registers that also input to the arbitration circuit, such that the arbitration circuit can choose between a processor-sourced memory-request operation and a pending refresh (or ARCW) operation. Since the pending refresh requests are not in arbitrary locations in the buffer, but are instead in specific registers, the refresh controller 540 can access and increase their priority if too much time has passed, thus forcing the arbitration circuit to service those requests within the refresh interval required by the memory parts. Early in a given refresh interval, the arbitration circuit would select processor-source memory requests, and only if none of those were pending would the refresh request be issued. Later in the refresh interval, the priority of the refresh request is increased, and the arbitration circuit would immediately choose to issue the refresh request. In some embodiments, the priority of the ARCW operation to correct a single-bit ECC-correctable error could also be set at low priority initially (the arbitration circuit giving priority to processor-sourced memory requests at that time), and then later be set to a higher priority, in order that the error is corrected before a further bit error occurred at that location to making the error uncorrectable.

In some embodiments, the arbitration circuit of queue 520 will prevent a conflicting access from being issued, i.e., during the operation of an ARCW or other atomic operation to a portion of memory (e.g., one bank), other accesses to that portion of memory will be inhibited, but accesses to other portions of memory will be issued and performed. In some embodiments, each set 131 of memory chips 130 has a plurality of banks (e.g., in some embodiments, eight banks for each controller 127), so when an ARCW or atomic swap-bits operation is being performed to a location in one of the banks, other accesses to that bank are inhibited, but accesses to the other banks (e.g., the other seven banks) continue to be issued. In some embodiments, explicit refresh operations affect all banks for one memory-chip set 131, so explicit refreshes stop accesses to all banks, in contrast to read-refresh operations that affect only a single banks at a time and can be interleaved and arbitrated more efficiently, thus providing enhanced performance.

If the error was not correctable (i.e., from multiple-bit errors), a log entry is made indicating that (more severe) error. In some embodiments, the logged errors are accumulated and (possibly later) reported to the processor. In some embodiments, one or more further ARCW operations are performed to determine whether the error is a hard error (one that was not corrected by simply writing correct data to the location, as indicated by the same error being again detected) or a soft error (one that is corrected by simply writing correct data to the location, wherein no error is detected on subsequent reads), and the result of that determination is logged and possibly reported.

Once these operations are completed, the hold is removed from the affected section or bank, and operations from the processor(s) are allowed to resume (e.g., by such requests again being allowed from queue 520). In some embodiments, only requests for the memory bank whose data is being referenced are held (i.e., kept in the buffer and prevented from being sent to the memory parts), allowing normal memory references to occur to the other memory banks. In some embodiments, this comes at a cost of a more complex queuing and buffering implementation.

As used herein, an "atomic" (meaning "indivisible") read-correct-write (ARCW) operation is one in which, for at least the affected address, no other memory-access operation is allowed after the read portion and before the write portion. Some embodiments lock only the one location addressed by the ARCW but allow other read or write operations to access any other locations in memory since the ARCW operation need be only relatively atomic (atomic as to the location affected). Other embodiments lock the one section or bank of memory that includes the affected address and allow accesses to other sections or banks, and yet other embodiments lock larger portions or the entire memory for the duration of the ARCW operation. Thus, in some embodiments, an ARCW operation causes the queue 520 for only one memory controller 127 to be emptied (for example, in some embodiments, the pending operations are allowed to complete, but no other operations are accepted until the write portion of the operation commits to complete; e.g., the write operation with the corrected data could be in the queue with the highest priority, and then the queue could accept requests having a priority that would not pre-empt the atomic write portion, or the other operations could be made to wait until the operation finished.) This makes the ARCW "atomic" by locking out any requests for all addresses in that section or bank of memory connected to that particular memory controller 127. In other embodiments, the atomic ARCW locks out requests for only a subset of addresses in the affected section of memory, for example, only the single address that is to be touched by the ARCW operation, or only a row or other subset of addresses. Thus, to be "atomic," no other operations are allowed at least to the affected address, and in some embodiments, a larger number of addresses are affected in order to simplify the circuitry and control, for example, the atomic lockout could affect the entire section of memory chips attached to one memory controller 127, or to all the memory sections attached to one MDC 110.

In some embodiments, the ARCW function is relatively independent of whether a normal processor read request caused the memory reference that resulted in the detected error indication, or whether a read-refresh request caused the memory reference that resulted in the detected error indication, in that the same ARCW operation is performed and inserted into the stream of requests to a memory controller 127. Notice though that during a bit-swapping operation, the read operation is performed using the normal bit mapping, and the write operation is performed using the bit-swapped mapping.

In some embodiments, the bit-swapping operation is performed by logic that uses or shares the refresh circuitry. In some embodiments, when a bit-swapping operation is being done, no initial read-refresh operation is performed and only the ARCW operation portion is done at each successive address in the portion of memory that will be affected by the bit-swapped mapping, since the ARCW is refreshing the addresses it uses when row-sequencing is done fast enough to meet the refresh requirements of the memory parts, and since an ARCW operation will be scheduled regardless of whether an error is detected or not, then no regular read need be done. Since the ARCW operations are performed on the timetable required by the refresh circuitry, no separate read-refresh operation need be scheduled for the affected portion of memory though the timing requirements of Refresh will determine at least a portion of the address sequence.

While, in some embodiments such as those shown, the request queue 520, ECC checking pipeline 530, and refresh controller 540 are shown within memory controller 127, in other embodiments, they can be implemented externally within W-chip or circuit 120.

In some embodiments, the memory chips 130 also include an internal refresh controller (IRC) 550, each of which has its own row counter, since AutoRefresh is a standard feature of most current DRAMs. When memory chips 130 receives an explicit refresh command (which is separate and not related to the read-refresh requests discussed above), the chips 130 go into an internal refresh mode and refreshes one or more rows of memory bits in one or more of its banks. In some embodiments, this takes a relatively long time, during which regular read and write requests are locked out, resulting, e.g., in up to 2.2% overhead for explicit refresh. If the read-refresh request mode of operation takes less time than the explicit-refresh mode, then read-refresh mode can be used, and explicit refresh commands would not be sent and the internal refresh controller in the memory chips would not be used.

If, however, the read-refresh request mode of operation takes more time (i.e., costs a higher percentage overhead) than the explicit-refresh mode, then the read-refresh mode is used at a lower frequency (generally a much lower frequency) in order to scrub memory of soft single-bit errors, and explicit-refresh commands are sent and the memory chip's internal refresh controller is used. For example, if the read-refresh mode takes 3.6% overhead and the explicit-refresh mode take only 2.2% overhead, there is a performance gain by using the explicit-refresh mode at least part of the time, but at the cost of not as often performing the scrub operation that is included in the read-refresh mode of operation.

In some embodiments, a bit-swapping circuit 600 is provided, whereby if a bit in the memory data-bus interface 129 or in chips 130 is detected as faulty, failing, or questionable, that bit can be swapped out. In some embodiments, one of the processors 106 sends a command through control interface 122 to cause the swapping to occur, and specifies a range of addresses within which the bit will be swapped. In some embodiments, the starting address to swap is zero (such that starting address 561 can be assumed to be zero, simplifying the address compares that need to be performed, and increasing the possible speed) within a given section or bank of memory, and successive addresses (i.e., 0, 1, 2, . . . ) are swapped until all addresses within the entire bank or section of memory are handled. Having a zero starting address and a power-of-two size simplifies range checking. In other embodiments, a non-zero starting address can be specified, and/or a non-power-of-two size can be specified, in order to be able to handle differently swapped bits within a given memory space. Then, when a normal read or write access request is received, an address 565 from pipeline 520 is compared by address detector 564, and if it is found to be between a starting address 561 and a current address 562, then address detector 564 commands bit-swapping controller (also called the spare-bit replacement controller) 510 to shift all bits on one side of the failing bit, in order to use the spare bit and ignore the failing bit, as described below.

Some embodiments further include a background-replacement operation (in some embodiments, as part of the read-refresh mode of operation) that reads data from each successive location in an identified section of memory under the original bit allocation scheme, corrects the data if need be, and writes the data (as corrected) back to its location using the bit-shifted scheme that eliminates a failed or questionable bit and instead uses the spare bit. The ending address 563 is used by the system to specify the ending address for this series of individual swap operations, as described in FIG. 7 and FIG. 8. During this replacement process, the processor can continue sending memory requests to that affected section of memory, and the memory controller will map the bits to and from memory using the original bit mapping for the portion that has not been reallocated, and using the spare-bit-replacement bit mapping for the section of memory that has been reallocated with the spare bit.

Figure 4A:
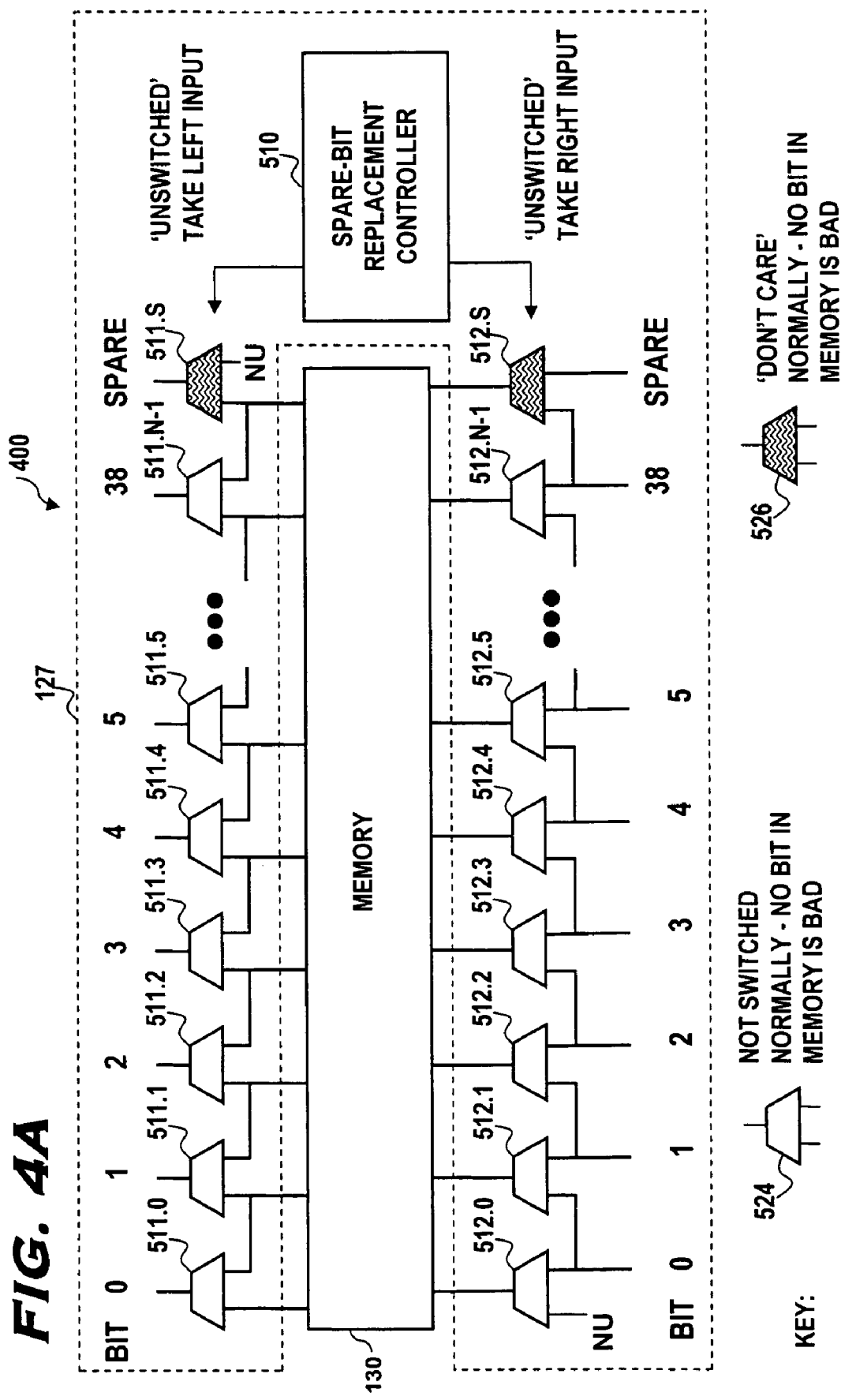
FIG. 4A is a block diagram of a non-activated bit-swapping circuit 400 of some embodiments of the invention.

FIG. 4A is a block diagram of a bit-swapping circuit 400 used by memory controller 127, used in conjunction with the address-range comparison circuitry (e.g., spare-bit replacement controller 510) in some embodiments of the invention, shown in its non-activated state. Bit-swapping circuit 400 includes a plurality of 2-bit to 1-bit read-data multiplexers 511 (i.e., 511.0, 511.1, 511.2, 511.3, 511.4, 511.5, and so on, through 511.N−1, and optional 511.S (which, in some embodiments, is included to make all the delays equal and to allow test reads from and writes to the spare bit)), which, in their "unswitched state" as shown have an output equal to their left-hand input, and in their "switched state" have an output equal to their right-hand input. Another plurality of 2-bit to 1-bit write-data multiplexers 512 are provided (i.e., 512.0, 512.1, 512.2, 512.3, 512.4, 512.5, through 512.N−1, and 512.S for the spare bit), which, in their "unswitched state" have an output equal to their right-hand input, and in their "switched state" have an output equal to their left-hand input. In the non-activated state shown in FIG. 4A, all multiplexers 511 and 512 are in their unswitched state 524, and will write the 39 data bits (numbered 0 through 38) to their normal bit positions, and will read the 39 data bits (numbered 0 through 38) from their normal bit positions. In some embodiments, the spare-bit position is written and read, along with the other memory bits, to better support memory testing, and to even the timing path lengths. In other embodiments, multiplexer 511.S and multiplexer 512.S are in "don't care" states (typically set to the unswitched state), and the spare bit is not used. Suppose, however, that bit 3 of memory is faulty (e.g., either stuck zero or one, or is often, repeatedly, or even occasionally giving soft or hard single-bit errors). In such a situation, one wants not to use bit 3, but instead to use the spare bit for reads and writes. (One understands that any of the other data bits can be replaced by the spare. Bit 3, used here, is only an example.)

FIG. 4B is a block diagram of an activated bit-swapping circuit 401 of some embodiments of the invention (i.e., the circuit of FIG. 4A, bit showing a configuration that is activated to swap bits). Rather than directly switching the spare bit and any arbitrary failed bit, the bits to one side of the failed bit are shifted one position, so that the bad bit is not used and the good spare bit is used. For example, if bit 3 failed, then on write operations source bits 0-2 are written to their normal positions by the multiplexers 512.0, 512.1, and 512.2 in their unswitched state 524, and source bit 3 and the bits to the right of bit 3 are shifted right one position by the multiplexers 512.3 through 512.N and 512.S in their switched state 525 (i.e., bit 3 gets written to memory bit-4 position, and source-bit 38 gets written to the memory spare-bit position). On read operations destination bits 0-2 are read from their normal memory positions by the multiplexers 511.0, 511.1, and 511.2 in their unswitched state 524 and destination bit 3 and the bits to the right of bit 3 are read and then shifted left one position by the multiplexers 511.3 through 511.N in their switched state 525 (i.e., bit 3 gets read from memory bit-4 position, and destination bit 38 gets read from the memory spare-bit position). While, in some embodiments, read multiplexer 511.S is omitted, since it is generally not switched, it is normally present so that path delays are equal and also to support of memory test functionality. Spare-bit replacement controller 510 can be switched from activated or deactivated, or from one active state to another, between each memory access (or each access burst of four words for some DRAM architectures), thus allowing a portion of the memory to be bit-swapped, and the remainder to be unswapped.

In some embodiments, the data from each location are moved from the unswapped bit configuration to the swapped bit configuration one at a time (for example, using an atomic read-correct-write operation that forms the core of the read-refresh mode of operation), while moving the range pointers as the operation proceeds, as described below.

Figure 5:
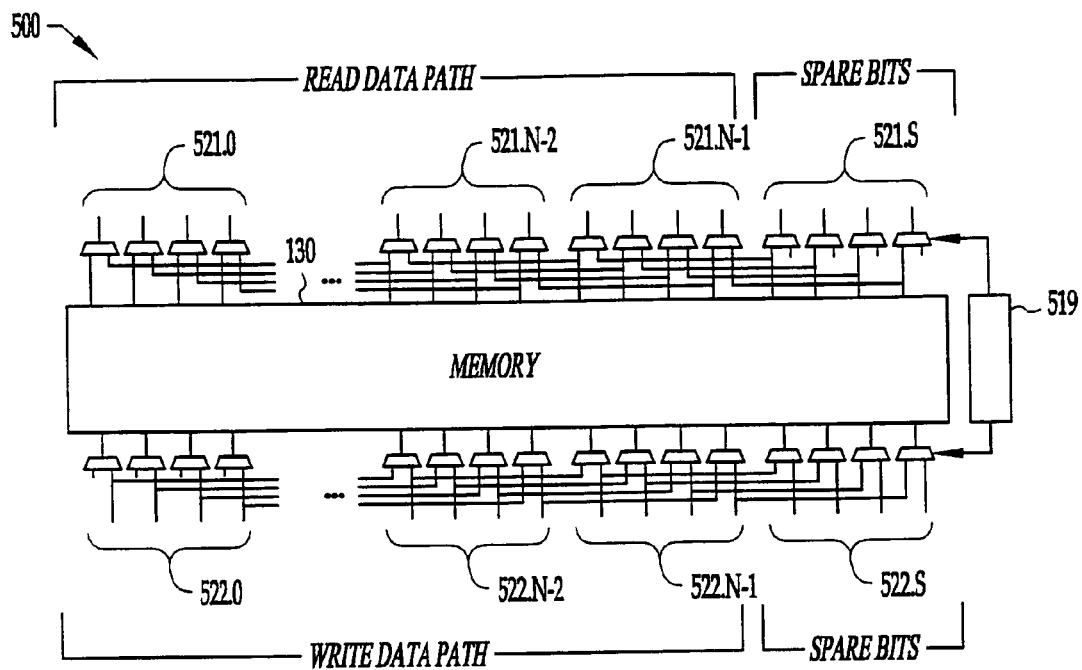
FIG. 5 is a block diagram of a multiple-bit-swapping circuit 500 of some embodiments of the invention.

FIG. 5 is a block diagram of a multiple-bit-swapping circuit 500 of some embodiments of the invention. Multiple-bit-swapping circuit 500 includes a plurality of groups of 2-bit to 1-bit read-data multiplexers 521 (i.e., 521.0, and so on, through 521.N-2, 521.N-1, and spare-bit group 521.S (which, in some embodiments, is included to make all the delays equal and to allow test reads from and writes to the spare bit)), which, in their "unswitched state" have an output equal to their left-hand input, and in their "switched state" have an output equal to their right-hand input. Another plurality of groups of 2-bit to 1-bit write-data multiplexers 522 are provided (i.e., 522.0, and so on through 522.N-2, 522.N-1, and 522.S for the group of spare bits), which, in their "unswitched state" have an output equal to their right-hand input, and in their "switched state" have an output equal to their left-hand input. In the non-activated state shown in FIG. 5, all multiplexer groups 521 and 522 are in their unswitched state 524 (see key of FIG. 4A), and will write the N groups of data bits (numbered 0 through N-1) to their normal bit positions, and will read the N groups data bits (numbered 0 through N-1) from their normal bit positions. In the embodiment shown, there are four spare bit positions provided, and if bits are swapped, the operation is done in groups of four bits. In other embodiments, other numbers of spare bits are provided. In some embodiments, the spare-bit positions are written and read, along with the other memory bits, to better support memory testing. In other embodiments, multiplexer 521.S and multiplexer 522.S are in "don't care" states (typically set to the unswitched state), and the spare bits are not used. Controller 519, like the corresponding controller 510 in FIG. 4A and FIG. 6, swaps the bits for addresses within a specified range, and does not swap the bits for addresses outside that range. In some embodiments, the blocks marked 400 and 510 in FIG. 3 and FIG. 6 is replaced by blocks 500 and 519 of FIG. 5.

Figure 6:
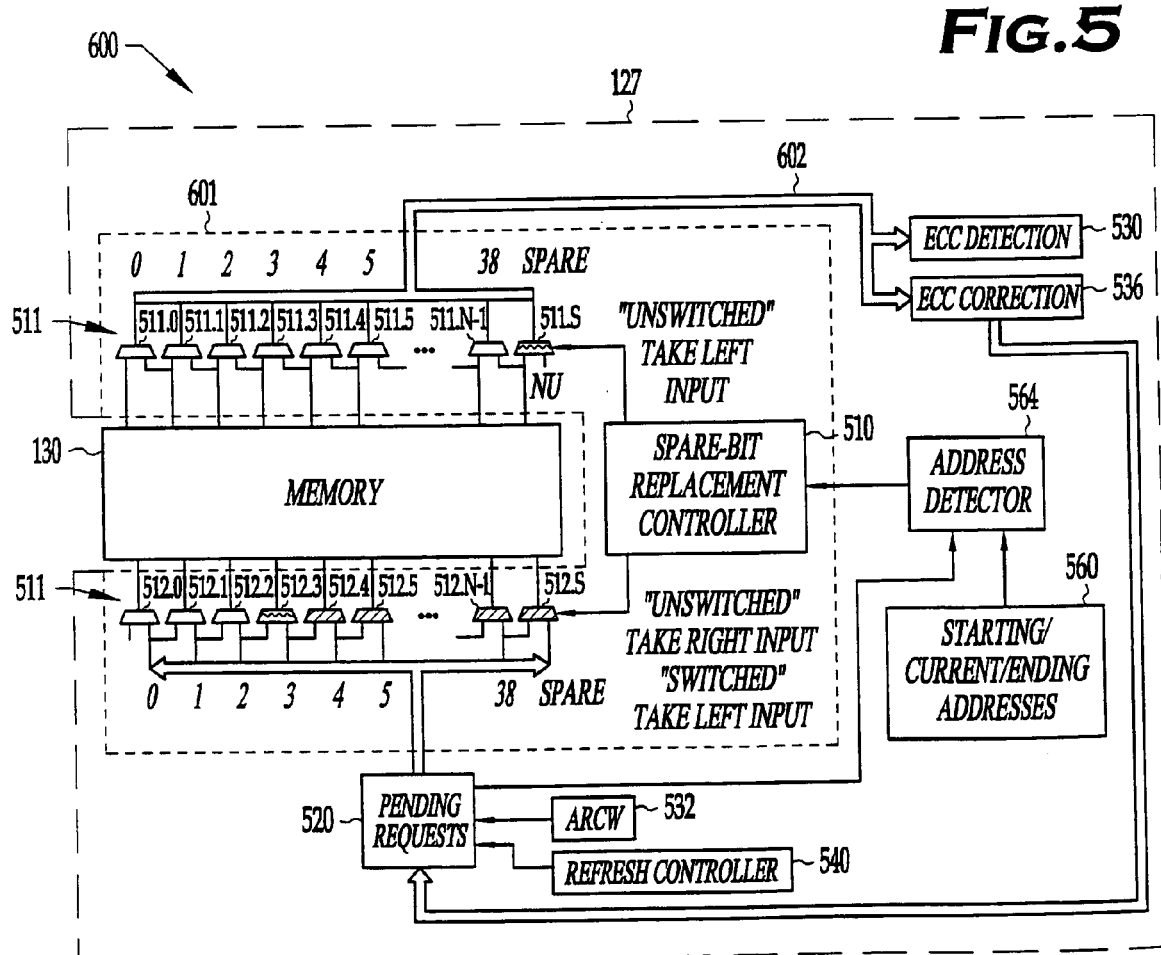
FIG. 6 is a block diagram of an address-range bit-swapping circuit 600 of some embodiments of the invention.

FIG. 6 is a block diagram of a bit-swapping and address-detection circuit 600 including the address-detection circuitry 564 from FIG. 3, connected to a bit-steering circuit 601, as used in some embodiments. Circuit 601 can be implemented as a single-bit swapping circuit 400/401 of FIG. 4A and FIG. 4B, or as a multiple-bit swapping circuit 500 of FIG. 5. The address-detection circuitry 564 of block 127 is described above for FIG. 3. An ARCW operation to swap one or more bits reads through the "unswitched" selectors 511 to obtain data 602 that is checked by ECC detection circuit 530 and corrected, if necessary, by correction circuit 536. The corrected data is then queued in buffer 520 and written back using the swapped configuration defined by selectors 512 and the spare bit of memory 131. In some embodiments, the address of the location to be swapped is just on the outside edge of the address range defined by registers 560 (the address for which swapping takes place) when the read operation takes place. The address range of registers 560 is then changed, so that the same address when used for writing the corrected data is just on the inside edge the address range defined by registers 560, and detected by circuit 564.

Figure 7:
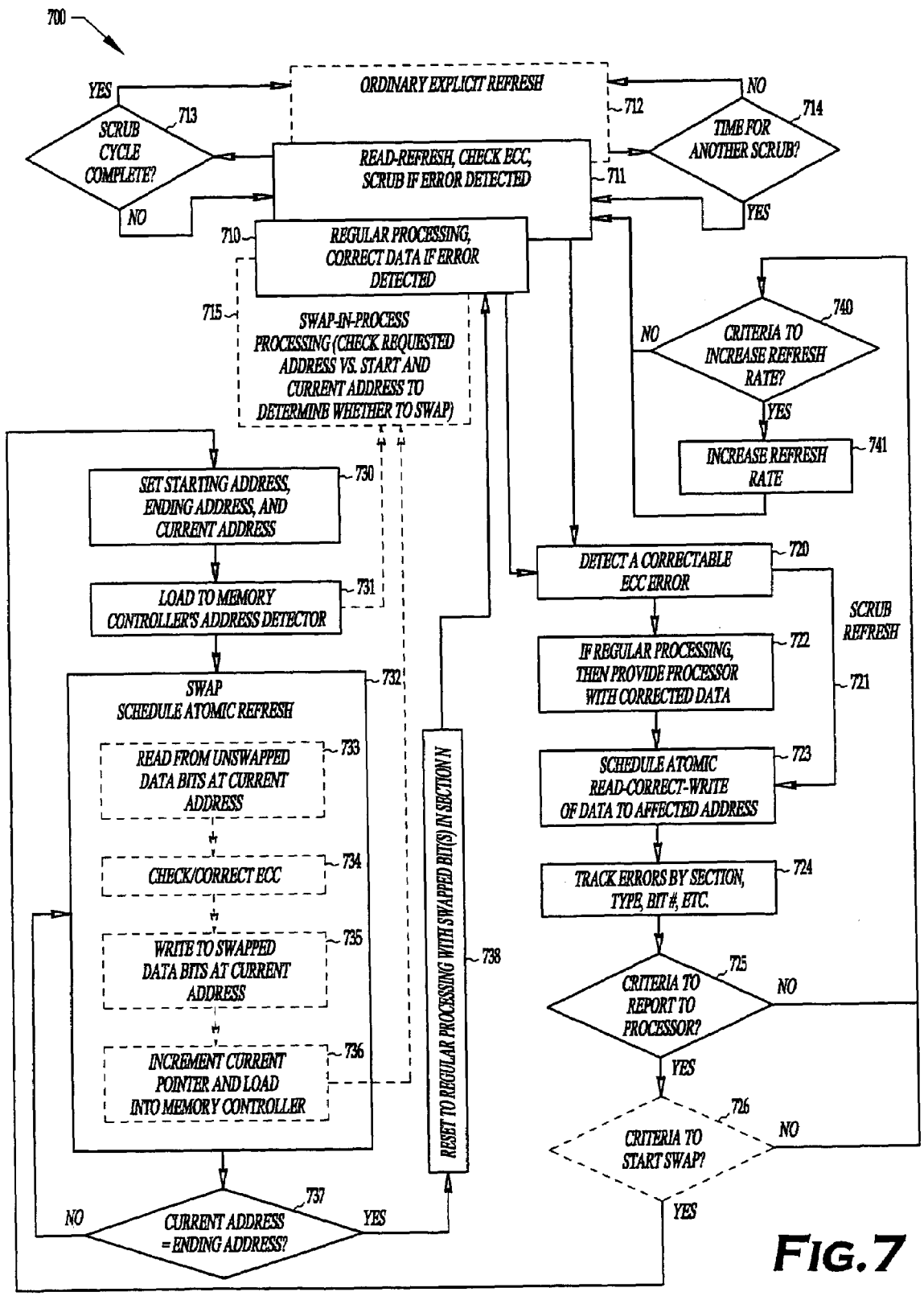
FIG. 7 is a flowchart block diagram of refresh/scrubbing/bit-swapping process 700 of some embodiments of the invention.

FIG. 7 is a flowchart block diagram of refresh/scrubbing/bit-swapping process 700 of some embodiments of the invention. Regular processing of read and write operations from processors 106 to MDCs 110 takes place at block 710, overlapped or multiplexed in time with read-refresh operations 711 and/or ordinary explicit-refresh operations 712. As discussed above, in some embodiments, if the read-refresh processing 711 takes less time or overhead, it is exclusively used for the refresh function; however, if it take less time or overhead to do the ordinary explicit-refresh function, using either a row address only from counter 548, or using a timer-controlled command that triggers an internal-refresh operation inside the memory chips 130 using internal-refresh controller 550 (see FIG. 3), then the refresh function is used for scrubbing and spare-bit insertion and will toggle between blocks 711 and 712. That is, explicit refresh block 712 will be used to save time (only if it is faster).

In some embodiments a mode bit is set at the time a system is brought into operation that controls this refresh-mode choice. When explicit refresh mode block 712 is used, some embodiments include a test at block 714 to determine whether it is time for another scrub operation, and if so perform a read and check ECC (i.e., block 714), and a scrub (ARCW) if an error is detected. At decision block 713, when a sufficient amount of memory is checked and scrubbed (e.g., in some embodiments, one location at a time is scrubbed), decision block 713 will return to the explicit refresh mode 712. That is, in some embodiments, when explicit refresh mode 712 is used, an additional scrubbing read will be occasionally performed, but is not relied on for refreshing since the explicit refresh is providing that function. In some embodiments, if the read-refresh mode 711 is faster, then the dotted-line blocks 712, 713, and 714 are not used.

In some embodiments, the refresh function of the present invention is managed as follows: memory controller 127 provides one or both of two memory-refresh control functions: using block 712, the memory parts 130 themselves can internally perform the refresh function, wherein, in some embodiments, each memory part 130 includes an internal address counter indicating where the next refresh is to occur (the refresh operation takes place generally after a specific command is sent from the local memory controller 127) or, alternatively, using block 711, the memory controller 127 sends "normal" memory references (i.e., read commands) to the attached memory parts 130 using a specific address ordering and request rate in order that all memory bits are referenced within the required refresh interval.

There are trade-offs in either way of doing memory refresh. Having each memory part perform its own refresh (block 712) has the advantage of simplicity—one command refreshes multiple banks in the memory chips—but the direct effects of the simplicity also have disadvantages: all the internal memory banks must be idle before starting a refresh cycle and a power transient is caused because all internal memory banks are started at the same time by the internal-refresh controller 550. The result is that memory performance is lost because of timing and functional requirements, and extra implementation costs are incurred (for example, more filter capacitors must support the memory than would otherwise be required).

If the refresh function is totally driven by the memory controller 127 (block 711), total memory performance can be increased (if that mode is faster) and design effort reduced, even though the total number of refresh operations per second is increased. Each memory-read reference only refreshes one memory row of one bank, so that more refresh references must be executed to reference all the memory banks, but these are interleaved in normal operations, so doing this does not cause any "extra" loss of memory cycles, as does the memory's "automatic" explicit-refresh function (block 712). Memory performance is increased because less total time is spent in the memory parts executing refresh functions. Controller-design effort is reduced because refresh timing is then the same as that for any other memory request. Electrical noise and power variations are also significantly reduced.

Memory Scrubbing for Increased Memory Reliability

Soft memory errors are generally handled by error-correction codes such as SECDED (single-bit error correction, double-bit error detection) and the like. Memory scrubbing has sometimes been used in conjunction with SECDED.

In some embodiments of the present invention, memory scrubbing occurs as part of the read-refresh mode of operation (block 711) that regularly reads all of memory row-by-row and thence column-by-column. If an error is detected (block 720), the logic then corrects single-bit errors. This prevents the accumulation of multiple single-bit upsets which then can cause multiple bits in a word (or whatever data item size is covered by the error-correction mechanism) to become upset and therefore become uncorrectable and be considered corrupt.

Figure 8:
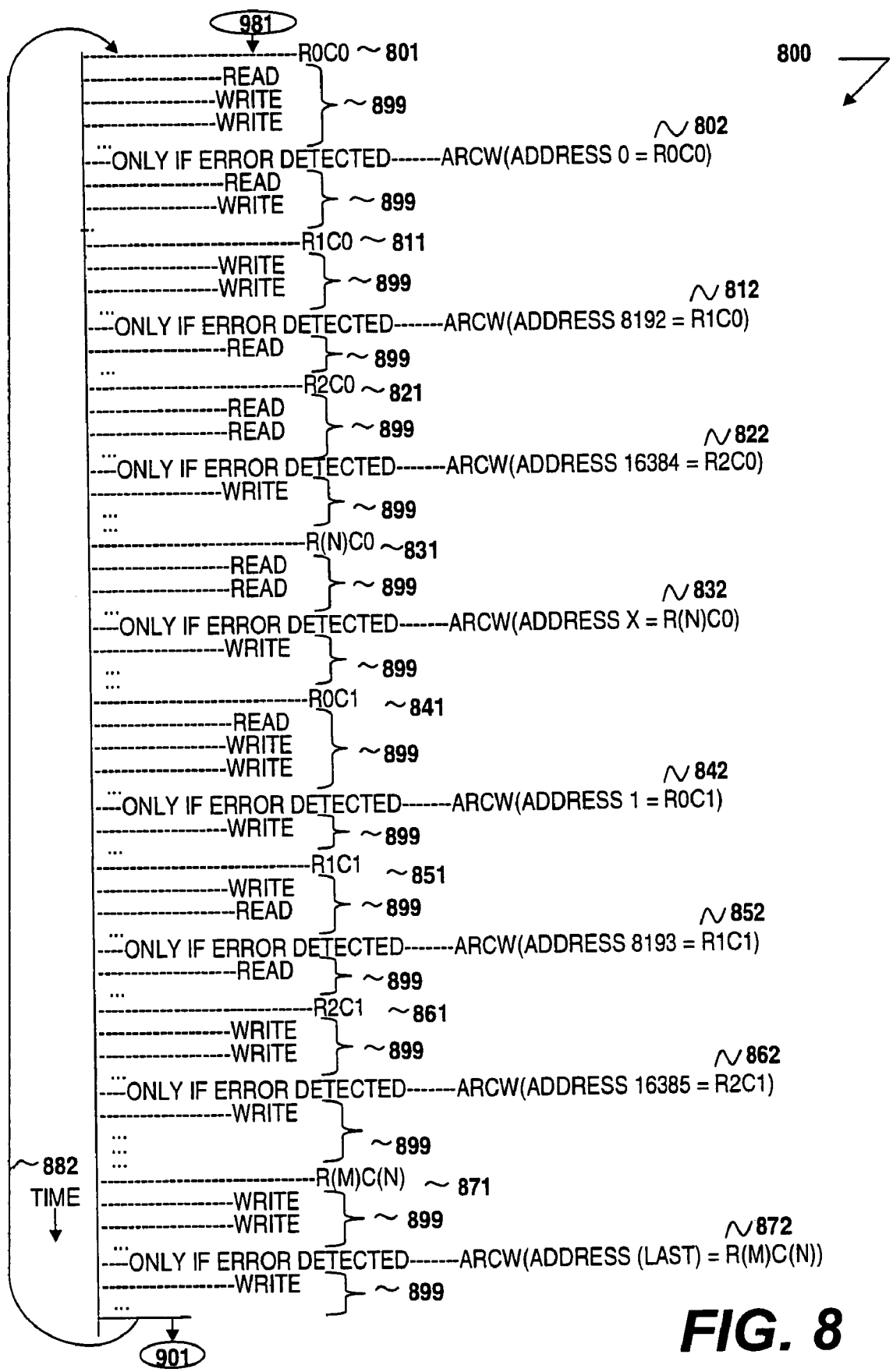
FIG. 8 is a schematic flowchart 800 used in some embodiments.

FIG. 8 shows a schematic timing chart 800 for read-refresh scrubbing used in some embodiments. For example, for the refresh function, in some embodiments, the data from row 0 column 0 is read 801, which refreshes row 0 and also allows the memory controller to check the ECC from that word of data (e.g., from address 0 in that section of memory), and the data is discarded. Normal read and write operations 899 from the processors then proceed. In some embodiments, if a normal read operation detects a correctable error (block 720 of FIG. 7), then a corrected version of the data is sent to the processor (block 722) and control passes to block 723, whereas if the error is detected as a result of a scrub refresh (path 721), the data is discarded and control passes to block 723. (Typically, about forty to one hundred or more normal operations can be done between refresh reads, giving a refresh overhead of about one to two-and-a-half percent, in some embodiments). If an ECC error is detected, an ARCW operation 802 (see FIG. 7 block 723) to address 0 is scheduled. At a later time (within the time period to allow all rows to be refreshed within the required refresh interval), row counter 548 (see FIG. 5) is incremented and the data from row 1 column 0 is read 811, which refreshes row 1 and checks the ECC from that word of data (e.g., from address 8,192 in that section of memory, if each row has 8,192 positions), and the data is discarded. Normal read and write operations 899 from the processors then proceed. If an ECC error is detected, an ARCW 812 (see FIG. 7 block 723) operation to address 8,192 is scheduled. At a later time, row counter 548 is incremented and the data from row 2 column 0 is read 821, which refreshes row 2 and checks the ECC from that word of data (e.g., from address 16,384 in that section of memory), and the data is discarded. If an ECC error is detected, an ARCW operation 822 (see FIG. 7 block 723) to address 16,384 is scheduled. This sequence is repeated until all rows have been refreshed and all data from column 0 has been scrubbed. At read 831, the last row (N) is read, and if needed, at ARCW 832, the data word is corrected. Row counter 548 then wraps back to zero.

Then, the column counter 549 is incremented, and the data from row 0 column 1 is read 841, which refreshes row 0 and checks the ECC from that word of data (e.g., from address 1 in that section of memory), and the data is discarded. If an ECC error is detected, an ARCW operation 842 (see FIG. 7 block 723) to address 1 is scheduled. At a later time (within the time period to allow all rows to be refreshed within the required refresh interval), the data from row 1 column 1 is read 851, which refreshes row 1 and checks the ECC from that word of data (e.g., from address 8,193 in that section of memory, if each row has 8192 positions), and the data is discarded. If an ECC error is detected, an ARCW operation 852 (see FIG. 7 block 723) to address 8,193 is scheduled. At a later time, the data from row 2 column 1 is read 861, which refreshes row 2 and checks the ECC from that word of data (e.g., from address 16,385 in that section of memory), and the data is discarded. If an ECC error is detected, an ARCW operation 862 (see FIG. 7 block 723) to address 16,385 is scheduled. This sequence is repeated until all rows have been refreshed and all data from column 1 have been scrubbed. This overall sequence is repeated until all data from all N rows and all M columns of this section of memory have been scrubbed. At read 871 the data from row (M) column (N) is read and checked, and if needed, at ARCW 872, the data word is corrected. At time 881, row counter 548 then wraps back to zero, and column counter 549 wraps back to zero. At point 881, control typically passes back to point 801; however, if bit swapping is desired, control passes to point 901 of FIG. 9, and when done, control passes to point 801 from point 981.

Figure 9:
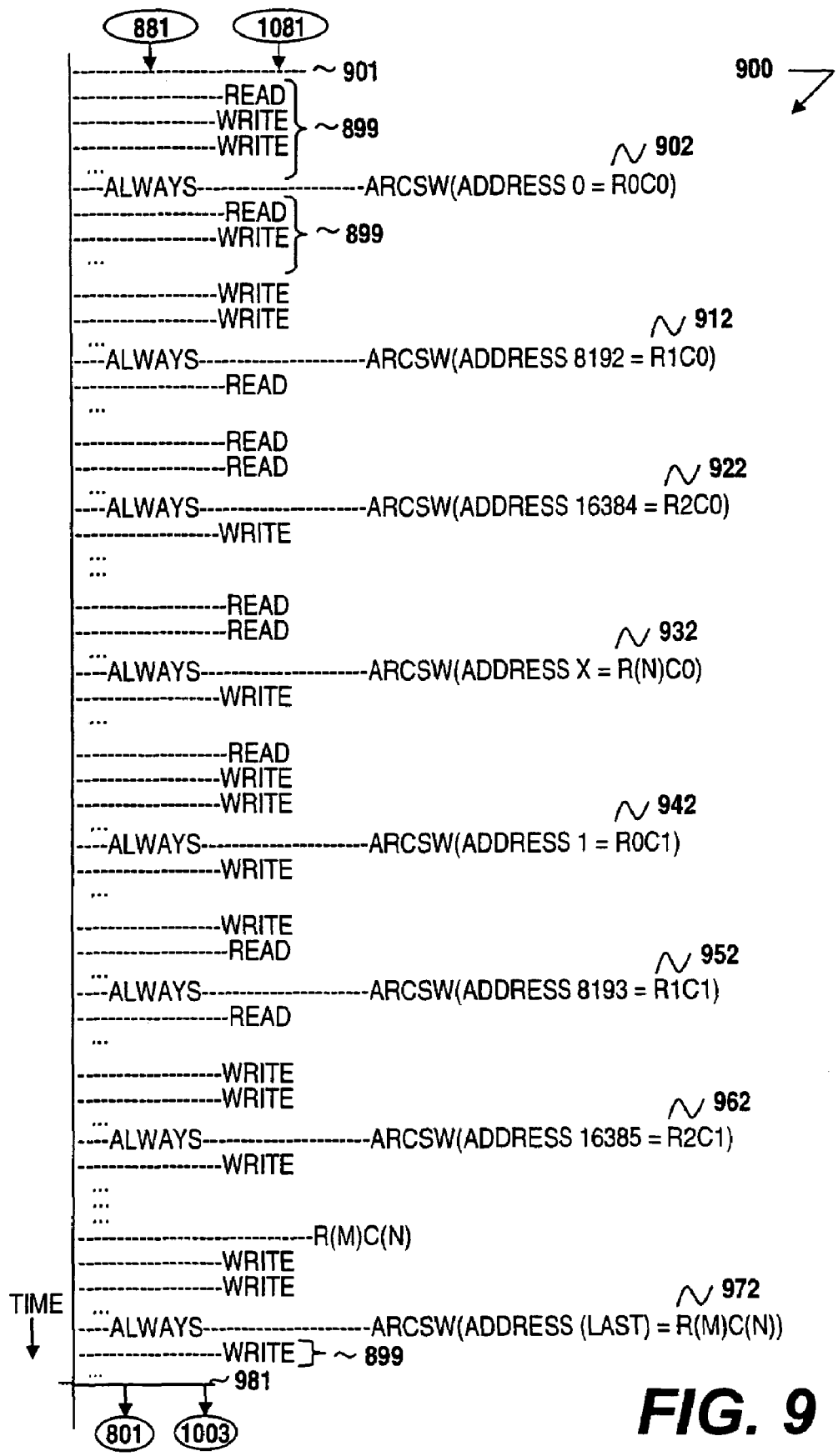
FIG. 9 is a schematic flowchart 900 used in some embodiments.

FIG. 9 shows a schematic timing chart 900 used in some embodiments. For the bit-swapping function, control would pass to entry point 901 from point 881 of FIG. 8, 1081 of FIG. 10, or directly as a result of an external maintenance function. In some embodiments, the data from row 0 column 0 is atomically read (using a first bit configuration), corrected, and written back (using a second bit configuration that swaps one or more bits) 902, which also refreshes row 0. The atomic-read-correct-swap-write (ARCSW) operations 902, 912, 922, 932, 942, 952, 962, and 972 will provide the refresh function and will be done for every location within the selected portion of memory for the swap operation. Normal read and write operations 899 from the processors proceed. The ARCSW operation 902 reads from the location using the normal bit mapping, corrects the data if need be, and then writes to the same location but using the bit-swapped mapping to store the data using the spare bit or bits. At a later time (within the time period to allow all rows to be refreshed within the required refresh interval), row counter 548 (see FIG. 5) is incremented and ARCSW 912 (see FIG. 7 block 723) operation to address 8,192 is scheduled. This sequence is repeated until all rows have been refreshed and all data from column 0 has been scrubbed and rewritten. At ARCSW 972, the data word from the last row (M) and the last column (N) is atomically read, corrected, swapped and written. Row counter 548 then wraps back to zero. In some embodiments, data is never read and discarded when doing the bit-swapping and spare-insertion operations.

Figure 10:
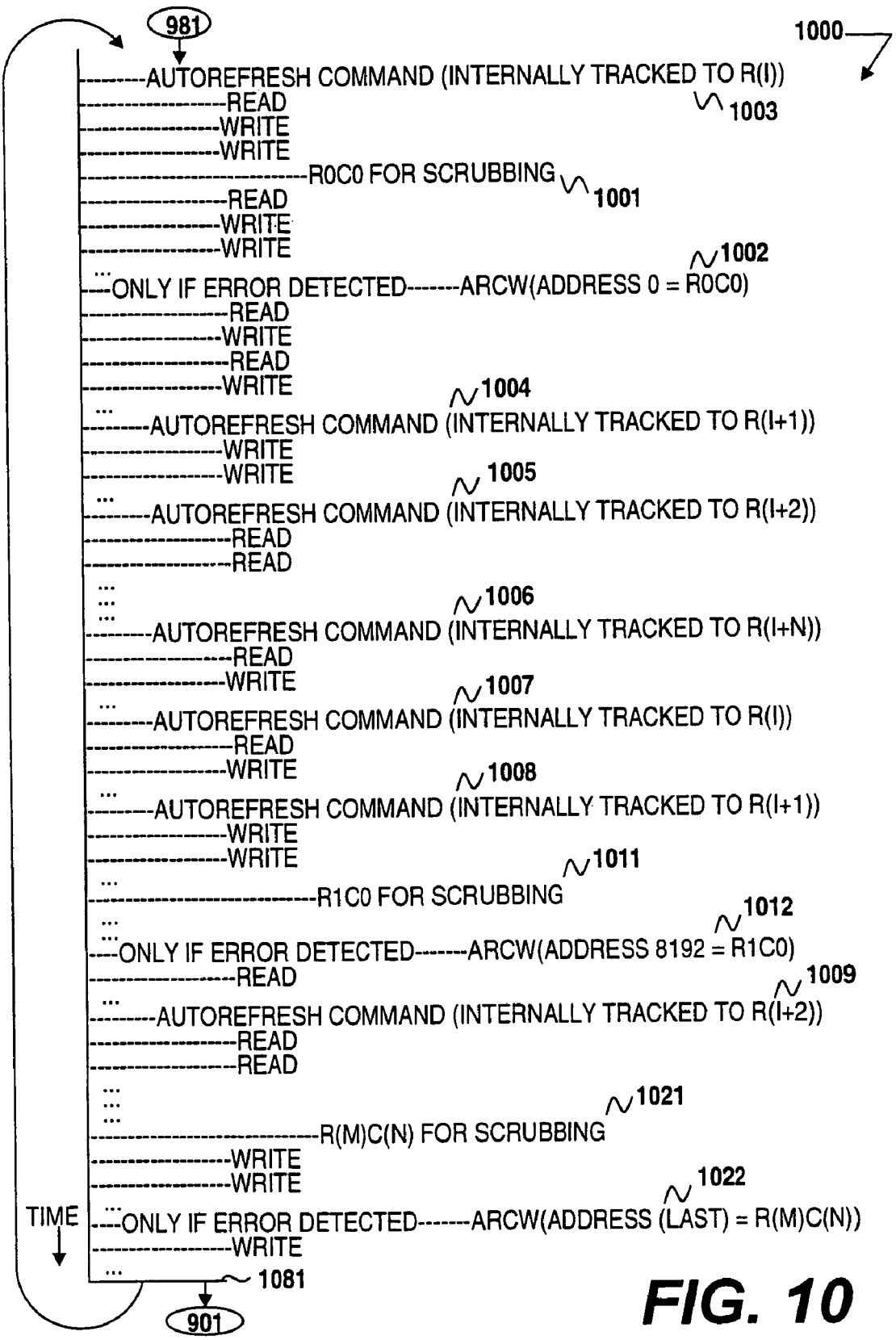
FIG. 10 is a schematic flowchart 1000 used in some embodiments.

FIG. 10 shows a schematic timing chart 1000 used in some embodiments. For example, control passes in from point 981 of FIG. 9, and an AutoRefresh command 1003 is sent to the memory parts, and in some embodiments, the data from one or more rows are internally read but not sent externally to the memory pins, which refreshes those row(s). An internal row counter in each memory part, not visible externally, chooses what rows are refreshed. At an infrequent interval (for example, in some embodiments, an interval sufficient to scrub all memory about once per hour), a read 1001 of row 0 column 0 is performed, and the controller 400 checks the ECC from that word of data (e.g., from address 0 in that section of memory), and the data is discarded. In some embodiments, Read operation 1001 is in addition to the AutoRefresh operations 1003, 1004, 1005, 1006, 1007, 1008 and 1009, and thus read 1001 is not utilized for its refresh capability, although it does refresh row 0 data. Normal read and write operations 899 from the processors then proceed. If an ECC error is detected, an ARCW operation 1002 (see FIG. 7 block 723) to address 0 is scheduled. Normal read and write operations 899 from the processors then again proceed, with AutoRefresh commands 1003, 1004, 1005, 1006, 1007, 1008 and 1009 being periodically issued. At a much later time (independent of the required refresh interval), row counter 548 (see FIG. 5) is incremented and the data from row 1 column 0 is read 1011, which refreshes row 1 and checks the ECC from that word of data (e.g., from address 8,192 in that section of memory, if each row has 8,192 positions), and the data is discarded. Normal read and write operations 899 from the processors then proceed. If an ECC error is detected, an ARCW 1012 (see FIG. 7 block 723) operation to address 8,192 is scheduled. This infrequent scrubbing continues until the data from row N column M is read 1021, which refreshes row N and checks the ECC from that word of data (e.g., from the last address in that section of memory), and the data is discarded. If an ECC error is detected, an ARCW operation 1022 (see FIG. 7 block 723) to that last address is scheduled. This sequence is repeated until all rows have been refreshed and all data from column 0 has been scrubbed.

This overall sequence is repeated until all data from all N rows and all M columns of this section of memory have been scrubbed. At read 1071 the data from row (N) column (N) is read and checked, and if needed, at ARCW 1072, the data word is corrected. At time 1081, row counter 548 then wraps back to zero, and column counter 549 wraps back to zero. At point 1081, control typically passes back to point 1001; however, if bit swapping is desired, control passes to point 901 of FIG. 9.

In some embodiments, the AutoRefresh function and the scrubbing/spare-bit functions will be totally independent so that there is little interaction except where, for example, the AutoRefresh function must idle memory so that AutoRefresh works correctly and as specified by the memory chip manufacturers.

Thus, if during regular processing (block 710 of FIG. 7) or read-refresh processing (block 711) an error is detected, and if the error is correctable by the ECC, then control is passed to block 720. If the error was from a read request from regular processing, at block 722 the corrected data is sent to the requesting processor, but for a scr5ub operation (path 721), the data is discarded. In either case, control then passes to block 723, and an atomic read-correct-write operation is scheduled, in which all other processors' requests and read-refresh requests are either held off from starting, or are completed, from queue or pipeline 520 (FIG. 3) and further requests are temporarily locked out, the read operation is performed, and the correct and write operations are done, and then the pipeline 520 is unlocked so it can accept and process all regular requests. In some embodiments only requests for the same bank, row or data word are held while non-conflicting requests are processed normally. In some embodiments, at block 724, information regarding the error is entered into log buffer 534 on the W-circuit 120, indicating such information as the section, address, bit number, and type of error, etc. At decision block 725, it is determined whether a sufficient number or severity of the tracked errors warrants reporting the errors recorded in log buffer 534 to one of the processors 106. If so, in some embodiments, at decision block 726 the processor analyzes the data and determines whether to start a swap operation, and if so, then control passes to block 730. In some embodiments, if either or both criteria from blocks 725 and 726 are not met, control passes back to the refresh or regular processing.

In some embodiments, error reports will enable or cause a swap sequence to be entered directly rather than have a hardware-determined number of errors occur before a swap sequence is set in motion.

In some embodiments, the generic memory-refresh function or functions are made more capable by providing that the refresh rate become variable, for example, as controlled through a control or mode register that is most often written as a system is powered up and configured. This accommodates differing refresh requirements caused by differing memory densities or other similar requirements and enables testing memory-refresh margins.

In some embodiments, if an analysis of the detected memory-bit errors shows a sufficient increase in the rate of errors in some or all of memory 130, a service call is made to fix the memory. In other embodiments, the refresh rate for the affected portion is temporarily increased during operation of the system, and a further analysis of subsequent error rates is made to see if the increased refresh frequency reduced the observed error rate. Thus, in some embodiments, an additional determination is made at optional decision block 740 as to whether to increase the refresh rate (for the read-refresh operation 711 or the explicit-refresh operation 712 or both), and if so, at block 741 the appropriate refresh rate or rates are increased. In some embodiments, the analysis for decision block 740 is also performed in one of the processors 106. In some embodiments, the analysis is performed at system boot-up and initialization, and/or during normal processing. An increased refresh rate might be indicated if the analysis showed that perhaps the refresh rate being used was affecting error rates.

Similarly, when AutoRefresh is being done, the rate of memory scrubbing can be variable.

Using Spare Bits to Enable Substantially Uninterrupted Continued Operation in Presence of Memory Failures If not all bits in a memory word are used for normal system operation, the unused bits, are available for use as spare bits to be swapped for other bits detected as faulty. Thus, if in a particular memory design, thirty-nine (39) bits of memory are required to be written and read with transfers to and from memory, and with memory parts normally available with 4-, 8-, or 16-bit data widths, an unused bit position in the data path is available if advantage can be made of its use. A 39-bit data path arises naturally when 32-bit data interfaces are used, as SECDED for 32 data bits takes a 7-bit checkbyte. In other embodiments, more than one spare bit is provided, such that if single-bit failures in the data path occur more than once, the other spare bits can also be swapped in.

A spare-bit capability is used to replace a defective or failing bit in a particular data path with another bit that, up to that point, was unused. The failure could be anything from a single stuck bit in memory to failing wiring nets, chip pins, or any similar failure that affects only a single data-bit path in a memory interface. FIG. 6 shows one possible implementation of a spare-bit capability in which the logic required to implement the function is relatively small and generally will have little to no effect on memory performance.

Other Extensions to Refresh

In some embodiments, since there is a relatively long time between successive refresh operations (whether in explicit-refresh mode 712 where refresh commands are sent to the memory parts, or in read-refresh mode 711, wherein each row and column is read in a sequence), the priority of the refresh requests generated by the memory controller 127 is made variable, and initially specified by refresh-priority circuit 544. Early in the range of times that a particular refresh operation must be done, the priority of the refresh request is set very low so that no memory request from the computer system is prevented from starting because a refresh operation that could have been postponed with no loss was initially scheduled (i.e., inserted to pipeline 520) ahead of the system request. As time within a refresh interval expires, the priority of the refresh request is raised by priority controller 522, or by refresh controller 540 determining that time is running out and seeing no completion indication from an earlier low-priority refresh request, then changing the refresh request's priority to a higher priority. In other embodiments, the controller could insert a duplicate but high-priority refresh request into pipeline 520 so that the refresh operation will have been done within the required refresh-interval time. Most embodiments avoid this duplicate request to avoid the performance penalty of performing two refreshes if only one is required.

Extensions to Scrubbing

Another function that data scrubbing and logging can provide is to enable the detection and swapping of 'stuck bits.' As the scrub logic passes through memory repeatedly, it keeps track, for example, by writing into error-log buffer 534, of the errors that have been found. If a memory data item is found and a repair attempted (by rewriting corrected data), the fact is recorded so that if the same error is again observed, the logic can detect that those errors are not soft recoverable errors but, instead, may be 'hard' stuck bits. The occurrence of stuck bits in memory greatly increases the chances for data corruption when using SECDED, because any soft error within the range of bits covered by each data checkbyte, in addition to the memory stuck bit, may be uncorrectable. (In some embodiments, additional error-recovery techniques are used, for example such as that described in U.S. Pat. No. 4,319,357 "DOUBLE ERROR CORRECTION USING SINGLE ERROR CORRECTING CODE" by Douglas Bossen, which is incorporated herein by reference.) The keeping of a failure history of block 724 is thus useful in its own right, for example by providing information such that analysis of blocks 725, 726, and/or 740, and needed maintenance—the dynamic swapping of bits of blocks 730-737 and/or increasing the refresh frequency, or even replacing memory components that have permanent faults or a significant number of transient errors—can be performed so that the chance of uncorrectable memory errors occurring is greatly reduced.

If it is decided at block 726 (or as a result of an external decision to perform maintenance) to swap a spare bit into a section of memory (e.g., swapping bits such that a failing bit, for example bit 3, is not used and the spare bit is used for each word in the entire section of memory), control is passed to block 730 of FIG. 7. At block 730, the starting address 561 (see FIG. 5) and ending address 563 of the affected section are set, defining the address range that will have its bits swapped. The current address 562 is initially set to equal the starting address 561, such that at the beginning, no addresses will have their bits swapped (since there would be no addresses between the starting address and current address at that time).

In some embodiments, the starting address is initially zero within a given bank or section of memory or within the memory controlled by one controller (or within the entire memory). The current address is then also set to zero. In some embodiments, this swap sequence starting from zero will be held off until the refresh/scrub cycle completes (i.e., wraps to zero), so that correct refresh timing is maintained for all of memory. The data from address zero is read using the normal bit mapping, and is then written back to address 0 using the new bit mapping (with the faulty bit not used and the spare bit used). The current address is then incremented, and the read-swap-write operation performed again, and the operation repeated through the address space for which a swap is desired. In other embodiments, the starting address need not be zero, such that arbitrarily bounded address ranges are used. In some embodiments, a plurality of address ranges can be specified, each having its own specification of which bit to swap. Some embodiments use the established refresh timing for spare-bit insertion, while other embodiments might use accelerated timing.

Note that the section size for the swap could include the entirety of addresses in one set 131 of chips (see FIG. 5) connected to one controller 127, or of all sets 131 connected to one memory controller 127, or a subset of addresses (for example, one bank, row, or column) within one set 131 of memory parts that the analysis of block 726 has determined should have its bits swapped. In some embodiments, all addresses within a given section are to have their data bit-swapped whenever any address is, to avoid a possible slowdown that could occur if only a subset of addresses is spared (since, in that case, the address compare function must always be active; this possibly slows normal operation.)

In some embodiments, at block 731, the starting and ending addresses are loaded into address detector 564, where they are used to compare to the address in each incoming request, in order to determine whether to swap bits for that request. For normal read and write accesses, control passes to block 715, so the "swap-in-progress" mode provides substantially uninterrupted normal processing, where each processor access has its address checked, and accesses to addresses outside the swapped range have their data bits mapped to the normal configuration, and accesses to addresses within the swapped range have their data bits swapped. Interspersed into the normal operations, there are scheduled occasional atomic read-correct-swap-write (ARCSW) operations (block 732). These include a read from the unswapped data bit configuration at the current address (block 733), a check and/or correct of any detected and correctable error (block 734), a bit-swap mapping and write of the data to the current address (block 735), and an increment of the current pointer (i.e., the pointer to the address at the edge of the swapped area, which is used for the next swap operation 732 and for the swap processing of normal memory accesses of block 715) at block 736. At decision block 737, a check is made to determine whether the swap operations have reached their specified end address, and if so, at block 738 some embodiments reset to normal regular processing with the swapped bit or bits used in the affected section N. In some embodiments, multiple simultaneous different swap mappings are permitted within a card 110, or within a single memory controller 127, or even within different banks or portions of memory 131 under control of one memory controller 127 by implementing sufficient pointers and compare and control circuitry. In some embodiments, multiple bits can be swapped within a single bank, using circuitry such as shown in FIG. 5.

Other Improvements Provided by Using Spare-bit Capability

Not only can a spare-bit capability be used to remove single stuck bits but in some cases the capability can be used for more general memory problems. For example, if a wire, pin or connector fails such that only a single bit fails for a data item from memory, then all data words can be seen to have the same error. The spare bit could be used to remove/hide the failure. Also, in a few cases there can be two failures in a data word. When covered with normal SECDED this is data corruption and the memory part with the failure must be replaced before system operation can be continued. The spare-bit capability can convert that case to a single-bit error which can be successfully hidden by SECDED.

In conventional implementations, the use of the spare bit would require that the system be restarted, because when the spare bit is 'inserted' into the memory path for use in normal system operation, the contents of memory are corrupted because the steering for the bit is swapped for all addresses simultaneously, but the data in the memory is in the original bit positions. In such instances, the best that can be done is to 1) stop system operation, 2) dump the memory contents to storage device or system, 3) insert the spare memory bit, and 4) reload memory from the saved storage. While a user can be grateful for continued operation with a relatively small downtime, they will be unhappy with the system interruption. Instead, a mechanism is provided with the present invention that allows normal system operation to continue while the spare-bit is inserted.

Aspects of Some Embodiments of the Invention

In some embodiments, a multipurpose function in the memory controller provides these desirable features (also discussed above):

A memory-refresh function that generates memory-read operations at specified rates. The rate should likely be established by a writable register so that different rates can be specified for different memory-chip densities or to margin test the memory as desired.

The refresh function can be implemented with a variable priority such that the refresh request is initially posted to the memory controller 127 as the lowest priority request. Only if the needed memory bank is idle and the memory chips' input/output (I/O) pins would otherwise be unused will the refresh-read operation be executed. After a certain amount of time passes, such that a particular refresh operation must take place so that another refresh operation can be scheduled to stay within refresh-timing requirements, will the priority of the refresh request be raised so that it takes place with certainty. After a refresh operation is done nothing need be done until the start of the next refresh interval, unless a data error is detected by the scrub-logic function or a spare-bit-insertion sequence is underway.

The refresh-read data returned by the refresh-generation function above checks the read data for errors. If a correctable error is found a memory read-modify-write sequence is started to fetch the same data again and to repair and rewrite the data back to memory. (Other embodiments can choose to directly rewrite the corrected data at the time the error is first detected. This saves a memory reference but will, in most instances, cause the loss of possible memory cycles according to the amount of time taken to check, repair and make ready to write the data read. Memory cycles can be lost because any write reference to the word being corrected must be held off. In some embodiments, preferably no reference to the respective memory bank is allowed while the scrub sequence is underway.) The preferred implementation allows normal requests to take place while the scrub logic is checking for errors, but then makes a new read request if an error is detected such that an atomic read-modify-write cycle is then needed. This takes additional time to perform a repair, but saves time in normal system operation.

The above read-correct-write sequence can be used to fix correctable data failures that occur due to normal system operations. When a system or non-refresh data item is found to contain a repairable data failure, the failing address is posted to the scrub logic such that the error is fixed in memory in addition to being corrected as the data is being returned to the requesting processor.

An error-history buffer 534. This buffer holds information about data failures observed over time. Different embodiments will likely specify different parameters here, but such information as the number of errors that have been observed, the type of error (single-bit, multi-bit, other types), the actual memory address, error syndrome, etc., are some of the kinds of information about data failures that can be usefully saved for use by higher-level error-control functions. The buffer is likely a FIFO (first-in, first-out) or circular buffer so that older failure information is overwritten by newer failures, but could be implemented to fill up according to its implementation, and stop accepting new information until the older data is dumped to a higher-level system or the buffer is cleared/reset. The error history buffer can be used to calculate the rate of soft errors, the rate of hard or multiple errors or for other useful purposes. An example of the use of the error-history buffer is to notify the operating system (OS) of memory errors but not to overwhelm the OS (by constant interrupts at a high rate). In some embodiments, the controller is designed so as to generate, for example, an interrupt indication the first two times that a particular memory address has a data failure. The second interrupt serves to tell the OS that the error has repeated and so likely needs maintenance. The logic can read the contents of the memory buffer and, if the number of errors associated with a particular failure is greater than two, not generate an interrupt. The parameters here can be fixed or possibly variable using internal software-writable registers (Memory-Mapped Registers (MMRs), for example, that are writable by the OS and maintenance functions).

With a little support in the refresh-scrub function, spare-bit-insertion capability in real-time with continued normal operation can be implemented. The controller is given a bit position to insert the spare bit and performs the following procedure:

a. Start the spare-bit insertion when the refresh counter rolls over to row 0 and column 0 (lowest address in memory). Logic can be added if desired such that an insertion sequence can start immediately, but that should not generally be needed as system operation is continuing before the insertion sequence is started and while it is underway. Read memory for the refresh-and-scrub operation in the normal way at the specified addresses, using the normal timing.

b. As each scrub-read data item is returned from memory, check for errors, but in addition, always perform a write operation but using the spare bit in the data path according to the spare-bit position register. (Some embodiments will need to hold off memory requests for the requested bank number, or bank and row number, in order to maintain memory consistency.) As proper memory data is used when writing with the spare-bit inserted, the contents of memory are correct as long as they are always read with the position of the spare bit being taken into account.

c. As time proceeds and the refresh sequence is making its way through memory, all addresses from address zero to the current refresh address have the spare bit inserted and all addresses past that point to the last address in memory do not have the spare bit inserted. When a normal memory reference is made, the requested address is compared with the contents of the refresh counter. If the requested address is equal-to or less than the refresh counter, the data path is organized so that the spare bit is used; if the address is greater than the counter, the data path is used without the spare-bit inserted in the path. Note this assumes starting from address zero, which is not the case in some other embodiments. Some embodiments will need to modify the address-compare logic depending on whether or not memory row or column bits are more significant address bits.

d. When the last location in memory is refreshed, all memory has the spare bit and the comparison with the refresh counter is discontinued. Normal refresh-scrub operations are resumed, using the data path with the spare-bit inserted in the identified position (to do this, in some embodiments, each of the bits starting at the identified position is shifted on position, so the spare bit is used and the identified position is not used).

Overview of MDC 110

In some embodiments, MDC 110 includes two major kinds of components: a single ASIC (a very-large-scale application-specific integrated circuit), here denoted as the W-chip 120 (other embodiments include a plurality of chips that together provide the function for such a W-circuit 120), and a plurality of (e.g., twenty, in some embodiments) DDR2 (double-data-rate type two) memory-chip groups 130 (or, in other embodiments, other types or mixes of types of memory components 130). In some embodiments, there are multiple less-complex components, generally capacitors.

Clock signals 222 (there are two required, in some embodiments) are supplied through the card connector using differential signaling.

As shown in FIG. 1A, a block diagram of MDC 110, and in FIG. 3, which shows a diagram of the W-circuit internals, the W-circuit 120 has several functions that include:

(a)► Four DDR2 memory controllers 127 supporting 333/667 MHz data rates to the memory. In the computer system 100 architecture each controller 127 and its associated memory components 130 is known as a memory subsection.

(b)► Four high-speed (e.g., five- to eight-GHz signal rates, for some embodiments) interface ports 121 using differential signalling that support full duplex operation. All normal references, commands and data go through these ports 121. In some embodiments, the nominal/expected data rate is 5.6 Gbps, or in other embodiments, other multi-GigaHertz speeds. In some embodiments, each port can have two or more parallel paths for increased data throughput.

(c)► In some embodiments, 512 K Bytes of L3 cache 124 implemented in four blocks (called quadrants) of 128 Kbytes each. Each quadrant is associated with one of the subsection memory controllers 127 such that the controller handles all 'miss' traffic for that cache block. Within the cache logic are functions that support data sharing and coherency for data in the cache and in higher level (L1, L2) caches of the processors connected to the interface ports 121.

(d)► A 4-by-4 crossbar 123 that connects the four high-speed ports 121 to the cache quadrants 124 and respective memory subsections (each having a memory controller 127 and its memory chips 130).

(e)► A test engine 125 that generates tests for the memory subsections and for the other paths and functions of MDC 110/W-circuit 120. Test engine 125 can check read data and capture some read-data results. Test engine 125, along with other test and maintenance features designed into the logic, make for a fairly complete and standalone test capability.

In some embodiments, each DRAM controller 127 drives five memory parts 130, each being eight-bits wide (a 40-bit data interface). In some embodiments, a second rank of five parts 130 is also supported. In other embodiments, multiple ranks of chips are provided, with a separate chip-select signal per rank. This needs only one additional chip-select signal output from each memory controller 127 for each memory rank in the chip-group stacks since, if the two-rank capability is implemented, memory chips are, in some embodiments, connected as five stacks of two memory parts each with almost all pins shared in each stack.

In operation, such a 40-bit data interface is used as 32 data bits, seven SECDED-checkbyte bits and an active spare bit.

In addition, two MDCs 110 can be connected together such that one MDC 110 can be used to provide test data and test sequences for the other MDC 110.

In some embodiments, the W-circuit test engine 125, other maintenance functions, and other status and control aspects of MDC 110 and W-circuit 120 are accessed through a JTAG port 122 (Joint Test Action Group, IEEE Std. 1149.1) that is available at the card connector pins. In other embodiments, a Firewire channel is provided and connected as the external interface to the MDC 110, and is internally connected to the JTAG control interface 122.

In some embodiments, each DRAM controller 127 drives five memory parts 130, each being eight-bits wide, and thus has a 40-bit data interface. In some embodiments, a second rank of five parts 130 is also supported. In other embodiments, multiple ranks of chips are provided, with a separate chip select per rank. This needs only one additional chip-select signal output from each memory controller 127 for each memory rank in the chip-group stacks since, if the two-rank capability is implemented, memory chips are, in some embodiments, connected as five stacks of two memory parts each with almost all pins shared in each stack.

In operation, each 40-bit data interface is used as thirty-two data bits, seven SECDED (single-bit error correction, double-bit error detection) checkbyte bits and an active spare bit. When being tested, memory can be accessed like that or alternatively or additionally can be exercised as a simple 40-bit interface.

Test Overview

A basic feature for the test design of MDC 110 is that the card is testable with almost no support needed externally, except for connection to a controlling JTAG (or Firewire or other similar or suitable channel) interface, two clock sources, and some routing on the connector that provides power in addition to connections to the clocks and maintenance wiring, at a minimum. In an MDC 110 testing environment, wiring for interface port loopback tests should be provided, for example as shown in FIG. 2B. In some embodiments, the SerDes interface logic is largely self-testing as is shown in FIG. 2D. The W-circuit Test Engine (WTE) 125 provides for complete testability of the all chip functions (including the SerDes interfaces if needed) but the L3 cache, the memory subsections, and the remainder of the chip have significant built-in functional checking that is very useful in MDC 110 testing. For example, in some embodiments, both the cache and the memory subsections have SECDED data checking, the cache-coherency logic flags erroneous sequences, etc.

The test design will also support using one MDC 110 to test another. Doing this means a more complex test fixture in order to have the pair of cards connected together, for example as shown in FIG. 2A. The result is that memory cards are testable without the need to interface a logic or memory tester to the high-speed ports 121. This operation mode still requires use of the JTAG interfaces of both cards to control and status the test operations. When the cards are connected together, data on one card is used to test the other. In some embodiments, the card-to-card test will stress full memory bandwidth.

Software support is required to drive the JTAG interface and to make use of the test capabilities of the card. In some embodiments, an interface is provided between a standard channel such as Firewire, IEEE Std. 1394 and the JTAG pins of W-circuit 120 because a connection is required to a maintenance or control processor 220 will, in some embodiments, require the interface chip for operation and maintenance of computer system 100.

In some embodiments, loopback connections for the high-speed ports 121 using the test fixture enable the ports 121 to be tested at full data rates without test or tester connections to the ports 121. The port interface transmitters and receivers automatically synchronize together and then pass test data back and forth as part of each port's initialization sequence, indicating that each port is ready for use. In addition, the WTE can generate and receive test operands for the interface ports 121 using the test fixture's loopback wiring. These tests can use test-specified or pseudo-random data patterns. The same test sequences can be done using an internal loopback capability at each port's IO pads (See FIG. 2D) but that does not exercise that portion of the board wiring or edge connector pins.

In some embodiments, the WTE is a basic microcode sequencer that is designed to generate requests and accept responses from the internal logic and memory functions and can check the returned data. The sequencer is loaded with tests consisting of commands, address sequences (including looping capabilities), test data and expected result data according to the needs of the test to be performed. The test engine 125 is very flexible so that a diagnostic or test engineer can directly specify needed test functions and sequences. Test sequences of almost unlimited lengths can be generated.

In some embodiments, the test data width is controllable so that data functions with and without accompanying SECDED ECC can be tested easily. The WTE also can generate tests with pseudo-random numbers and check the results of tests using that data. The number of different test-data operands and expected-data results are typically bound by buffer size limits.

The L3 cache can be tested specifically by the test engine 125 and can be used to help test the DRAM memory subsections. When testing the subsections, test data can be placed into the cache through the JTAG port or can be written to the cache by the WTE. A test sequence in the WTE can then generate requests to the cache that cause cache data to be written to the subsection memory. Subsequent WTE requests can cause that data to be read and checked. The benefit of doing this, as the cache is small with respect to the memory in each subsection, is that full memory bandwidths can be generated so as to check for data and timing interactions and for other transient issues.

Each of the logic functions in W-circuit 120 chip has several associated MMRs (Memory Mapped Registers). The registers control and configure the respective logic. Also, if a function has status (such as a memory controller 127 provides information on SECDED errors), that information is recorded in local MMRs. All MMRs can be accessed and controlled through the JTAG interface.

Some errors detected by normal logic functions can indicate the need for support, recovery or reconfiguration by the operating system or maintenance processor, for those cases data packets can be generated by the normal logic functions that become interrupt requests in normal system operation and can provide expected interaction that helps verify correct operation of MDC 110 functions. All interrupts can be enabled and disabled by setting control bits in MMRs.

In normal use, system data paths are 64 data-bits wide and are considered as having a single 8-byte data item or two 32-bit data items. At the memory, the data path is 40-bits wide to support 32-bit data items, ECC (the error correction code data) and the spare-memory-bit path. In some embodiments, in order to enable full testing of the memory chips, all needed paths in W-circuit 120 support 40- and 80-bit data widths.

Of course the high-speed processor ports 121 are narrower—four bits in each direction for some embodiments. However, the SerDes assembly/disassembly process allows for interface data packet elements (called flits in packet parlance) to support data that is 32- and 64-bits wide. In addition, the interface supports 40-bit wide data elements in test mode, in which 40 of the 64-bit data items hold test data.

Functions of the Memory Controllers 127 that Affect Test and Maintenance

A simplification for some embodiments of the controller 127 is that individual byte-enables are not used. For those cases, at each data strobe, all 40 data bits are used or they are all skipped. Also, in some embodiments, there are no power-down or sleep modes supported in memory and there are no chip self- or auto-refresh functions. Each controller 127 generates distributed refresh functions using normal memory references and uses the returned data to accomplish background memory scrubbing. (If the refresh data has an error, a memory write cycle is scheduled to put correct data back in memory, if that is possible for those embodiments.)

For some embodiments, each memory controller 127 can only accept memory requests that result in 16-byte/burst-of-four or 32-byte/burst-of-eight data transfers to/from memory. All references close the banks in the memory parts at the completion of that operation for those embodiments. In some embodiments, there is one maintenance case where one MDC 110 is being used to source test sequences to another card in which whole rows from the memory banks are transferred. This function is typically not used in normal system operation.

The same logic that detects and fixes data being scrubbed can be used to rewrite correct data back to memory when a correctable error occurs during normal user operation, in some embodiments. (Most systems using SECDED or more powerful error correction schemes fix the data being returned to a user but leave the data bad in memory. This can accumulate soft errors in memory and result in multi-bit, uncorrectable errors.)

For some embodiments, each controller has 7-bit SECDED and an active spare bit along with the normal data path of 32 bits. In test mode either 32-bit (letting the controller control the other eight bits), or 40-bit data can be written and read. In 32-bit mode, checkbytes are generated and checked and the position of a data bit to be replaced by the spare data-bit can be specified. The WTE can exercise and test this logic.

For some embodiments, each controller is designed to maximize memory bandwidth by allowing memory requests to go out of order and by grouping read and write operations such that bus turn-around losses are reduced. The reordering takes place with respect to the memory banks of the memory chips so that multiple requests for the same bank stay in order. If the oldest request is for bank 0, but that bank is busy, use a following request to start another memory operation for a bank that is not busy. The reordering function can not be turned off in some embodiments, but can be controlled and used by specifying what address sequences are generated when generating address sequences for testing. The test engine 125 can check returned data without being dependent on data ordering. Each memory request has a transaction identifier (TID) that is used to establish correspondence between particular requests and data being returned in response to the requests by returning the TID with the corresponding returned data items.

Each controller can be driven directly from the JTAG interface for a more direct memory access though this capability does not support test at high data rate (in some embodiments, four MBytes/sec or so).

The spare bit capability mentioned above allows an otherwise unused bit in the data path to memory to substitute for any of the other bits. Thus the memory interface is functionally 39 bits wide and the 40th bit can be used in place of any of the other 39. It is expected that the spare will generally be used to avoid 'stuck' bits in memory though it is also useful for some failures like broken nets and pins and similar faults.

In some embodiments, there is a 'memory degrade' option that allows system operation to be restarted in the presence of failing memory components. When the degrade option is activated, two of the four memory controllers 127 support all four L3 cache quadrants. The degrade option allows either the even or odd numbered controllers to be used, with the other pair idled. This reduces the memory size and the memory bandwidth by half but allows users to continue to use the processors whose associated memory has failures. The degrade paths must be tested as part of the verification testing of MDC 110.

The controller design supports multiple memory-chip densities and various memory timing and functional variations, in some embodiments. These functions and modes are controlled by on-chip registers and can be exercised and tested by the test engine as desired. The memory controller, in some embodiments, also supports multiple different kinds of atomic memory operations (AMOs) like add-to-memory functions for example. These read-modify-write functions can also be exercised and tested by the test engine 125.

Test and Maintenance Functions of the Processor Ports 121

In some embodiments, when a SerDes receiver (SerDes-in 341 portion of a port 121) is powered up or when the receiver loses link synchronization, the receiver automatically goes into a 'training' mode where it expects to receive a timing sequence so that clock and frame sync can be established or recovered. When the output logic of a SerDes port 121 is initialized, each bit-serial driver puts out a data sequence that enables the corresponding receive logic to acquire both clock and frame synchronization. After the frame-sync interval, a test-data sequence is generated and processed to verify each link's functionality. If that sequence is done correctly the receiver becomes ready to accept normal data traffic.

In order for things to remain in sync, each output constantly sends data packets. If there is no port information to be transmitted at the time each packet is sent, a null packet is formed and transmitted. Status in both the transmitter and receiver indicate how things are going. This means that, for example, if a net or connector breaks, reading the status MMR of the receiver indicates that the receiver has dropped out of clock sync and is not detecting any input.

In normal use data is 'packetized' to enable detection and recovery from errors. Each packet has ECC for data checking and has a packet ID so that error packets can be identified. As packets are received the ECC is checked. If all packets in a frame are received correctly, an acknowledgement is passed back to the transmitter. This enables the transmitter to keep sending more packets. There is a maximum number of packets that can be sent without being acknowledged. If an error is detected, no acknowledgement is returned. The transmitter will time out (in some embodiments, the timing is adjustable) and, by knowing the last frame that was successfully received at the other end, will start retransmitting the failed frame packets. Status is kept and another MMR has a limit on the number of retries that will be attempted before giving up.

There are some other test functions that test that the packet error checking and packet retry functions work correctly. The functions are, in some embodiments, able to be controlled directly from on-chip MMRs and so do not require the WTE, though the test engine 125 can provide additional testing, if desired.

In some embodiments, any errors detected in the SerDes interface and in checking the packet data is recorded in status MMRs and are available at all times.

As was stated before, in some embodiments, logic associated with each SerDes port (the LCB or Link Control Block) can generate a pseudo-random data sequence that can be sent and checked at the receiver. This is normally done as part of the initialization sequence. This means that, in some embodiments, no additional direct test capability is needed from the WTE or from other tests specifically directed at the interface ports. Of course the ports will be exercised by data passing through the ports, as when one memory card is being used to test another card. Error checking and recovery is enabled and used for these cases.

The transmit/output and receive/input sides of each SerDes port are independent enough that a single loopback connection can verify functionality using the functions discussed above. There is a maintenance function to activate this loopback connection at the pins of W-circuit 120.

Test and Maintenance Functions for the L3 Cache and Associated Logic

In some embodiments, the L3 data cache has SECDED circuitry on a 32-bit basis. Like the DRAM interface, data can be written and read in this mode and also in a 40-bit mode so that the memory underneath the data checkbytes can be easily tested. This would normally require that the cache support 39 bits, but 40 bits of data width are provided so that the data items in the cache can be used as full-width test operands for the memory subsections.

Associated with each cache line (32 bytes per cache line, in some embodiments) is an address. The address is used when memory requests arrive from the processors to see if the requested data item is present in the cache so that a subsection memory reference can be avoided. The addresses for all the cache lines are grouped together into a Tag RAM. Each entry in the Tag RAM is the address for the data of one cache line. In addition to the address data in the Tag RAM, sharing and coherency state data for each line is also stored. This information is used to determine data 'ownership' and sharing properties.

In some embodiments, the Tag RAM is protected by its own SECDED checkbyte. The logic and memory associated with the checkbyte are not directly testable but have a maintenance function, discussed below, that enables full test of the associated functionality. The coherency logic is tested with specific test sequences from the WTE. Built into the coherency logic are illegal sequence detectors (like trying to evict the same item twice in succession) that help in the testing of these functions, in some embodiments.

The 'way-compare' logic in the cache (in some embodiments, sixteen comparators that see if a request address matches one of the addresses in the Tag RAM) is tested by storing specific addresses in the Tag RAM and then generating a memory request (usually from the WTE) and seeing if data is returned from the cache or if a memory-get request is generated to the memory controller 127 (indicating that no address match was found).

Each quadrant of the L3 data cache is 'more or less' testable as a random-access memory when put into a specific test mode. At the same time and using the same test mode, the other sharing and coherency logic is driven by the same sequence (read and write operations) and sends responses to the WTE for checking. The 'more or less' comes from the fact that the multiple cache entries at a single address index (the 'sixteen ways') are distinguished by the requirement that the address in each respective Tag entry must be different and the way-compare logic indicates that a particular 'way' has the data cached for a particular address and self identifies. In some embodiments, there is no mechanism to say "read the data item that resides in 'way-3' for the following address/index." In a test mode the individual ways can be identified, but again, without knowing a 'real memory address.' In some embodiments, from the WTE, data can be written to specific ways and memory indexes; this is equivalent to having a memory address. When data is being read from the cache, the address compare logic chooses a way that matches the requested address and returns the correct data without ever having a specific read address. In some embodiments, the JTAG path can read and write specific cache locations but at a lower bandwidth than can be sustained by the WTE.

Testing of the SECDED checkbyte generation, memory, syndrome generation, and data correction functions of the Tag RAM are accomplished with the following test:

▶The storing of a checkbyte value in Tag RAM when an entry is to be written can be blocked. The resulting zero checkbyte value is the same as if the data entry being stored is all-zero. In other embodiments, a non-zero checkbyte value is used for all-zero data items, in order that a failure that causes all bits to be zero will be detected. For those embodiments, that non-zero checkbyte value is forced rather than the all-zero value.

▶Store a set of single sliding-one bit values into the Tag RAM. As each entry is read back the returned value should be all-zeros and the status MMRs will indicate the bit position of the 1-bit that was stored. Data values to cause other single- and multiple-bit errors can be stored and read in order to fully check the read checkbyte, syndrome, and correction logic. Depending on the likely faults (failure modes that are more probable than others), a sliding-zero sequence is used for some embodiments.

▶Once the read checkbyte logic is verified, the write logic must be working if no errors are reported in normal and test operations.

The cache is also used in testing the DRAM memory. When this is done, data to be written to the DRAMs is stored in the cache. The WTE generates AMO (or other) references that cause data to be written to the DRAMs in the associated subsection. Data can be subsequently read by having the WTE generate normal memory reads for the same addresses. In some embodiments, using AMO (atomic memory operation) references allows full memory bandwidth to be generated and does not require that the detailed structure of the cache be understood in order to generate useful test sequences. (By way of explanation: in some embodiments, AMO operations take place in each memory controller 127; any cache data must be forwarded to the controller so that can take place. The memory controller 127 writes the data to memory as part of AMO functionality.)

Other Test and Maintenance Functions

In some embodiments, the W-circuit 120 has a capable internal test-point monitoring capability. Commands are sent to the logic monitor to choose what test points to monitor and to select a triggering condition. The selected testpoint data is saved in a buffer memory for observation later.

The trigger condition can start or stop data recording. If the trigger condition mode stops testpoint data recording, data recording is started when the mode is selected and runs continuously—the testpoint data buffer is circular—and is stopped when the trigger condition occurs. As a result, data in the testpoint buffer looks backward in time as the condition that generated the trigger condition corresponds to the last entry in the buffer. If the trigger condition mode is to start recording testpoint data, than data recording is started when the trigger condition occurs and is stopped when the buffer is full. Data in the buffer is then later in time than the triggering event. This capability has proved very useful for low-level debugging and fault-finding.

The JTAG scan logic has full access to all memory-mapped registers which hold configuration information and control and receive status from all major logic functions in the IC. This includes system level operations as well as maintenance and diagnostic functions.

Functions of the W-Circuit Test Engine 125

The WTE (W-circuit test engine) 125 is connected into the chip's logic as shown in FIG. 2E. It has access to all data coming into and leaving the chip both from the processor ports and from the memory subsections. The test engine 125 is used to generate tests and to check results when testing the L3 cache and coherency logic and when testing the memory controllers 127 and the DRAM parts 130. The test engine 125 is used to provide address generation when one MDC 110 is testing another and is used, in some embodiments, in the card being tested to check test results. In addition, for some embodiments, the WTE can be used to generate tests for, and to observe results of testing the high-speed ports 121 when the ports are configured in any of the various loopback functions or modes.

The test engine 125 is controlled and results observed through MMR registers that are accessed through the JTAG port. In addition, in some embodiments, the test engine 125 can be used in other system test operations, for example by generating test data packets that can be sent to the processors for diagnostic functions.

The logic of the test engine 125 consists of two major components: a sequencer 346 (e.g., one that is controlled by microcode stored in the W-circuit) which generates tests and a result test checker 347. A block diagram of the sequencer is shown in FIG. 2F.

In some embodiments, the Test Generation logic has the following major features and subcomponents:

▶A small (in some embodiments, 32 entries are provided) Test-Data memory buffer. Entries are used as the data source for data being written to memory, to the cache, and for test data needed for testing of any other logic functions. Data in this memory is written to the buffer memory by using the JTAG path as part of entering a test sequence into the test engine 125. In some embodiments, the capability is provided to specify that the complement of the data in the buffer should be used instead of specified stored test operand.

▶In some embodiments, one or more memory-address generators (e.g., one or two) have separate portions for row, column, and bank. The register holding the current address can be entered whole or can have any of the 3 portions incremented/decremented by a small bit field. The idea is to specify increments from a last value starting from some fixed address. This avoids the requirement for a loader function (to relocate addresses for different memories or when executing a test sequence from a different starting point than the original address). Doing this also will greatly reduce the number of entries in the microcode memory and so reduce time to load test sequences. The address generator function is also used when testing the L3 cache.

▶One or two loop counters are provided for some embodiments. A bit from the microcode control memory indicates to decrement a counter. If the count is zero the next command is the next sequential entry in the sequence memory. If not zero, the entry in a 'loop back' field in the microcode memory is used to adjust the address of the next entry taken from the sequence memory. (This field should be a relative offset also.) The loop counters can be loaded as needed from the microcode memory.

▶A microcode memory (in some embodiments, for example, fifty bits in width by 256 addresses). The contents of each data entry consist of several fields, each of which control some specific function or data item.
  A. One or more bits to indicate that the loop counter(s) 314 should be decremented and tested.
  B. A 'Loop Back' field (in some embodiments, four bits) to indicate address offset for top of loop address.
  C. Three fields to indicate how the current row, column, and bank address should be adjusted for the memory reference that will be made following the current reference. These fields will likely have additional functions of holding a memory address to be loaded and as loop counts.
  D. A small microcode command field that indicates that the current sequence entry is used to load the address or loop counters directly, so that the sequence fields become catenated and an immediate value. 'Halt' is likely one of the commands.
  E. A memory command field (in some embodiments, six bits) that is the memory function specification: read, write, AMO, and some of the parameter bits (allocate/no-allocate, exclusive/shared, etc.)

When the WTE is running a test, the different registers needed for the test and the contents of some of the fields in the sequence memory are used to built a request packet—write at the following address using a specified data item from the test data buffer, for example—and sent off for execution. Each packet is given an identifier, called a TID (for Transaction IDentifier), that is most importantly used when data is returned as a result of a data read request. The Result logic keeps a pointer to the expected data in association with the TID. This means that data checking is not dependant on the order that data is returned from memory.

The Test Result logic is shown in FIG. 4. It has an Expected Result buffer memory to hold data that are used to compare with test data being returned from the logic or memory function being tested. In some embodiments, there is also a small (in some embodiments, one KByte) memory buffer that can save test results for external observation as needed.

All the needed 'meta' controls for the WTE test functions—indicating, for example, to the crossbar logic that 40/80-bit data paths are required instead of 32/64-bit paths or that the test sequence is for the L3 cache rather then the DRAM memories—are MMRs that are controlled via the JTAG scan logic.

The WTE also has the ability to generate requests to the memory subsection controllers that result in a stream of data being dumped to the processor ports. The data stream becomes a sequence of memory read and write requests to a connected unit-under-test. A test mode set in the memory controllers 127 causes whole memory rows to be read at maximum bandwidth. This function is used on the Gold unit when it is generating test streams for use in testing another MDC 110.

Among several other functions that can be useful in support of system operation, debugging, or checkout, it is, in some embodiments, very easy for the WTE to change the ECC checkbytes in memory in the following ways: 1) pass through memory making the data checkbytes correspond to data stored there and 2) pass through memory storing invalid checkbyte values. The first function allows corrupt memory to be accessed and the second is intended to generate an interrupt when a program accesses data that has not been subsequently validly initialized; this is useful in software program debugging.

The test engine can also be used, in some embodiments, in normal system operation, for example by zeroing-out newly allocated memory pages as a help to operating system allocation routines.

Using One MDC 110 to Test Another

When one MDC 110 tests another, one card (the golden unit) is a master and is used to provide a stream of requests to the MDC unit under test. The following is done:

▶Data is stored into any or all of the memory subsections of the gold unit that correspond to subsections of the unit-under-test that are to be exercised using the JTAG path to provide the data in preferred embodiments.

▶The unit-under-test is configured for normal operation, except that read-data checking and data path widths are enabled as needed. Also, the Expected Data buffer is loaded so that data checking can be performed.

▶The WTE in the gold unit is given a starting address and an address range/length. The WTE generates incrementing, full row read requests so that ordering within the resulting data stream is fully deterministic. The crossbar logic sends the requests to any identified quadrant and subsection that is to be tested resulting in a data stream at each port corresponding to the memory subsections that are to be exercised. In some embodiments, the memory references are broadcast to all memory controllers 127 at the same time to exercise the UUT more completely and at higher total bandwidth.

▶The streams coming into the unit-under-test see are seen as a series of read and write requests that are executed. In general, each streams addresses should be restricted so that each port's requests do not get sent to a different subsection than that of the requesting port number. The issue here is not that the read or write operations will not be done correctly but that the ordering of operations can change because of interactions between the multiple requesting streams. (Each interface port is separately re-synced to the memory and logic clock by the SerDes logic. This generally makes ordering of one data stream with respect to another nondeterministic.) Some read data can be saved in the WTE result buffer and observed externally if needed, though result data reordering must be considered in observing the data returned, in some embodiments.

▶The Test-Result portion of the WTE of the unit-under-test is used to check that data read from the memory of that unit is correct. This means that the Expected Result data buffer must be loaded through JTAG scan path before the test starts. The Build Test Packet logic of the WTE test generation function is used to scan the request data stream from the gold unit to enable association of read requests to the contents of the Expected Result buffer. Note that, in some embodiments, none of the data read back from the memory of the unit-under-test leaves that unit while the test is underway, though some embodiments might well pass the data back to the gold unit for testing.

In this mode, the memory controllers 127 always reference and send out whole rows from the memory. If the test ends before the last data in a row, the test data generator must pad the end of the sequence with null/empty packets, in some embodiments.

The request data stored in the memory of the gold unit must be properly formatted data packets. In some embodiments, data within the test sequence can be normal 32- and 64-bit data or it can provide 40-bit data items in the data portion of the request packets. For some embodiments, a single test stream must not mix 32/64 bit data requests with 40-bit data requests. The 40-bit data format allows memory normally holding ECC data bits to be tested as normal memory with full control over the stored data bits. This 40-bit mode will not exercise full memory bandwidth however, in some embodiments. When in 40-bit mode, all memory requests must be for 16-byte data items (a single burst-of-four for each memory subsection when using DDR2 SDRAM memory), in some embodiments.

About the Memory Mapped Registers (MMRS) in W-circuit 120

All MMRs are loaded and unloaded through the JTAG scan path, in some embodiments. All control functions including master clear and initialization functions are done through on-chip MMRs. Internal status for all functions is available in the requisite MMRs. The internal memory blocks including the L3 data and Tag/coherency memories and the test point buffer can be written and read through the MMR access mechanism.

Each MMR or memory function is assigned an address or an address range. In the JTAG scan port there is a register that can be loaded with the needed address; there is also a function register is that is loaded at the same time. If the function is writing, data follows the address in the serial data stream. If the function is reading, the data from the addressed entity is driven from the scan output. The result is quick access to any needed function, status register, or data memory and avoidance of long scan chains when accessing the MMR functions.

When the IC is powered up or is given the lowest level of master clear, all MMRs are loaded with default values, in some embodiments. While some of the defaults will likely never change except for some of the maintenance functions (enable coherency in the L3 cache, for example), others will become obsolete and will always change; for example, when 4-Gbit memory parts become available the memory size default for 1-Gbit memory parts will, in some embodiments, never be used on new systems from that point onward. For some embodiments, the scan port in W-circuit 120 can run at any frequency from dc to 50 MHz.

Using the Test Functions in MDC 110/W-Circuit 120

In some embodiments, test sequences will follow the same basic operational steps:

A. Load needed MMRs for needed configuration functions: Any configuration difference from the default or current state is loaded at this time. This can include disabling ports or other functions as needed.

B. Load and control MMRs for needed initialization or training: The SerDes ports must go through an initialization sequence. Similarly, there will be clock timing adjustments or driver impedances that must be set in the memory controllers 127 and in the memory parts 130 themselves.

C. Load any data needed into memory blocks that will source data or information for the test sequence: If the WTE is to be used, the microcode memory must be loaded and the Test Data Buffer and Result Data Buffers loaded. For some tests the L3 data and/or Tag memories must be loaded. When using one MDC 110 to test another, the memory of the 'gold' unit is loaded at this time.

D. Start/execute the test: An MMR is written with a 'go test' signal such that the needed test is activated. In most cases the WTE starts running the test or there is similar capability in the other test functions.

E. Observe the test results: MMRs with result status are observed. In some cases result data memories or buffers must be unloaded and observed in some fashion.

F. If needed, repeat some or all of the above.

Aspects of Some Embodiments that Include a Memory-controller Circuit 120 that Includes a Self-tester and/or Test Engine 125 for Other Similar or Complementary Cards Some embodiments of the invention include a first circuit 120 for use with a first memory card 110, the card having a plurality of memory chips 130. This first circuit includes a high-speed external card interface 112 (also called a system interface 112) connected to write and read data to and from the memory chips 130, and a test engine 125 configured to control the high-speed interface 112 and/or the memory chips 130 and to provide testing functions to a second substantially identical circuit 120 on a second memory card 110.

Some embodiments of the first circuit 120 further include one or more memory controllers 127, each one of the one or more memory controllers 127 connected to control a subset of the plurality of memory chips 130.

Some embodiments of the first circuit 120 further include one or more caches 124; each one of the one or more caches 124 operatively coupled to a corresponding one of the memory controllers 127.

In some embodiments of the first circuit 120, the high-speed external card interface 112 further includes a crossbar switch 123, and one or more SerDes ports 121, each one of the one or more SerDes ports 121 connectable through the crossbar switch 123 to a plurality of the caches 124.

Some embodiments of the first circuit 120 further include a control interface 122, the control interface configured to program the test engine and to initialize, control, and observe test sequences.

In some embodiments, the invention includes a system 200 for using a first memory card 110 to test a second memory card 110, the system 200 including a test fixture 210 having a first interface 219A connectable to the first memory card and a second interface 219B connectable to the second memory card, such that at least some inputs from the first interface are connected to corresponding outputs of the second interface, and at least some outputs from the first interface are connected (via connection wiring 230) to corresponding inputs of the second interface, and a test controller 220 operable to send configuration data to the first interface to cause a testing function to be performed when suitable first and second memory cards are connected to the fixture.

In some embodiments, the first interface connects each of one or more high-speed SerDes port of the first memory card 110 to a corresponding SerDes port of the second card 110.

In some embodiments, the test controller 220 receives test results from the first memory card 110 indicative of functionality of the second memory card 110.

In some embodiments, the test controller 220 includes an interface 219 (or 219A and 219B) to send and receive data from respective control interface ports 119 of the control interfaces 122 on the first memory card 110 and the second memory card 110.

In some embodiments, the test controller 220 is operable to configure the second memory card 110 to each one of a plurality of different operation modes.

Some embodiments of the test system 200 further include a test controller connection 219 to both the first and second memory cards.

In some embodiments, the invention includes a method for testing memory cards, the method including connecting a plurality of interface lines of a first memory card to corresponding complementary interface lines of a second memory card, configuring the first memory card to be operable to perform testing functions, configuring the second memory card to be operable to perform normal read and write operations, and testing the second memory card under the control of the first memory card.

In some embodiments of this method, the configuring of the first memory card includes loading microcode into the first memory card.

In some embodiments, the invention includes a first memory card 110 that includes a plurality of memory chips 130, one or more high-speed external card interfaces 121, including a first interface 121 and a second interface 121, each connected to write and read data to and from the memory chips 130, and a test engine 125 configured to control the first high-speed interface 121 and the memory chips 130 in order to provide testing functions to the second high-speed interface 121.

In some embodiments of this card 110, the test engine 125 is operable to generate requests that look like and perform as normal requests to the card.

In some embodiments of this card 110, the test engine 125 includes internal paths that enable the test engine 125 to send requests to and receive results from a plurality of internal chip functions.

Some embodiments of this card further include circuitry that allows results to return in a different order than the order in which they were generated.

Some embodiments of this card further include a microcode memory that stores code that controls at least some functions of the test engine.

In some embodiments, the invention includes a computer system 100 or 200 that includes a first processing unit 106 or 220, and the first memory card 110 described above, operatively coupled to the first processing unit 106 or 220.

Some embodiments of this computer system 100 or 200 further include a second memory card 110 substantially identical to the first memory card 110, and operatively coupled to the first processing unit 106 or 220.

In some embodiments of the computer system 200, at least one interface port 121 of the first memory card 110 is complementarily connected to a respective interface port 121 of the second memory card 10, and wherein the first processing unit 220 is configured to load configuration information into the first memory card to cause the first memory card 110 to perform test functions to the second memory card 110, the first processing unit 220 also configured to receive test results.

In some embodiments of the computer system 100, the first processing unit 106 is configured to load configuration information into the first memory card 110 and the second memory card 110 to cause the first memory card 110 and second memory card 110 to perform normal read and write operations.

Some embodiment further include a second processing unit 106, a third memory card 110 substantially identical to the first memory card 110, and operatively coupled to the second processing unit 106, and a fourth memory card 110 substantially identical to the first memory card 110, and operatively coupled to the second processing unit 106.

Other embodiments of the invention include a first memory card 110 that includes a plurality of memory chips 130, a high-speed external card interface 112 connected to write and read data to and from the memory chips 130, and a test engine 125 configured to control the high-speed interface 112 and/or the memory chips 130 in order to provide testing functions to a second substantially identical memory card 110.

Some embodiments of card 110 further include one or more memory controllers 127, each one of the one or more memory controllers 127 connected to control a subset of the plurality of memory chips 130.

Some embodiments of card 110 further include one or more caches 124; each one of the one or more caches 124 operatively coupled to a corresponding one of the memory controllers 127.

In some embodiments of card 110, the high-speed external card interface 112 further includes a crossbar switch, one or more SerDes ports, each one of the one or more SerDes ports connectable through the crossbar switch to a plurality of the caches.

Some embodiments of the first memory card 110 further include a control interface, the control interface configured to program the test engine and to initialize, control, and observe test sequences.

Another aspect of the invention in some embodiments provides a single-chip memory-support circuit 120 that includes a system interface 112, a memory interface 113 operable to generate read and write operations to a memory 130, wherein the circuit 120 operates to provide data from the memory interface 113 to the system interface 112, and a test engine 125 operatively coupled to control the system interface 112 and the memory interface 113 in order to provide testing functions. In some embodiments, the testing functions are programmably configurable, i.e., they can be controlled by information that is loadable into the test engine. Since this control information is loadable, it can be changed to enable testing of various conditions that perhaps could not be anticipated early in the design phase.

Some embodiments of card 110 further include a control interface 122, wherein testing configuration information is loadable through the control interface 122 into the test engine 125 to provide the programmably configurable testing functions.

Some embodiments of card 110 further include a cache operatively coupled to the memory interface and the system interface to provide cached data to the system interface.

In some embodiments, the test engine includes a test-generation function; and a test-result-checking function, wherein results can be returned and checked in an order different than the order in which they were generated.

Another aspect of the invention in some embodiments provides a integrated-circuit chip that includes an input-output port; and a test engine operatively coupled to control the input/output port such that functionality of the input/output port can be tested by connecting the input/output port to a similar port of another chip and sending test commands to and receiving test results from the other chip's port.

In some embodiments of this chip, the testing can be performed without regard to the electrical and architectural implementation of the ports.

Some embodiments of this chip further include a memory interface operable to generate read and write operations to a memory, wherein the circuit operates to provide data from the memory interface into the input/output port.

Some embodiments of this chip further include a control interface, wherein testing configuration information is loadable through the control interface into the test engine to provide testing functions.

Some embodiments of this chip further include a cache operatively coupled to the memory interface and the input/output port to provide cached data to the input/output port.

Some embodiments of this chip further include functional logic on the chip; wherein use of the test engine is independent of operation of the functional logic.

Some embodiments of this chip further include functional logic on the chip; wherein use of the test engine is independent of and tests operation of the functional logic.

In some embodiments, the test engine generates a plurality of tests in order that two or more simultaneous functions of the functional logic are tested at the same time. For example, testing cache and causing heavy memory traffic, by requesting lots of data that is not in the cache, which in turn causes additional memory operations to fill the cache. In some embodiments, the WTE 125 can stimulate the crossbar 123 with a broadcast function requesting, for example, four pieces of data simultaneously. In some embodiments, the results checker 347 provides simultaneous checking of up to four results.

In some embodiments, various functions provided by the test engine are also used in normal operation. For example, the test engine provides a fast, efficient, and easily programmed way to provide additional functionality to the MDC 110 for normal operation, such as the ability to zero a block of data, or to fill data patterns that are recognizable as invalid data (such functions could be, but need not be, associated with allocation of memory blocks). In some embodiments, a user requests the operating system (OS) (e.g., of processor 106 of FIG. 1A) to give the user additional memory space (e.g., allocate data for a memory page request), and the OS returns with a pointer (an address) to the data for the user, and the OS has initialized, or has arranged to have the hardware initialize, that data area to zero. In some embodiments, the WTE 125 is programmed to perform the zeroing of the block of allocated memory upon receiving the proper command from the OS.

The WTE 125 is also useful for debugging, in some embodiments. For example, the user sees that some program is making a memory reference to an address that is considered out of bounds, and the program is crashing the operating system, but due to the large number of different programs that are multitasking in the computer system it is very difficult to tell which program is making the out-of-bounds memory request, or where in the program. Thus, in some embodiments, the WTE 125 is used to initialized some or all unused memory with a particular data pattern that is never validly usable by normal code (e.g., in a memory with SECDED error-correction code, this could be a pattern of all zeros in the normal 32-bit data field, and with a pattern of data in the field of error-correction bits (the seven or eight extra bits that are used for error correction) that indicates a two-or-more-bit uncorrectable error). Upon receiving the command to initialize memory, WTE 125 would go through the memory-allocation block and initialize that piece of memory that is going out of bounds with the predetermined special data pattern (which gives an uncorrectable error indication when accessed as normal memory). Thus, when the user accesses that area (e.g., the area beyond the end of a defined array), they get a multiple-bit error due to the initialization done by WTE 125. When a user's program is exceeding the bounds of an array, the multiple-bit error pattern is read from past end of array, and the W-circuit 120 recognizes and reports the "corrupt data."

In some embodiments, there is an interrupt generated by the W-circuit 120 for multiple-bit errors that are detected. In some embodiments, each memory controller 127 performs SECDED error correction (generates the ECC bits on data being written, and checks and corrects correctable errors, and reports uncorrectable errors). WTE 125 can cause writes of 40-bit data (of any arbitrary pattern, including patterns of data and ECC bits that should be detected as indicating one or more errors, and these should be distinguished as single-bit errors or multiple-bit errors), rather than 32-bit data plus SECDED, as is written from the normal write if data from a system processor. In some embodiments, the interrupts to report errors go through the normal data path through the high-speed serial ports, and the error gets reported back by an interrupt-request packet to inform the OS that this or that error happened.

In some embodiments, all requests have TID (Transaction IDentifier) tags that are sent to MDC 110 with each request, and then when the data are retrieved, they are returned with the corresponding TID to identify to the processor which request this data belongs to. If an error is detected, the error return includes the corresponding TID, along with an error-reply flag (indicating an error in the request, MDC 110 unable to satisfy with the proper data). The OS is told which card and which memory controller 127 detected the error.

In some embodiments, another aspect of the invention provides a system for testing a first memory card. This system includes a test fixture having a first interface connectable to the first memory card, such that at least some inputs of the first interface are connected to corresponding outputs of the first interface, and a test controller operable to send test configuration data to the first interface to cause a testing function to be performed by the first memory card when connected to the fixture.

In some embodiments, the first interface connects one SerDes port of the first memory card to another SerDes port of the first memory card.

In some embodiments, the test controller receives test results from the first memory card indicative of functionality of the first memory card.

In some embodiments, the test controller includes an interface to send and receive data from a control interface port on the first memory card.

In some embodiments, the test controller is operable to configure the first memory card to each one of a plurality of different operation modes.

1. Aspects of Some Embodiments that Include a Read-Refresh Mode, Scrubbing, Variable Rate Some embodiments of the invention provide a memory daughter card (MDC) having one or more memory controllers that each provide a read-refresh mode of operation, in which every row of memory is read within the refresh-rate requirements of the memory parts, and different columns within the rows are read on subsequent read-refresh cycles, thus reading every location in memory at regular intervals (e.g., depending on the memory configuration and refresh requirements, this can be once every few seconds to about once per hour, in some embodiments), and allowing for checking for correct data using each location's ECC.

In some embodiments, a scrubbing function is also provided and integrated with the read-refresh operation rather than being an independent operation. Combining the scrubbing and refresh functions, as used in these embodiments, results in scrubbing memory about once per minute. For scrubbing, after the data bits are checked and if an error is detected, a subsequent atomic read-correct-write (ARCW) operation is scheduled based on each correctable single-bit error detected during the read-refresh operations (the separate read in the ARCW is done just in case the processor had modified the contents after the error was detected but before corrected data could have been written back) to correct the affected location.

In some embodiments, refresh timing is variable. In some embodiments, a priority can be varied such that refreshes that have been delayed for a long time can be prioritized to a higher exigency.

In some embodiments, an explicit-refresh mode of operation is selectable instead of the read-refresh mode of operation to improve performance. In some such embodiments, scrubbing is done independently from refresh (e.g., as an additional operation performed relatively infrequently), such that all locations are scrubbed about once per hour. In some of these embodiments, additional read-refresh operations are scheduled for this scrubbing, in addition to and amongst the explicit-refresh commands, at a frequency low enough that performance does not appreciably degrade.

In some embodiments, the invention is part of a computer system having, for example: a first plurality of memory cards and a first plurality of processors coupled to the first plurality of memory cards, a second plurality of memory cards and a second plurality of processors coupled to the second plurality of memory cards, a network operatively coupled between the first plurality of processors and the second plurality of processors, and an input/output system operatively coupled to provide data to and from the first plurality of processors.

Some embodiments provide an information-processing apparatus that includes a first memory controller, that in turn includes a memory-chip interface that outputs memory addresses in a plurality of portions, including a first-address portion that is sufficient to refresh a set of addresses for a portion of a memory and a second-address portion that specifies one or more locations within the set of addresses, and a refresh controller, coupled to the memory-chip interface, and configured to send read-refresh requests. These read-refresh requests use refresh addresses that cycle through address bits for the first-address portion (e.g., a row-address portion that is sufficient to refresh the specified row) and also cycle through bits for the second-address portion (e.g., a column-address portion that is not needed for refreshing, but does select one or more words from memory), and wherein read-refresh result data is fetched to the memory-chip interface as a result of each of the read-refresh requests.

Some embodiments provide an information-processing apparatus that includes a first memory controller having a memory-chip interface that outputs memory addresses in a plurality of time multiplexed portions, including a first-address portion and a second-address portion, a memory-request buffer, coupled to the memory-chip interface, and configured to hold a plurality of pending memory requests that are transmitted to the memory-chip interface, and a refresh controller, coupled to the memory-request buffer, and configured to send read-refresh requests the read-refresh requests using refresh addresses that cycle through address bits for the first-address portion and also cycle through bits for the second-address portion, and wherein read-refresh result data is fetched to the memory-chip interface as a result of each of the read-refresh requests.

Some embodiments of the apparatus further include an error detector, coupled to receive read-refresh results from the memory-chip interface and configured to detect one or more bit errors in the read-refresh result data, and an atomic read-correct-write (ARCW) controller coupled to the memory-request buffer, and configured, based on detection of an error by the error detector, to control an atomic read-correct-write operation to correct the detected error in a manner that is uninterrupted by other requests that could affect correction of the erroneous data. In these embodiments, the memory-request buffer is configured to hold a plurality of pending memory requests, the error detector detects errors (optionally based on a SECDED or other suitable ECC), and the ARCW controller operates to temporarily inhibit requests from the memory-request buffer and to prevent further memory requests from being issued and/or accepted for a period of time sufficient to allow the atomic read-correct-write operation to effectively complete.

Some embodiments of the apparatus further include an error detector, coupled to receive read-refresh results from the memory-chip interface and configured to detect one or more bit errors in the read-refresh result data from an error-affected location, and an atomic read-correct-write (ARCW) controller coupled to the memory-request buffer, and configured, based on detection of an error by the error detector, to control an atomic read-correct-write operation to correct the detected error in a manner that is uninterrupted by other requests to the affected location.

In some embodiments, the refresh controller is further configured to send explicit-refresh requests to the memory-request buffer, wherein the explicit-refresh requests are sent from the memory-chip interface to cause memory parts to perform an internally controlled refresh function.

In some embodiments, the refresh controller sends a plurality of explicit-refresh requests without intervening read-refresh requests over a first period of time, then a plurality of read-refresh requests without intervening explicit-refresh requests over a second period of time, then sends a plurality of explicit-refresh requests over a third period of time, and then a plurality of read-refresh requests over a fourth period of time.

In some embodiments, the refresh controller further includes a timer controller that allows timing between explicit-refresh requests to be varied.

In some embodiments, the refresh controller further includes a timer controller that allows timing between read-refresh requests to be varied.

In some embodiments, the refresh controller further includes a priority controller that sends a first read-refresh request at an initial priority value, and later if the first read-refresh request has not been completed, increases the priority value.

In some embodiments, the refresh controller further includes a priority controller that sends a first read-refresh request specifying a first address and at an initial priority value, and later if the first read-refresh request has not been completed, then sends a replacement read-refresh request specifying the first address and at a higher priority value. In some embodiments, an arbitration circuit is included at the output of the buffer, and the refresh requests are presented there without passing through the buffer, such that the arbitration circuit can chose such a refresh request over other requests in the buffer when the refresh request has the higher priority.

Some embodiments of the apparatus further include a high-speed serial external interface connected to receive memory-requests from a processor for sending to the memory-chip interface, and to transmit data obtained from the memory-chip interface for sending to the processor.

Some embodiments of the apparatus further include a plurality of high-speed serial external interfaces, a second memory controller substantially the same as the first memory controller, a first plurality of memory chips operatively coupled to the first memory controller, a second plurality of memory chips operatively coupled to the second memory controller, and a crossbar switch operatively coupled to transmit and receive memory commands and data to and from the first and second memory controllers, and to and from the plurality of high-speed serial external interfaces.

In some embodiments, the apparatus is packaged on a single first memory card.

Some embodiments of the apparatus further include a second memory card substantially the same as the first memory card, a first plurality of processors coupled to the first memory card and to the second memory card, a third and fourth memory card each substantially the same as the first memory card, a second plurality of processors coupled to the third memory card and to the fourth memory card, a network operatively coupled between the first plurality of processors and the second plurality of processors, and an input/output system operatively coupled to provide data to and from the first plurality of processors.

Some embodiments of the apparatus further include a first plurality of processors coupled to the plurality of high-speed serial external interfaces, a network operatively coupled to each of the first plurality of processors, an input/output system operatively coupled to provide data to and from the first plurality of processors, and a power supply operatively coupled to provide power to the first plurality of processors.

In some embodiments, the first address portion includes address bits for a row of data in a memory chip and the second address portion includes address bits for a column of data in the memory chip.

Some embodiments provide an information-processing method that includes buffering a plurality of pending memory requests from a processor, sending a stream of processor memory requests from the buffered pending memory requests to memory parts, inserting a read-refresh request periodically into the stream of processor memory requests, wherein the periodic read-refresh requests are sent using refresh addresses that cycle through address bits for a row-address portion and also cycle through bits for a column-address portion, and fetching data as a result of each of the read-refresh requests.

Some embodiments of the method further include detecting an error in the fetched read-refresh data (optionally based on a SECDED or other suitable ECC), preventing further memory requests from starting for a period of time, preventing further memory requests from being issued and/or accepted for a period of time, and performing an atomic read-correct-write (ARCW) operation, based on detecting the error in the fetched read-refresh data, to correct the detected error in a manner that is uninterrupted by other memory requests.

Some embodiments of the method further include detecting an error in the fetched read-refresh data (optionally based on a SECDED or other suitable ECC), allowing already pending buffered memory requests to complete, preventing further memory requests from being issued and/or accepted for a period of time, and performing an atomic read-correct-write (ARCW) operation, based on detecting the error in the fetched read-refresh data, to correct the detected error in a manner that is uninterrupted by other memory requests.

Some embodiments of the method further include detecting an error in the fetched read-refresh data, and performing an atomic read-correct-write (ARCW) operation, based on detecting the error in the fetched read-refresh data, in order to correct the detected error.

Some embodiments of the method further include detecting an error in the fetched processor data, and performing an atomic read-correct-write (ARCW) operation, based on detecting the error in the fetched processor data, in order to correct the detected error in a manner that is uninterrupted by other memory requests.

Some embodiments of the method further include fetching processor data as a result of one of the pending processor memory requests, detecting an error in the fetched processor data (optionally based on a SECDED or other suitable ECC), preventing further memory requests from starting for a period of time, preventing further memory requests from being issued and/or accepted for a period of time, and performing an atomic read-correct-write (ARCW) operation, based on detecting the error, to correct the detected error in a manner that is uninterrupted by other memory requests.

Some embodiments of the method further include fetching processor data as a result of one of the pending processor memory requests, detecting an error in the fetched processor data (optionally based on a SECDED or other suitable ECC), allowing already pending buffered memory requests to complete, preventing further memory requests from being issued and/or accepted for a period of time, and performing an atomic read-correct-write (ARCW) operation, based on detecting the error, to correct the detected error in a manner that is uninterrupted by other memory requests.

Some embodiments of the method further include detecting an error in the fetched processor data, and performing an atomic read-correct-write (ARCW) operation, based on detecting the error in the fetched processor data, in order to correct the detected error in a manner that is uninterrupted by other memory requests.

Some embodiments of the method further include inserting an explicit-refresh request periodically into the stream of memory requests to cause memory parts to perform an internally controlled refresh function.

Some embodiments of the method further include inserting an explicit-refresh request periodically over a first period of time, then inserting a read-refresh request periodically over a second period of time, then inserting an explicit-refresh request periodically over a third period of time, and then, inserting a read-refresh request periodically over a fourth period of time.

Some embodiments of the method further include varying a value of time between explicit-refresh requests.

Some embodiments of the method further include varying a value of time between read-refresh requests.

Some embodiments of the method further include sending a first read-refresh request at an initial priority value, and later, if the first read-refresh request has not been completed, increasing the priority value.

Some embodiments of the method further include sending a first read-refresh request that specifies a first address and an initial priority value, and later, if the first read-refresh request has not been completed, then sending a replacement read-refresh request specifying the first address and a higher priority value. In some embodiments, an arbitration circuit is included at the output of the buffer, and the refresh requests are presented there without passing through the buffer, such that the arbitration circuit can chose such a refresh request over other requests in the buffer when the refresh request has the higher priority.

Some embodiments of the method further include receiving memory requests from a processor across a high-speed serial external interface, sending the memory requests to memory parts, and transmitting data obtained from the memory parts to the processor.

Some embodiments of the method further include receiving memory requests from a plurality of processors across a plurality of high-speed serial external interfaces, wherein the buffering of pending memory requests is divided among a plurality of buffers including a first and a second buffer, sending memory requests from the first buffer to a first plurality of memory chips, sending memory requests from the second buffer to a second plurality of memory chips, and crossbar switching to transmit and receive memory commands and data to and from the first and second buffers, and to and from the plurality of high-speed serial external interfaces.

In some embodiments, the method is performed on a single first memory card.

Some embodiments of the method further include fetching processor data as a result of one of the pending processor memory requests, detecting an error in the fetched processor data (optionally based on a SECDED or other suitable ECC), preventing further memory requests from starting for a period of time, and performing an atomic read-correct-write (ARCW) operation, based on detecting the error, to correct the detected error in a manner that is uninterrupted by other memory requests.

Some embodiments of the method further include fetching processor data as a result of one of the pending processor memory requests, detecting an error in the fetched processor data (optionally based on a SECDED or other suitable ECC), allowing already pending buffered memory requests to complete, and performing an atomic read-correct-write (ARCW) operation, based on detecting the error, to correct the detected error in a manner that is uninterrupted by other memory requests.

In another aspect of the invention, some embodiments provide an apparatus that includes a plurality of memory chips, a memory-request buffer, coupled to the memory chips, and configured to hold one or more pending memory requests from a processor that are transmitted to the memory chips, and means as described herein for read-refreshing the memory chips and fetching read-refresh data as a result.

Some embodiments of the apparatus further include an error detector operatively coupled to receive read-refresh data from the memory chips, and means for performing an atomic read-correct-write (ARCW) operation to correct a detected error, based on detecting the error in the read-refresh data.

Some embodiments of the method further include an error detector operatively coupled to receive processor data from the memory chips, and means for performing an atomic read-correct-write (ARCW) operation to correct a detected error, based on detecting the error in fetched processor data.

Some embodiments of the method further include means for explicitly refreshing the memory chips.

Some embodiments of the apparatus further include means for explicitly refreshing the memory chips in a manner periodically alternated with the read-refreshing of the memory chips.

Some embodiments of the apparatus further include means for detecting an error in the fetched read-refresh data (optionally based on a SECDED or other suitable ECC), means for preventing further memory requests from starting for a period of time, and means for performing an atomic read-correct-write (ARCW) operation, based on detecting the error, to correct the detected error in a manner that is uninterrupted by other memory requests.

Some embodiments of the apparatus further include means for detecting an error in the fetched read-refresh data (optionally based on a SECDED or other suitable ECC), means for allowing already pending buffered memory requests to complete, and means for performing an atomic read-correct-write (ARCW) operation, based on detecting the error, to correct the detected error in a manner that is uninterrupted by other memory requests.

Another aspect of some embodiments includes an information-processing system that has a dynamic memory, wherein the dynamic memory includes a first plurality of memory locations, and wherein a sufficient subset of the first plurality of memory locations must each be accessed within a refresh-period amount of time, a memory controller, coupled to the memory, and configurable to perform a first read operation to each and every one of the first plurality of memory locations, each first read operation causing corresponding read-refresh data to be fetched in a pattern that ensures that the sufficient subset is read within the refresh-period amount of time, and an error detector operatively coupled to receive and check for errors the corresponding read-refresh data.

Some embodiments of this system further include an atomic read-correct-write (ARCW) unit configured to correct data at a location having a detected error, based on results from the error detector's check of the read-refresh data.

In some embodiments of this system, the ARCW unit is configured to atomically perform: (1) a second read operation to the location having the detected error, (2) a correction of the error, and (3) a write operation to the location having the detected error.

In some embodiments of this system, the ARCW unit further includes a hold circuit that temporarily halts from starting further ones of at least certain memory operations that otherwise would start, a read circuit that causes a second read operation to the location having the detected error, a SECDED ECC circuit that corrects an error in data fetched by the second read operation based on a SECDED ECC to obtain corrected data, and a write circuit that causes a write operation with the corrected data to the location having the detected error, whereupon the hold circuit again allows the halted memory operations to start.

Some embodiments of this system further include a memory request buffer configured to hold a plurality of memory operations, and coupled to the hold circuit such that the certain ones of the memory operations halted are those in the buffer, and a circuit that prevents further memory requests from being issued and/or accepted into the buffer for a period of time.

In some embodiments of this system, the memory controller is also configurable to perform explicit refreshes of the memory.

2. Aspects of Some Embodiments that Include Atomic Read-correct-Write Operation Asynchronously Scheduled Following Error Detect In some embodiments, if a single-bit error is detected in data resulting from a normal read memory request from the processor, the error is fixed in the memory card and the corrected data is sent to the processor, and a supplemental atomic read-correct-write (ARCW) sequence is scheduled (as above, just in case the original processor or another processor had quickly modified the contents after the error was detected).

In some embodiments, such an ARCW is also scheduled as the result of an error being detected in read-refresh data.

Some embodiments provide an information-processing apparatus that includes a memory (in some embodiments, this memory includes a plurality of memory chips), a memory-request buffer, an error detector, and an atomic read-correct-write (ARCW) controller. The memory-request buffer is coupled to the memory and configured to hold one or more pending memory requests that go to the memory. The error detector is coupled to receive read data from the memory and configured to detect one or more bit errors in the read data. The ARCW controller coupled to the memory-request buffer and configured, based on detection of an error by the error detector, to control an atomic read-correct-write operation to correct the detected error at its respective address.

Some embodiments of the apparatus further include a memory-request buffer that is configured to hold a plurality of pending memory requests. In these embodiments, the error detector detects errors based on a SECDED ECC; the ARCW controller operates to inhibit memory operations from the memory-request buffer, at least to a memory area to which the ARCW is directed, and prevent further memory requests from being issued for a period of time to allow the ARCW operation to effectively complete.

Some embodiments of the apparatus further include a refresh controller. The refresh controller is coupled to the memory-request buffer, and configured to send read-refresh requests using refresh addresses that cycle through address bits for a first-address portion of the refresh address and also cycle through bits for a second-address portion of the refresh address. In these embodiments, the data is fetched to the memory-chip interface and checked by the error detector as a result of each one of a plurality of the read-refresh requests.

Some embodiments of the apparatus further include a refresh controller that is further configured to send explicit-refresh requests to the memory. In these embodiments, the explicit-refresh requests are sent to the memory to cause the memory to perform an internally controlled refresh function.

Some embodiments of the apparatus further include an arbitration circuit having one or more inputs connected to receive output of the buffer, wherein refresh requests are presented to one or more inputs of the arbitration circuit without passing through the buffer, such that the arbitration circuit can chose such a refresh request over other requests in the buffer when the refresh request has a higher priority.

Some embodiments of the apparatus further include a refresh controller that sends a plurality of explicit-refresh requests over a first period of time without intervening read-refresh requests, then a plurality of read-refresh requests over a second period of time without intervening explicit-refresh requests, then sends a plurality of explicit-refresh requests over a third period of time, and then a plurality of read-refresh requests over a fourth period of time.

Some embodiments of the apparatus further include a refresh controller that includes a timer controller that allows the timing between explicit-refresh requests to be varied.

Some embodiments of the apparatus further include a refresh controller that includes a priority controller that sends a first read-refresh request at an initial priority value, and later if the first read-refresh request has not been completed, increases the priority value. Some embodiments include an arbitration circuit connected to receive memory requests from buffer 520 and also to receive refresh requests and/or ARCW requests and to arbitrate to issued the highest priority request first and to send overlapping (in time) requests to different banks of memory connected to one memory controller 127.

Some embodiments of the apparatus further include a refresh controller that includes a priority controller that sends a first read-refresh request specifying a first address and at an initial priority value, and later if the first read-refresh request has not been completed, then sends, at a higher priority value, a replacement read-refresh request specifying the first address.

Some embodiments of the apparatus further include a plurality of high-speed serial external interfaces, including a second memory controller substantially the same as the first memory controller, a first plurality of memory chips operatively coupled to the first memory controller, a second plurality of memory chips operatively coupled to the second memory controller, and a crossbar switch operatively coupled to transmit and receive memory commands and data to and from the first and second memory controllers, and to and from the plurality of high-speed serial external interfaces.

In some embodiments, the apparatus is packaged on a single first memory card.

Some embodiments of the apparatus further include a second memory card substantially the same as the first memory card, a first plurality of processors coupled to the first memory card and to the second memory card, a third and fourth memory card each substantially the same as the first memory card, a second plurality of processors coupled to the third memory card and to the fourth memory card, a network operatively coupled between the first plurality of processors and the second plurality of processors, and an input/output system operatively coupled to provide data to and from the first plurality of processors.

Some embodiments of the apparatus further include a first plurality of processors coupled to the plurality of high-speed serial external interfaces, a network operatively coupled to each of the first plurality of processors, an input/output system operatively coupled to provide data to and from the first plurality of processors, and a power supply operatively coupled to provide power to the first plurality of processors.

Some embodiments of the apparatus further include a first-address portion that has address bits for a row of data in a memory chip and the second-address portion has address bits for a column of data in the memory chip.

Some embodiments of the information-processing method that includes buffering a plurality of pending memory requests from a processor, sending a stream of processor memory requests from the buffered pending memory requests to a memory, fetching data based on a first memory request, detecting an error in the fetched data, and performing an atomic read-correct-write (ARCW) operation, based on detecting the error in the fetched data, to correct the detected error.

Some embodiments of the method further include inserting a read-refresh request periodically into the stream of processor memory requests. In these embodiments, the periodic read-refresh requests are sent using refresh addresses that cycle through address bits for a first-address portion and also cycle through bits for a second-address portion, and fetching data as a result of each of the read-refresh requests.

Some embodiments of the method further include arbitrating between memory requests from one or more processors in a buffer, and refresh requests presented without passing through the buffer, such that the arbitrating choses such a refresh request over other requests in the buffer when the refresh request has a higher priority.

Some embodiments of the apparatus further include a first-address portion that has address bits for a row of data in a memory chip and the second-address portion has address bits for a column of data in the memory chip.

In some embodiments of the method, there is an amount of time between read-refresh requests, and the method further includes varying the amount of time between read-refresh requests.

In some embodiments of the method, read-refresh requests have a priority, and the method further includes varying the priority of the read-refresh requests.

Some embodiments of the method further include inserting an explicit-refresh request periodically into the stream of memory requests to cause memory parts to perform an internally controlled refresh function.

Some embodiments of the method further include inserting an explicit-refresh request periodically over a first period of time without intervening read-refresh requests, then inserting a read-refresh request periodically over a second period of time without intervening explicit-refresh requests, then inserting an explicit-refresh request periodically over a third period of time, and then, inserting a read-refresh request periodically over a fourth period of time.

In some embodiments of the method, there is an amount of time between explicit refresh requests, and the method further includes varying the amount of time between explicit-refresh requests.

Some embodiments of the method further include sending a first read-refresh request at an initial priority value, and later, if the first read-refresh request has not been completed, increasing the priority value.

Some embodiments of the method further include sending a first read-refresh request that specifies a first address and an initial priority value, and later, if the first read-refresh request has not been completed, then sending a replacement read-refresh request specifying the first address and a higher priority value.

Some embodiments of the method further include receiving memory requests from a plurality of processors across a plurality of high-speed serial external interfaces, wherein the buffering of pending memory requests is divided among a plurality of buffers including a first and a second buffer, sending memory requests from the first buffer to a first plurality of memory chips, sending memory requests from the second buffer to a second plurality of memory chips, and crossbar switching to transmit and receive memory commands and data to and from the first and second buffers, and to and from the plurality of high-speed serial external interfaces.

In some embodiments, the method is performed on a single first memory card.

Some embodiments of the method further include the performing of the ARCW operation that further includes inhibiting execution of already-pending buffered memory requests, and preventing further memory requests from being issued for a period of time.

In some embodiments of the method the first-address portion further includes address bits for a row of data in a memory chip and the second-address portion further includes address bits for a column of data in the memory chip.

In some embodiments, an information-processing system includes a memory, a memory-request buffer, coupled to the memory, and configured to hold one or more pending memory requests from a processor that are transmitted to the memory, and means as described herein for detecting an error in the fetched data and for performing an atomic read-correct-write (ARCW) operation, based on detecting the error in the fetched data, to correct the detected error.

Some embodiments of the system include means for inhibiting already pending buffered memory requests from executing, and means for preventing further memory requests from being issued for a period of time.

Some embodiments of the system include means for allowing already pending buffered memory requests to complete, and means for preventing further memory requests from being issued for a period of time.

Some embodiments of the system include means for allowing only already issued memory requests to complete, and means for preventing further memory requests from being issued for a period of time.

Some embodiments of the system include means for allowing only already issued memory requests to complete, and means for preventing further memory requests from being accepted and/or issued for a period of time.

Some embodiments of the system further include means for read-refreshing the memory and fetching read-refresh data as a result.

Some embodiments of the system further include means for varying timing between read-refresh requests.

In some embodiments of the system, read-refresh requests have a priority, and the system further includes means for varying the priority of read-refresh requests.

Some embodiments of the system further include means for explicitly refreshing the memory.

Some embodiments of the system further include means for explicitly refreshing the memory in a manner periodically alternated with the read-refreshing of the memory.

In some embodiments of the system, explicit-refresh requests have a priority, and the system further includes means for varying the priority of explicit requests.

In some embodiments, one aspect of the invention is an information-processing system that includes a memory, a memory controller configured to send a first read operation to the memory and to receive read data from a first location specified by the first read operation, an error detector, configured to check the received read data and to detect one or more bit errors in the read data, and an atomic read-correct-write (ARCW) controller coupled to the memory controller, and configured, based on detection of an error by the error detector, to control an atomic read-correct-write operation that includes, atomically, a second read operation to the first location, a correction operation, and a write operation to the first location.

Some embodiments further include a memory-request buffer, coupled to the memory, and configured to hold one or more pending memory requests that go to the memory. In some embodiments, the memory-request buffer is configured to hold a plurality of pending memory requests, and wherein the ARCW controller operates to inhibit memory operations from the memory-request buffer, at least to a memory area to which the ARCW is directed, and prevent further memory requests from being issued and/or accepted for a period of time to allow the ARCW operation to effectively complete. In some such embodiments, the error detector detects errors based on a SECDED ECC.

Some embodiments further include a refresh controller, coupled to the memory, and configured to send read-refresh requests the read-refresh requests using refresh addresses that cycle through address bits for a first-address portion of the refresh address and also cycle through bits for a second-address portion of the refresh address, and wherein data is fetched to the memory-chip interface and checked by the error detector as a result of each one of a plurality of the read-refresh requests.

3. Aspects of Some Embodiments that Include Bit Swapping on the Fly and Testing of that Function Some embodiments of the invention provide that each memory controller can swap a spare bit into operation in a section of memory, dynamically in the background (in some embodiments, as part of the regular read-refresh memory requests) while keeping the data in its normally addressed locations and even allowing functional processing to continue to the affected memory locations during the swap operation. Thus, rather than dumping all of a section of memory using a default bit-mapping configuration and then reloading the entire memory using a different bit-mapping configuration in order to compensate for a stuck or unreliable bit position, one at a time, each word in the affected portion of memory is read using the default or normal bit mapping, corrected if necessary, and then written to the same address but using the bit-swapped mapping. Some embodiments use pointers that define the start address and end address of the bit-swapped portion of memory, such that regular processor read memory requests and write memory requests use the bit-swapped mapping for the portion that has been swapped, and use the normal bit mapping for the portion that has not been swapped. This allows the bit swapping operations and regular processor read memory requests and write memory requests to be performed at the same time (though individual memory requests are interleaved).

Some embodiments further provide one or more very high-speed serial interfaces to the processor, and optionally an on-card L3 cache.

Another aspect of the invention, in some embodiments, includes a bit-shifting circuit that allows bit swapping for a subset of all memory space, i.e., allows any data bit or SECDED ECC bit to be disconnected or ignored, and effectively replaced using a spare bit.

Some embodiments provide an information-processing apparatus that includes a first memory having a plurality of addressed locations, each location holding a plurality of bits, and a first control circuit. The control circuit includes a first memory controller. The memory controller includes an address-range detector that specifies a range spanning a subset of the addressed locations, and that, for each memory request, determines whether an address of the memory request is within the specified range, and a read-data bit-swap circuit coupled to receive data from the first memory and operatively coupled to the address-range detector, and based on an indication from the address-range detector as to whether a memory request address is within the range, to swap one or more bits of the data.

Some embodiments of the apparatus further include a test engine operatively coupled to the first memory controller and configured to provide test functions to verify whether, for memory requests having addresses within the range, the one or more bits are swapped. In some embodiments, the first control circuit is located on a first memory card, and the test engine is located on a second memory card that is substantially identical to the first memory card.

Some embodiments of the apparatus further include a write-data bit-swap circuit coupled to transmit data to the memory and operatively coupled to the address-range detector, and based on an indication from the address-range detector as to whether a memory request address is within the range, to swap one or more bits of the data.

In some embodiments, the control circuit further includes a test engine operatively coupled to the first memory controller and configured to provide testing functions to verify whether, for memory requests having addresses within the range, the one or more bits are swapped, and for memory requests having addresses outside the range, the one or more bits are not swapped.

In some embodiments, the first memory controller further includes an address incrementer operatively coupled to the address-range detector to adjust an end of the specified range.

In some embodiments, the first memory controller further includes a section-swap controller operatively coupled to initialize the address range detector and address incrementer, and to control, for each location within a set of memory locations of memory, a section-swap operation that uses an atomic read-write operation that reads data from the location in memory using a first bit-mapping configuration and to writes data back to the location in memory using a second bit-mapping configuration different than the first.

As used herein, a "section" is any set of addresses in memory. Such a set of addresses could include, for example,

- all addresses between address X and address Y of the portion of memory 130 connected to one controller 127, or
- all addresses between zero and address Y of some portion of memory, or
- either all even-numbered or all odd-numbered addresses between zero and address Y of the portion of memory 130 connected to one controller 127 (useful, for example, if only one half of a set of stacked memory chips connected to one controller had a failing bit), or
- every fourth address between address X and address Y of some portion of memory 130, or
- all addresses between address delta-X and address delta-Y within each one of a plurality of sub-portions (i.e., delta-X and delta-Y are address offsets, e.g., banks) of memory 130 connected to one controller 127, or
- all addresses between address delta-zero and address delta-Y within each one of a plurality of sub-portions (e.g., banks) of memory 130 connected to one controller 127, or
- any other specified set of addresses of any or all of memory 130.

In some embodiments, the control circuit further includes a test engine operatively coupled to the first memory controller and configured to provide testing functions to verify whether, the section-swap controller properly functions to control the atomic reading and writing such that normal read operations and write operations obtain correct data during the section-swap operation.

In some embodiments, the first memory controller further includes an error-correction circuit that, for at least some of the atomic read-write operations, corrects an error in the read data and generates corrected data for the write.

In some embodiments of the apparatus, the first memory controller further includes a processor memory-request controller that, interleaved between the atomic read-write operations, performs processor memory operations both within the specified range and outside of the specified range.

Some embodiments of the apparatus further include a memory-request buffer configured to hold a plurality of pending memory requests, wherein the error-correction circuit corrects errors based on a SECDED ECC, and wherein, for each atomic read-write operation, the section-swap controller operates to inhibit further operations from issuing from the memory-request buffer and allowing already issued and pending memory requests to complete and preventing further conflicting memory requests from being issued and/or accepted for a period of time to allow the atomic read-write operation to effectively complete.

Some embodiments of the apparatus further include a refresh controller, coupled to the memory-request buffer, and configured to send read-refresh requests using refresh addresses that cycle through address bits for a first-address portion of the refresh address and also cycle through bits for a second-address portion of the refresh address, and wherein data is fetched to the memory interface and checked by an error detector as a result of each of the read-refresh requests.

In some embodiments, the first address portion includes address bits for a row of data in a memory chip and the second address portion includes address bits for a column of data in the memory chip.

In some embodiments, the refresh controller is further configured to send explicit-refresh requests to the memory-request buffer, wherein the explicit-refresh requests are sent to the memory to cause the memory to perform an internally controlled refresh function.

In some embodiments, the refresh controller further includes a timer controller that allows the timing between explicit-refresh requests to be varied.

In some embodiments, the refresh controller further includes a priority controller that sends a first read-refresh request at an initial priority value, and later if the first read-refresh request has not been completed, increases the priority value, in order to ensure completion of the refresh within the required refresh interval.

Some embodiments of the apparatus further include a plurality of high-speed serial external interfaces, a second memory controller substantially the same as the first memory controller, a second memory operatively coupled to the second memory controller, and a crossbar switch operatively coupled to transmit and receive memory commands and data to and from the first and second memory controllers, and to and from the plurality of high-speed serial external interfaces.

In some embodiments, the apparatus is packaged on a single first memory card.

Some embodiments of the apparatus further include a second memory card substantially the same as the first memory card, a first plurality of processors coupled to the first memory card and to the second memory card, a third and fourth memory card each substantially the same as the first memory card, a second plurality of processors coupled to the third memory card and to the fourth memory card, a network operatively coupled between the first plurality of processors and the second plurality of processors, and an input/output system operatively coupled to provide data to and from the first plurality of processors.

Some embodiments of the apparatus further include a first plurality of processors coupled to the plurality of high-speed serial external interfaces, a network operatively coupled to each of the first plurality of processors, an input/output system operatively coupled to provide data to and from the first plurality of processors, and a power supply operatively coupled to provide power to the first plurality of processors.

Some embodiments provide an information-processing method that includes receiving a first memory request, detecting whether an address of the first memory request is within a specified range of addresses, swapping a subset of bit positions of a first portion (e.g., word or quad-word or other unit) of data based on the first address being detected as within the specified range, and writing the bit-swapped first data to the memory.

Some embodiments of the method further include receiving a second memory request, detecting whether an address of the second memory request is within a specified range of addresses, fetching second data based on a second memory request address, and not swapping bits of the second data based on the second address being detected as not within the specified range.

Some embodiments use the read-refresh data that was read for a read-refresh operation as the source data for a swap-and-write portion of an atomic read-swap-write operation. Thus, the swap of an entire section of memory can be performed as part of the refresh being performed anyway, thus incurring little performance penalty for any of the swaps (the small increment to do the additional write). Some embodiments allow swapping of only a portion of a bank of memory, such that some read-refresh operations (those to the portion of the bank being swapped) obtain data that is swapped and written back to its source location, while other read-refresh operations (those to the portion of the bank not being swapped) obtain data that is checked for errors and then discarded (if a correctable error is detected, the correction is performed in a subsequently scheduled atomic-read-correct-write operation. In some embodiments, if the read-refresh data is to be swapped and written, it is also ECC checked and corrected if need be, before being swapped and written (thus avoiding the subsequently scheduled atomic-read-correct-write operation).

Some embodiments of the method further include receiving a second memory request just prior in time to the first memory request, detecting whether an address of the second memory request is within a specified range of addresses, fetching second data based on a second memory request address, and not swapping bits of the second data based on the second address being detected as not within the specified range. That is, the bit swapping can occur for some addresses and yet not occur for other addresses of accesses immediately before or after in time to the accesses that read, swapped, and wrote the swapped bits, even for various subsets of addresses in a single bank of memory, since the controller need not shut down even one bank to perform the swap operation.

Some embodiments of the method further include changing an end address of the specified range between the second and first memory requests, wherein the second address equals the first address such that data based on the read second data is bit-swapped to produce the first data and written to its same address.

Some embodiments of the method further include performing error correction on the read data before bit swapping and writing.

Some embodiments of the method further include iteratively changing the end address and reading and writing data in a section of the memory in order to dynamically move data in the section of the memory from a normal bit mapping configuration to a bit-swapped mapping configuration.

Some embodiments of the method further include buffering a first plurality of pending memory requests from a processor, sending a stream of the first processor memory requests from the buffered pending memory requests to the memory, and stopping issuing or executing processor memory requests in order to perform fetching the second data and writing the first data atomically.

Some embodiments of the method further include inserting a read-refresh request periodically into the stream of processor memory requests, wherein the periodic read-refresh requests are sent using refresh addresses that cycle through address bits for a row-address portion and also cycle through bits for a column-address portion, fetching data as a result of each of the read-refresh requests, detecting an error in one of the fetched sets of data, and based on the detecting of the error, performing the bit-swapping operations.

Some embodiments of the method further include varying a value of time between read-refresh requests.

Some embodiments of the method further include varying a priority of the read-refresh requests.

Some embodiments of the method further include inserting an explicit-refresh request periodically into the stream of memory requests to cause memory parts to perform an internally controlled refresh function.

In some embodiments, the method is performed on a single memory card.

Some embodiments provide an information-processing system that includes a memory, a memory-request buffer, coupled to the memory, and configured to hold one or more pending memory requests from a processor that are transmitted to the memory, and means as described herein for changing a mapping of bits that are read and written to the memory.

Some embodiments of the apparatus further include means for testing the mapping of bits.

Some embodiments of the apparatus further include means for read-refreshing the memory and fetching read-refresh data as a result and correcting errors if errors are detected.

Some embodiments of the apparatus further include means for varying timing between read-refresh requests.

Some embodiments of the apparatus, each request has a priority, and the apparatus further include means for varying the priority of read-refresh requests.

Some embodiments of the apparatus further include means for explicitly refreshing the memory.

Some embodiments of the apparatus further include means for explicitly refreshing the memory in a manner periodically alternated with the read-refreshing of the memory.

4. Aspects of Some Embodiments That Include Bit-Swapping and Address-Range Compare Circuit Some embodiments of the invention provide a bit-shifting circuit that allows bit swapping for a changeable subset of all memory space, i.e., allows any data bit or SECDED ECC bit in a word or in a range of words to be disconnected or ignored, and effectively replaced using a spare bit. The specified range can be changed one word at a time to allow recovering (reading and correcting detected errors) data from a section of memory affected by a stuck or unreliable bit, and writing the data back to the same address locations but with a different bit mapping. For each memory request coming from a processor, the address range circuit determines whether the request is inside or outside of the range of addresses that have been bit-swapped, and uses one or another of the bit mappings as appropriate to access the data correctly. These normal processor operations can be intertwined with the atomic-read-correct-write (ARCW) operations that work to successively move each word from its normal bit mapping to the alternative bit mapping, e.g., wherein the end address of the range is incremented by one for each word remapped, and the processor need not be aware of the remapping, or at least of its progress.

Some embodiments provide an information-processing apparatus that includes a first memory having a plurality of addressed locations, each location holding a plurality of bits, and a first control circuit. The first control circuit includes a first memory controller coupled to the first memory. The memory controller includes a read-bit-swap circuit coupled to receive data from the first memory, the read-bit-swap circuit including a plurality of two-input one-output multiplexers, wherein each read bit is coupled to one input on each of two non-adjacent multiplexers, a write-data bit-swap circuit coupled to transmit data to the first memory, the write-bit-swap circuit including a plurality of two-input one-output multiplexers, wherein each bit to be written is coupled to one input on each of two non-adjacent multiplexers, and a swap-controller circuit operatively coupled to the read-bit-swap circuit and to the write-data bit-swap circuit to selectively choose one or more spare bits in place of a corresponding number of other bits.

Some embodiments of the apparatus further include an address-range detector that specifies a range spanning a subset of the addressed locations, and for each memory request, that determines whether an address of the memory request is within the specified range and that is coupled to control the read-bit-swap circuit and the write-bit-swap circuit.

Some embodiments of the apparatus further include an address incrementer operatively coupled to address-range detector to adjust an end of the specified range.

Some embodiments of the apparatus further include a section-swap controller operatively coupled to initialize the address range detector and address incrementer to, for each location within a section of memory, control an atomic read-write operation that reads data from the location in memory using a first bit-mapping configuration and to writes data back to the location in memory using a second bit-mapping configuration different than the first.

Some embodiments of the apparatus further include an error-correction circuit that, for at least some of the atomic read-write operations, corrects an error in the read data and generates corrected data for the write.

Some embodiments of the apparatus further include a processor memory-request controller that, interleaved between the atomic read-write operations, performs processor memory operations both within the specified range and outside of the specified range.

Some embodiments of the apparatus further include a memory-request buffer configured to hold a plurality of pending memory requests, wherein the error-correction circuit corrects errors based on an error-correction code (ECC), and wherein, for each atomic read-write operation, the section-swap controller operates to inhibit conflicting operations from the memory-request buffer during each read-swap-write operation while allowing non-conflicting operations in the buffer to be processed.

Some embodiments of the apparatus further include a memory-request buffer configured to hold a plurality of pending memory requests, wherein the error-correction circuit corrects errors based on a SECDED ECC, and wherein, for each atomic read-write operation, the section-swap controller operates to inhibit at least conflicting operations from the memory-request buffer and, if need be, to prevent further memory requests from being issued and/or accepted (for example, not loading requests into the buffer of the affected memory controller 127 while allowing requests to be loaded into and processed from the buffers of the other memory controllers, or in other embodiments, loading requests into the buffer but not issuing the requests from the buffer, or at least those requests that would conflict with the read-swap-write operation) for a period of time to allow the atomic read-write operation to effectively complete. In other embodiments, other suitable ECC methods (other than SECDED) and/or circuits are used. In some embodiments, memory requests for other memory controllers 127 or other buffers Some embodiments of the apparatus further include a refresh controller, coupled to the memory-request buffer, and configured to send read-refresh requests, the read-refresh requests using refresh addresses that cycle through address bits for a row-address portion of the refresh address and also cycle through bits for the column-address portion of the refresh address, and wherein data is fetched to the memory-chip interface and checked by an error detector as a result of each of the read-refresh requests.

In some embodiments, the refresh controller is further configured to send explicit-refresh requests to the memory-request buffer, wherein the explicit-refresh requests are sent to the memory chips to cause the memory chips to perform an internally controlled refresh function.

In some embodiments, the refresh controller further includes a timer controller that allows the timing between explicit-refresh requests to be varied.

In some embodiments, the refresh controller further includes a priority controller that sends a first read-refresh request at an initial priority value, and later if the first read-refresh request has not been completed, increases the priority value.

Some embodiments of the apparatus further include a test engine operatively coupled to the first memory controller and configured to provide test functions to verify whether, for memory requests having addresses within the range, the one or more bits are swapped, wherein the first control circuit is located on a first memory card, and the test engine is located on a second memory card that is substantially identical to the first memory card.

Some embodiments of the apparatus further include a plurality of high-speed serial external interfaces, a second memory controller substantially the same as the first memory controller, a second memory operatively coupled to the second memory controller, and a crossbar switch operatively coupled to transmit and receive memory commands and data to and from the first and second memory controllers, and to and from the plurality of high-speed serial external interfaces.

In some embodiments, the apparatus is packaged on a single first memory card.

Some embodiments of the apparatus further include a second memory card substantially the same as the first memory card, a first plurality of processors coupled to the first memory card and to the second memory card, a third and fourth memory card each substantially the same as the first memory card, a second plurality of processors coupled to the third memory card and to the fourth memory card, a network operatively coupled between the first plurality of processors and the second plurality of processors, and an input/output system operatively coupled to provide data to and from the first plurality of processors.

Some embodiments of the apparatus further include a first plurality of processors coupled to the plurality of high-speed serial external interfaces, a network operatively coupled to each of the first plurality of processors, an input/output system operatively coupled to provide data to and from the first plurality of processors, and a power supply operatively coupled to provide power to the first plurality of processors.

Some embodiments provide an information-processing method that includes receiving a first memory request that specifies an address, detecting whether the address of the first memory request is within a specified range of addresses, and (a) if the first memory request is for one or more write operations, then: shifting a first subset of bit positions a plurality of bit positions in a first direction for first data of each write operation address being detected as within the specified range, and writing the bit-swapped first data to the memory, and (b) if the first memory request is for one or more read operations, then: reading second data from the memory, and shifting a second subset of bit positions a plurality of bit positions in a second direction opposite the first direction for each read operation address being detected as within the specified range.

Some embodiments of the method further include performing an atomic read-write operation that includes a first memory read request from a second address and a second memory write request the second address.

Some embodiments of the method further include changing an end address of the specified range between the second and first memory requests of the atomic read-write operation, such that data based on the read second data is bit-swapped to produce the first data and written to its same address.

Some embodiments of the method further include performing error correction on the read data before bit swapping and writing.

Some embodiments of the method further include iteratively changing the end address and reading and writing data in a section of the memory in order to dynamically move data in the section of the memory from a normal bit mapping configuration to a bit-swapped mapping configuration.

Some embodiments of the method further include buffering a first plurality of pending memory requests from a processor, sending a stream of the first processor memory requests from the buffered pending memory requests to the memory, and stopping servicing of processor memory requests in order to perform fetching the second data and writing the first data atomically. Some embodiments of the method further include continuing to buffer and service requests to other buffers.

Some embodiments of the method further include buffering a first plurality of pending memory requests from a processor, sending a stream of the first processor memory requests from the buffered pending memory requests to the memory, and stopping issuing of processor memory requests in order to perform fetching the second data and writing the first data atomically.

Some embodiments of the method further include buffering a first plurality of pending memory requests from a processor, sending a stream of the first processor memory requests from the buffered pending memory requests to the memory, and stopping servicing of processor memory requests in order to perform fetching the second data and writing the first data atomically. Some of these embodiments further include continuing to buffer and service requests to other buffers.

Some embodiments of the method further include inserting a read-refresh request periodically into the stream of processor memory requests, wherein the periodic read-refresh requests are sent using refresh addresses that cycle through address bits for a row-address portion and also cycle through bits for a column-address portion, fetching data as a result of each of the read-refresh requests, detecting an error in one of the fetched sets of data, and based on one or more criteria, wherein the criteria include the detecting of the error, performing the bit-swapping operations.

Some embodiments of the method further include varying a value of time between read-refresh requests.

Some embodiments of the method further include varying a priority of the read-refresh requests.

Some embodiments of the method further include inserting an explicit-refresh request periodically into the stream of memory requests to cause memory parts to perform an internally controlled refresh function.

In some embodiments, the method is performed on a single memory card.

Some embodiments of the method further include functionally testing to verify whether, for memory requests having addresses within the range, the one or more bits are swapped, wherein the shifting takes place on a first memory card, and the functionally testing further includes originating test commands and checking results on a second memory card that is substantially identical to the first memory card.

In some embodiments, the detecting of whether the first address is within a specified range of addresses includes comparing the first address to an address specifying an end of the specified range. In some embodiments, only a single compare is needed if one end of the range is zero (or the very last location of a controller's portion of memory). In some embodiments, the detecting of whether the first address is within a specified range of addresses further includes comparing the first address to an address specifying an opposite end of the specified range. If non-zero ends of the range are implemented, a second compare may be required, for example, if addresses below a value X or above a value Y are outside the range, and addresses from X to Y form the range.

Some embodiments provide an information-processing apparatus that includes a first memory having a plurality of addressed locations, each location holding a plurality of bits, and a first control circuit. The first control circuit includes a first memory controller coupled to the first memory. The memory controller includes means for shifting a first subset of bit positions a plurality of bit positions in a first direction for each write-operation address being detected as within the specified range, and for writing the bit-swapped first data to the memory, means for reading the first data to the memory, and for shifting a second subset of bit positions a plurality of bit positions in a second direction opposite the first direction for each read-operation address being detected as within the specified range.

Some embodiments of the apparatus further include means for performing an atomic read-write (RMW) operation that includes a first memory read request from a first address and a second memory write request the first address. In some embodiments, the controller is configured to consider an RMW as one request.

Some embodiments of the apparatus further include means for changing an end address of the specified range between the second and first memory requests, such that data based on the read second data is bit-swapped to produce the first data and written to its same address.

Some embodiments of the apparatus further include means for performing error correction on the read data before bit swapping and writing.

Some embodiments of the apparatus further include means for iteratively changing the end address and reading and writing data in a section of the memory in order to dynamically move data in the section of the memory from a normal bit mapping configuration to a bit-swapped mapping configuration.

Some embodiments of the apparatus further include means for buffering a first plurality of pending memory requests from a processor, means for sending a stream of the first processor memory requests from the buffered pending memory requests to the memory, and means for stopping buffering of processor memory requests in order to perform fetching the second data and writing the first data atomically.

Some embodiments of the apparatus further include means for inserting a read-refresh request periodically into the stream of processor memory requests, wherein the periodic read-refresh requests are sent using refresh addresses that cycle through address bits for a row-address portion and also cycle through bits for a column-address portion, means for fetching data as a result of each of the read-refresh requests, means for detecting an error in one of the fetched sets of data, and means for, based on one or more criteria, wherein the criteria include the detecting of the error, performing the bit-swapping operations.

Some embodiments of the apparatus further include means for varying a value of time between read-refresh requests.

Some embodiments of the apparatus further include means for varying a priority of the read-refresh requests.

Some embodiments of the apparatus further include means for inserting an explicit-refresh request periodically into the stream of memory requests to cause memory parts to perform an internally controlled refresh function.

In some embodiments, the apparatus is implemented on a first memory card. Some such embodiments of the apparatus further include, on a second memory card, means for functionally testing to verify whether, for memory requests having addresses within the range, the one or more bits are swapped, wherein the means for shifting is on the first memory card, and wherein the second memory card is connected to the first memory card.

Some embodiments provide a computer-readable medium having control data thereon for causing a suitably programmed information-processing system to execute a method that includes receiving a first memory request, detecting whether an address of the first memory request is within a specified range of addresses, swapping a subset of bit positions of a first of data based on the first address being detected as within the specified range, and writing the bit-swapped first data to the memory.

In some embodiments, of the medium, the method further includes receiving a second memory request, detecting whether an address of the second memory request is within a specified range of addresses, fetching second data based on a second memory request address, and not swapping bits of the second data based on the second address being detected as not within the specified range.

5. Other Aspects of Some Embodiments

Some embodiments of the invention include a W-circuit, a memory daughter card (MDC) that includes at least one such W-circuit 120, a processor node that includes at least one such MDC 110 and at least one processing unit, and/or a multi-processor that includes a plurality of such processor nodes, wherein the W-circuit 120 and/or other circuitry or software of the processor system incorporates or implements one or more combinations of the features described individually herein in a synergistic combination. Such combinations are specifically contemplated for some embodiments. Some embodiments of the invention include a plurality of the features, wherein various combinations can be selectively enabled or disabled, for example, by loading the appropriate data combinations into the MMRs or by loading various microcode or sequencing programs into the appropriate storage on the W-circuit 120 or elsewhere in the system.

Some embodiments of the invention include a computer-readable medium (such as, or example, a CDROM, DVD, floppy diskette, hard disk drive or flash memory device to supply instructions). The computer-readable medium includes instructions stored thereon for causing a suitably programmed information processing system to perform one or more methods that implement any or all of the inventions and combinations described herein. In some embodiments, this computer-readable medium is connected or connectable to system 100 of FIG. 1.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. An information-processing apparatus comprising:
   a first memory having a plurality of addressed locations, each location holding a plurality of bits; and
   a first control circuit, the first control circuit including:
      a first memory controller, the first memory controller including:
         an address-range detector that specifies a range spanning an incrementally variable-length subset of the plurality of addressed locations, wherein the detector allows a plurality of non-power-of-two subset sizes for the range, and that, for each memory request, determines whether an address of the memory request is within the specified range; and
         a read-data bit-swap circuit coupled to receive fetched data including a plurality of data bits and one or more spare bits from the first memory and operatively coupled to the address-range detector, and based on an indication from the address-range detector as to whether a memory request address is within the range, to swap one or more, but fewer than all, of the bits of the data, such that one or more spare bits are used for data bits in the read data, and a corresponding number of data bits are not used in the read data.

2. The apparatus of claim 1, the first control circuit further including:
   a test engine operatively coupled to the first memory controller and configured to provide test functions to verify whether, for memory requests having addresses within the range, the one or more bits are swapped,
   wherein the first control circuit is located on a first memory card, and the test engine is located on a second memory card that is substantially identical to the first memory card.

3. The apparatus of claim 1, the first memory controller further comprising:
   a write-data bit-swap circuit coupled to transmit data to the memory and operatively coupled to the address-range detector, and based on an indication from the address-range detector as to whether a memory request address is within the range, to swap one or more bits of the data.

4. The apparatus of claim 3, the first control circuit further including:
a test engine operatively coupled to the first memory controller and configured to provide testing functions to verify whether, for memory requests having addresses within the range, the one or more bits are swapped, and for memory requests having addresses outside the range, the one or more bits are not swapped.

5. The apparatus of claim 1, the first memory controller further comprising:
an address changer operatively coupled to the address-range detector to adjust an end of the specified range.

6. The apparatus of claim 1, the first memory controller further comprising:
a section-swap controller operatively coupled to initialize the address range detector and address incrementer, and to control, for each location within a set of memory locations of memory, a section-swap operation that uses an atomic read-write operation that reads data from the location in memory using a first bit-mapping configuration and to writes data back to the location in memory using a second bit-mapping configuration different than the first.

7. The apparatus of claim 6, the first control circuit further including:
a test engine operatively coupled to the first memory controller and configured to provide testing functions to verify whether the section-swap controller properly functions to control the atomic reading and writing such that normal read operations and write operations obtain correct data during the section-swap operation.

8. The apparatus of claim 6, the first memory controller further comprising:
an error-correction circuit that, for at least some of the atomic read-write operations, corrects an error in the read data and generates corrected data for the write.

9. The apparatus of claim 8, the first memory controller further comprising:
a processor memory-request controller that, interleaved between the atomic read-write operations, performs processor memory operations both within the specified range and outside of the specified range.

10. The apparatus of claim 9, further comprising:
a memory-request buffer configured to hold a plurality of pending memory requests, wherein the error-correction circuit corrects errors based on a SECDED ECC, and wherein, for each atomic read-write operation, the section-swap controller operates to inhibit further operations from issuing from the memory-request buffer and allowing already issued and pending memory requests to complete and, at least to the extent needed to prevent conflicting accesses, preventing further memory requests from being issued for a period of time to allow the atomic read-write operation to effectively complete.

11. The apparatus of claim 9, further comprising:
a memory-request buffer configured to hold a plurality of pending memory requests, wherein the error-correction circuit corrects errors based on a ECC, and wherein, for each atomic read-write operation, the section-swap controller operates to inhibit further operations from issuing from the memory-request buffer and allowing already issued and pending memory requests to complete and preventing further memory requests from being issued for a period of time to allow the atomic read-write operation to effectively complete.

12. The apparatus of claim 8, further comprising
a refresh controller, coupled to the memory-request buffer, and configured to send read-refresh requests using refresh addresses that cycle through address bits for a first-address portion of the refresh address and also cycle through bits for a second-address portion of the refresh address, and wherein read-refresh data is fetched to the memory interface and checked by an error detector as a result of each of the read-refresh requests.

13. The apparatus of claim 12, wherein the refresh controller is configured to use the read-refresh data that was read for a read-refresh operation as the source data for a swap-and-write portion of an atomic read-swap-write operation.

14. The apparatus of claim 12, wherein the first address portion includes address bits for a row of data in a memory chip and the second address portion includes address bits for a column of data in the memory chip.

15. The apparatus of claim 12, wherein the refresh controller is further configured to send explicit-refresh requests to the memory-request buffer, wherein the explicit-refresh requests are sent to the memory to cause the memory to perform an internally controlled refresh function.

16. The apparatus of claim 15, wherein the refresh controller further includes a timer controller that allows the timing between explicit-refresh requests to be varied.

17. The apparatus of claim 12, wherein the refresh controller further includes a priority controller that sends a first read-refresh request at an initial priority value, and later if the first read-refresh request has not been completed, increases the priority value.

18. The apparatus of claim 12, wherein the refresh controller further includes a priority controller that sends a first read-refresh request specifying a first address and at an initial priority value, and later if the first read-refresh request has not been completed, then sends a second read-refresh request specifying the first address and at a higher priority value to replace the first read-refresh request.

19. The apparatus of claim 18, wherein the apparatus is packaged on a single first memory card.

20. The apparatus of claim 19, further comprising:
a second memory card substantially the same as the first memory card;
a first plurality of processors coupled to the first memory card and to the second memory card;
a third and fourth memory card each substantially the same as the first memory card;
a second plurality of processors coupled to the third memory card and to the fourth memory card;
a network operatively coupled between the first plurality of processors and the second plurality of processors; and
an input/output system operatively coupled to provide data to and from the first plurality of processors.

21. The apparatus of claim 19, further comprising:
a first plurality of processors coupled to the plurality of high-speed serial external interfaces;
a network operatively coupled to each of the first plurality of processors;
an input/output system operatively coupled to provide data to and from the first plurality of processors; and
a power supply operatively coupled to provide power to the first plurality of processors.

22. The apparatus of claim 1, further comprising:
a plurality of high-speed serial external interfaces;
a second memory controller substantially the same as the first memory controller;

a second memory operatively coupled to the second memory controller; and a crossbar switch operatively coupled to transmit and receive memory commands and data to and from the first and second memory controllers, and to and from the plurality of high-speed serial external interfaces.

23. An information-processing method comprising:

receiving a first memory request to write data to a memory;

detecting whether an address of the first memory request is within a specified range of addresses, wherein the detecting allows an incrementally variable plurality of non-power-of-two sizes for the specified range;

remapping a subset of bit positions of a first set of data to form bit-remapped first data based on the address of the first memory request being detected as within the specified range, wherein the remapping means that one or more bits of the first set of data are directed to spare bit positions of the bit-remapped first set of data; and writing the bit-swapped first data to the memory.

24. The method of claim 23, further comprising:

receiving a second memory request;

detecting whether an address of the second memory request is within a specified set of addresses;

fetching second data based on a second memory-request address; and not remapping bits of the second data based on the second memory-request address being detected as not within the specified range.

25. The method of claim 24, wherein the receiving of the second memory request occurs just prior in time to the first memory request, and wherein the detecting of whether an address is within a specified set of addresses is performed on each one of a plurality of sequential accesses.

26. An information-processing method comprising:

receiving a first memory request to write data to a memory;

detecting whether an address of the first memory request is within a specified range of addresses;

swapping a subset of bit positions of a first data to form bit-swapped first data based on the address of the first memory request being detected as within the specified range;

writing the bit-swapped first data to the memory;

receiving a second memory request;

detecting whether an address of the second memory request is within a specified set of addresses;

fetching second data based on a second memory-request address;

not swapping bits of the second data based on the second memory-request address being detected as not within the specified set; and changing an end address of the specified set between the second and first memory requests, wherein the second address equals the first address such that data based on the read second data is bit-swapped to produce the first data and written to its same address.

27. The method of claim 26, further comprising:

performing error correction on the read data before bit swapping and writing.

28. The method of claim 27, further comprising:

iteratively changing the end address and reading and writing data in a section of the memory in order to dynamically move data in the section of the memory from a normal bit mapping configuration to a bit-swapped mapping configuration.

29. The method of claim 26, further comprising:

buffering a first plurality of pending memory requests from a processor;

sending a stream of the first processor memory requests from the buffered pending memory requests to the memory; and stopping servicing of processor memory requests in order to perform fetching the second data and writing the first data atomically.

30. The method of claim 29, further comprising:

inserting a read-refresh request periodically into the stream of processor memory requests, wherein the periodic read-refresh requests are sent using refresh addresses that cycle through address bits for a row-address portion and also cycle through bits for a column-address portion;

fetching data as a result of each of the read-refresh requests;

detecting an error in one of the fetched sets of data; and based on one or more criteria that include the detecting of the error, performing the bit-swapping operations.

31. The method of claim 30, farther comprising varying a value of time between read-refresh requests.

32. The method of claim 30, farther comprising varying a priority of the read-refresh requests.

33. The method of claim 30, farther comprising inserting an explicit-refresh request periodically into the stream of memory requests to cause memory parts to perform an internally controlled refresh function.

34. The method of claim 30, wherein the method is performed on a single memory card.

35. An information-processing system comprising:

a memory;

address checking means for checking the address of each one of a plurality of memory requests from a processor that are transmitted to the memory, wherein the checking allows an incrementally variable plurality of non-power-of-two sizes for a specified range; and means for changing a mapping of bits that are read from and written to the memory, wherein the changed mapping directs one or more bits of a first set of data to spare bit positions of bit-remapped first set of data.

36. The system of claim 35, further comprising means for testing the mapping of bits.

37. The system of claim 35, farther comprising:

means for read-refreshing the memory and fetching read-refresh data as a result and correcting errors if errors are detected.

38. The system of claim 37, further comprising means for varying timing between read-refresh requests.

39. The system of claim 37, further comprising means for varying a priority of read-refresh requests.

40. The system of claim 35, further comprising means for explicitly refreshing the memory.

41. The system of claim 37, further comprising means for explicitly refreshing the memory in a manner periodically alternated with the read-refreshing of the memory.

42. The system of claim 40, further comprising:

means for varying timing between explicit requests.

43. The system of claim 42, further comprising:

means for varying a priority of explicit requests.

44. A computer-readable storage medium storing control data thereon for causing a suitably programmed information-processing system to execute a method comprising:

receiving a first memory request to write data to a memory, detecting whether an address of the first memory request is within a specified range of addresses, wherein the detecting allows an incrementally variable plurality of non-power-of-two sizes for the specified range;

remapping a subset of bit positions of a first set of data to form bit-remapped first data based on the address of the first memory request being detected as within the specified range, wherein the remapping means that one or more bits of the first set of data are directed to spare bit positions of the bit-remapped first set of data; and writing the bit-swapped first data to the memory.

45. The medium of claim 44, wherein the method further comprises:

receiving a second memory request;

detecting whether an address of the second memory request is within a specified range of addresses;

fetching second data based on a second memory-request address; and not swapping bits of the second data based on the second memory-request address being detected as not within the specified range.

* * * * *